(12) United States Patent
Noh et al.

(10) Patent No.: US 11,956,077 B2
(45) Date of Patent: Apr. 9, 2024

(54) METHOD AND DEVICE FOR PERFORMING CHANNEL CODING ON BASIS OF POLAR CODING IN WIRELESS COMMUNICATION SYSTEM

(71) Applicant: LG Electronics Inc., Seoul (KR)

(72) Inventors: Kwangseok Noh, Seoul (KR); Bonghoe Kim, Seoul (KR); Il-Min Kim, Lancaster (CA)

(73) Assignee: LG Electronics Inc., Seoul (KR)

( * ) Notice: Subject to any disclaimer, the term of this patent is extended or adjusted under 35 U.S.C. 154(b) by 532 days.

(21) Appl. No.: 17/272,056

(22) PCT Filed: Aug. 27, 2019

(86) PCT No.: PCT/KR2019/010897
§ 371 (c)(1),
(2) Date: Feb. 26, 2021

(87) PCT Pub. No.: WO2020/045943
PCT Pub. Date: Mar. 5, 2020

(65) Prior Publication Data
US 2021/0328716 A1    Oct. 21, 2021

(30) Foreign Application Priority Data
Aug. 30, 2018   (KR) .................. 10-2018-0102409

(51) Int. Cl.
*H04L 1/00* (2006.01)
*H04L 1/1812* (2023.01)
(Continued)

(52) U.S. Cl.
CPC .......... *H04L 1/0061* (2013.01); *H04L 1/0042* (2013.01); *H04L 1/0057* (2013.01);
(Continued)

(58) Field of Classification Search
CPC ... H04L 1/0061; H04L 1/0042; H04L 1/0057; H04L 1/1812; H04L 1/1829; H04W 4/46; H04W 4/44
See application file for complete search history.

(56) References Cited

U.S. PATENT DOCUMENTS

2018/0034593 A1* 2/2018 Xu .................. H04L 1/0057
2019/0288797 A1* 9/2019 Guan ................ H04L 1/1896
(Continued)

FOREIGN PATENT DOCUMENTS

WO    WO2017157028       9/2017
WO    WO-2017157028 A1 * 9/2017 ............ H03M 13/13
(Continued)

OTHER PUBLICATIONS

PCT International Search Report and Written Opinion in International Appln. No. PCT/KR2019/010897, dated Dec. 18, 2019, 18 pages (with English translation).

*Primary Examiner* — Mewale A Ambaye
(74) *Attorney, Agent, or Firm* — Fish & Richardson P.C.

(57) ABSTRACT

A first device may encode a first bit sequence of length K including a first information block, a second information block, a first cyclic redundancy check (CRC) for the first information block, and a second CRC for the second information block, based on a polar code of size; transmit a first signal based on the encoded first bit sequence; receive first hybrid automatic repeat request acknowledgement/negative-acknowledgement (HARQ ACK/NACK) information for the first bit sequence; divide the second information block into a first sub information block and a second sub information block and generate a third CRC for the first sub information block based on the first HARQ ACK/NACK information including information indicating failure of the transmission of the second information block; encode a second bit sequence including the third CRC based on the (Continued)

polar code; and transmit a second signal based on the encoded second bit sequence.

15 Claims, 39 Drawing Sheets

(51) Int. Cl.
*H04L 1/1829* (2023.01)
*H04L 1/1867* (2023.01)
*H04W 4/44* (2018.01)
*H04W 4/46* (2018.01)

(52) U.S. Cl.
CPC .......... *H04L 1/1812* (2013.01); *H04L 1/1829* (2013.01); *H04L 1/1896* (2013.01); *H04W 4/44* (2018.02); *H04W 4/46* (2018.02)

(56) References Cited

U.S. PATENT DOCUMENTS

| | | | | |
|---|---|---|---|---|
| 2020/0220693 | A1* | 7/2020 | Babaei | H04L 5/0044 |
| 2022/0039074 | A1* | 2/2022 | Oh | H04W 72/12 |
| 2022/0353707 | A1* | 11/2022 | Cirik | H04L 5/0048 |
| 2022/0386341 | A1* | 12/2022 | Oved | H04L 1/0003 |

FOREIGN PATENT DOCUMENTS

| | | |
|---|---|---|
| WO | WO2017217711 | 12/2017 |
| WO | WO2017222259 | 12/2017 |
| WO | WO2018058294 | 4/2018 |
| WO | WO-2018058294 A1 * | 4/2018 |

\* cited by examiner $f(L_a, L_b) \sim sign(L_a), sign(L_b), min(|L_a|, |L_b|)$ $g(u_s, L_a, L_b) = (-1)^{u_s} \cdot L_a + L_b$

METHOD AND DEVICE FOR PERFORMING CHANNEL CODING ON BASIS OF POLAR CODING IN WIRELESS COMMUNICATION SYSTEM

CROSS-REFERENCE TO RELATED APPLICATIONS

This application is a National Stage application under 35 U.S.C. § 371 of International Application No. PCT/KR2019/010897, filed on Aug. 27, 2019, which claims the benefit of Korean Application No. 10-2018-0102409, filed on Aug. 30, 2018. The disclosures of the prior applications are incorporated by reference in their entirety.

TECHNICAL FIELD

The present disclosure relates to wireless communication and, more particularly, to a method and device for performing channel coding based on polar coding.

BACKGROUND

In digital communication systems, it is important to transfer information in the form of bits from a transmitter to a receiver without errors. To this end, various error correction codes have been proposed, and among these codes, polar codes recently proposed by Arikan have shown excellent performance. Non-systematic polar codes were first proposed, and then systematic polar codes have been developed.

Recently, polar codes have been researched by many people in various ways and adopted as a standard technology for fifth generation (5G) wireless communication systems as well. Although a lot of work has been done on polar codes in the prior art, the following limitations have remained unsolved.

Various hybrid automatic repeat request (HARQ) methods have been proposed based on polar codes. However, these proposals have the following problems: retransmission efficiency is degraded; and it is difficult to fully use the channel polarization of polar codes.

In wireless communication systems, a receiver measures a channel and performs decoding based on the channel measurement. For the channel measurement, a transmitter transmits relatively a large number of pilot signals, and overhead due to the pilot signals is not insignificant. In the prior art, since the problem in the pilot signal transmission has been considered separately from error correction codes, performance optimization has not been achieved from the perspective of the whole system.

One of the communication technologies adopted as the 5G standards is a non-orthogonal multiple access (NOMA) technology. The NOMA technology allows simultaneous data transmission between multiple users to achieve the maximum transfer rate on limited system resources. Since the NOMA technology and error correction codes have been considered separately, the performance optimization has not been discussed from the perspective of the whole system.

If polar codes, channel measurement, and NOMA technologies are combined, more efficient channel coding may be achieved.

SUMMARY

The present disclosure provides a method of performing channel coding based on polar coding.

The present disclosure provides a device for performing channel coding based on polar coding.

The present disclosure provides a polar code based hybrid automatic repeat request (HARQ) method capable of minimizing the number of times of retransmission and improving the performance of error correction by efficiently combining polar codes with HARQ.

The present disclosure provides a method of improving the performance of a communication system by simultaneously optimizing transmission of pilot signals for channel measurement and transmission of polar codes at a receiver.

The present disclosure provides a method of simultaneously optimizing a NOMA technology and polar codes to maximize the performance of a NOMA system.

It will be appreciated by persons skilled in the art that the objects that could be achieved with the present disclosure are not limited to what has been particularly described hereinabove and the above and other objects that the present disclosure could achieve will be more clearly understood from the following detailed description.

In the present disclosure, a method of transmitting, by a first device to a second device, a signal based on polar coding is provided. The method may include: encoding a first bit sequence having a length of K and including a first information block, a second information block, a first cyclic redundancy check (CRC) for the first information block, and a second CRC for the second information block based on a polar code with a size of N; transmitting a first signal based on the encoded first bit sequence; receiving first hybrid automatic repeat request acknowledgement/negative-acknowledgement (HARQ ACK/NACK) information for the first bit sequence; based on that the first HARQ ACK/NACK information includes information indicating failure in transmission of the second information block, segmenting the second information block into a first information sub-block and a second information sub-block and generating a third CRC for the first information sub-block; encoding a second bit sequence having a length of L and including the third CRC based on the polar code; and transmitting a second signal based on the encoded second bit sequence.

The first HARQ ACK/NACK information may further include information indicating success in transmission of the first information block. The second bit sequence may further include the second information block. The first bit sequence may be placed and encoded at K predetermined input bit locations among N input bits of the polar code. The third CRC of the second bit sequence may be placed and encoded at some of the input bit locations related to the first information block and first CRC among the K input bit locations.

The second information block of the second bit sequence may be placed repeatedly and encoded at input bit locations related to the second information block among the K input bit locations and at the rest of the input bit locations related to the first information block and first CRC among the K input bit locations.

The second bit sequence may further include a new information block. The second information block of the second bit sequence may be placed at the input bit locations related to the second information block among the K input bit locations. The new information block of the second bit sequence may be placed and encoded at the rest of the input bit locations related to the first information block and first CRC among the K input bit locations.

The second bit sequence may further include the second CRC.

The second bit sequence may further include a fourth CRC for the second information sub-block.

The method may further include: receiving second HARQ ACK/NACK information for the second bit sequence; based on that the second HARQ ACK/NACK information includes information indicating failure in transmission of the first information sub-block and information indicating success in transmission of the second information sub-block, generating a fourth CRC for a part of the first information sub-block; encoding a third bit sequence including the first information sub-block, the third CRC, and the fourth CRC based on the polar code; and transmitting a third signal based on the encoded third bit sequence.

The fourth CRC of the third bit sequence may be placed and encoded at some of the input bit locations related to the second information sub-block and second CRC among the K input bit locations.

In the present disclosure, a first device for transmitting to a second device a signal based on polar coding is provided. The first device may include: a transceiver; a memory; and at least one processor connected to the transceiver and the memory.

The memory may be configured to store instructions that, when executed by the at least one processor, cause the at least one processor to perform operations.

The operations may include: encoding a first bit sequence having a length of K and including a first information block, a second information block, a first CRC for the first information block, and a second CRC for the second information block based on a polar code with a size of N; transmitting a first signal based on the encoded first bit sequence; receiving first HARQ ACK/NACK information for the first bit sequence; based on that the first HARQ ACK/NACK information includes information indicating failure in transmission of the second information block, segmenting the second information block into a first information sub-block and a second information sub-block and generating a third CRC for the first information sub-block; encoding a second bit sequence having a length of L and including the third CRC based on the polar code; and transmitting a second signal based on the encoded second bit sequence.

The first HARQ ACK/NACK information may further include information indicating success in transmission of the first information block.

The second bit sequence may further include the second information block.

The first bit sequence may be placed and encoded at K predetermined input bit locations among N input bits of the polar code.

The third CRC of the second bit sequence may be placed and encoded at some of the input bit locations related to the first information block and first CRC among the K input bit locations.

The second information block of the second bit sequence may be placed repeatedly and encoded at input bit locations related to the second information block among the K input bit locations and at the rest of the input bit locations related to the first information block and first CRC among the K input bit locations.

The second bit sequence may further include a new information block. The second information block of the second bit sequence may be placed at the input bit locations related to the second information block among the K input bit locations. The new information block of the second bit sequence may be placed and encoded at the rest of the input bit locations related to the first information block and first CRC among the K input bit locations.

The second bit sequence may further include the second CRC.

The second bit sequence may further include a fourth CRC for the second information sub-block.

The operations may further include: receiving second HARQ ACK/NACK information for the second bit sequence; based on that the second HARQ ACK/NACK information includes information indicating failure in transmission of the first information sub-block and information about success in transmission of the second information sub-block, generating a fourth CRC for a part of the first information sub-block; encoding a third bit sequence including the first information sub-block, the third CRC, and the fourth CRC based on the polar code; and transmitting a third signal based on the encoded third bit sequence.

The fourth CRC of the third bit sequence may be placed and encoded at some of the input bit locations related to the second information sub-block and second CRC among the K input bit locations.

An encoder may be mounted on an autonomous driving device configured to communicate with at least one of a mobile terminal, a base station, or an autonomous driving vehicle.

According to the present disclosure, channel coding may be performed based on polar coding, thereby improving channel coding efficiency.

The present disclosure provides a method of enhancing the performance of a wireless communication system using polar codes.

The present disclosure provides a polar code based hybrid automatic repeat request (HARQ) method for performance improvement when polar codes are used for HARQ.

The present disclosure provides a method of performing channel measurement and polar decoding simultaneously and efficiently in consideration of the fact that a receiver needs to measure channel information for decoding in a wireless communication system.

The present disclosure provides a method for performance improvement by combining polar coding with a non-orthogonal multiple access (NOMA) technology, which is attracted as a standard technology for fifth generation (5G) wireless communication systems.

The effects that can be achieved through the embodiments of the present disclosure are not limited to what has been particularly described hereinabove and other effects which are not described herein can be derived by those skilled in the art from the following detailed description.

BRIEF DESCRIPTION OF THE DRAWINGS

The accompanying drawings, which are included to provide a further understanding of the disclosure and are incorporated in and constitute a part of this specification, illustrate embodiments of the disclosure.

DETAILED DESCRIPTION

Figure 1A:
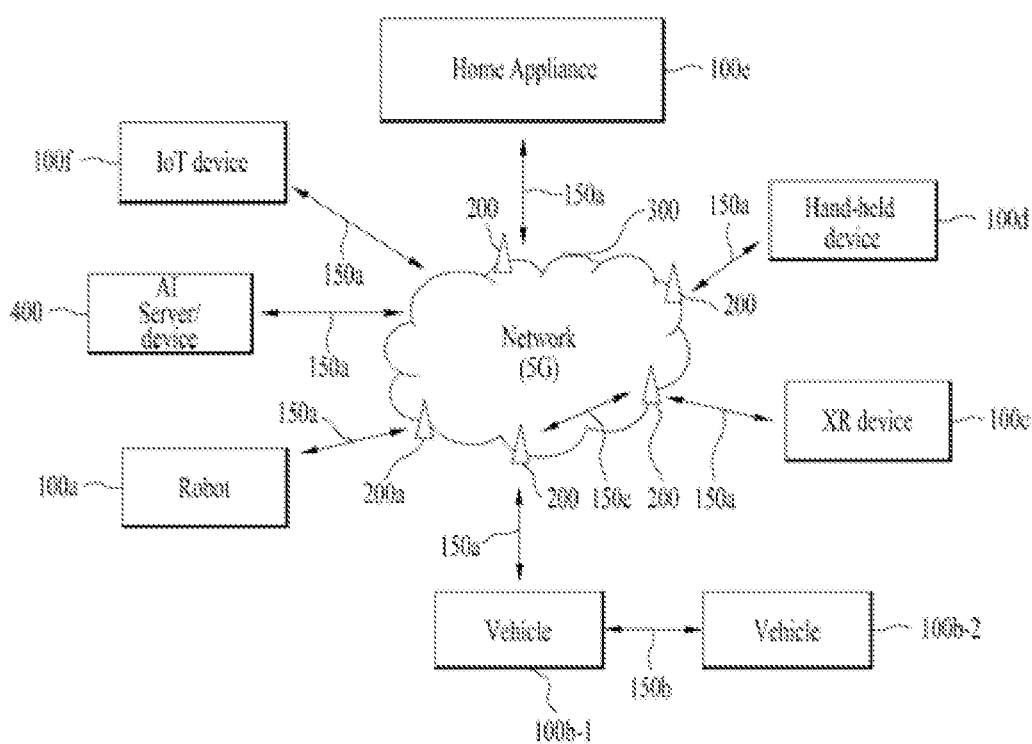
FIG. 1A illustrates a communication system applied to the present disclosure.

Reference will now be made in detail to the preferred embodiments of the present disclosure, examples of which are illustrated in the accompanying drawings. In the following detailed description of the disclosure includes details to help the full understanding of the present disclosure. Yet, it is apparent to those skilled in the art that the present disclosure can be implemented without these details. For instance, although the following descriptions are made in detail on the assumption that a mobile communication system includes 3GPP LTE system and 3GPP LTE-A, the following descriptions are applicable to other random mobile communication systems in a manner of excluding unique features of the 3GPP LTE and 3GPP LTE-A.

Occasionally, to prevent the present disclosure from getting vaguer, structures and/or devices known to the public are skipped or can be represented as block diagrams centering on the core functions of the structures and/or devices. Wherever possible, the same reference numbers will be used throughout the drawings to refer to the same or like parts.

Besides, in the following description, assume that a terminal is a common name of such a mobile or fixed user stage device as a user equipment (UE), a mobile station (MS), an advanced mobile station (AMS) and the like. And, assume that a base station (BS) is a common name of such a random node of a network stage communicating with a terminal as a Node B (NB), an eNode B (eNB), an access point (AP) and the like.

In a mobile communication system, a user equipment is able to receive information in downlink and is able to transmit information in uplink as well. Information transmitted or received by the user equipment node may include various kinds of data and control information. In accordance with types and usages of the information transmitted or received by the user equipment, various physical channels may exist.

The embodiments of the present disclosure can be applied to various wireless access systems such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), etc. CDMA may be implemented as a radio technology such as Universal Terrestrial Radio Access (UTRA) or CDMA2000. TDMA may be implemented as a radio technology such as Global System for Mobile communications (GSM)/General packet Radio Service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, Evolved UTRA (E-UTRA), etc. UTRA is a part of Universal Mobile Telecommunications System (UMTS). 3GPP LTE is a part of Evolved UMTS (E-UMTS) using E-UTRA, adopting OFDMA for DL and SC-FDMA for UL. LTE-Advanced (LTE-A) is an evolution of 3GPP LTE.

Moreover, in the following description, specific terminologies are provided to help the understanding of the present disclosure. And, the use of the specific terminology can be modified into another form within the scope of the technical idea of the present disclosure.

FIG. 1A illustrates a communication system 1 applied to the present disclosure.

Referring to FIG. 1A, the communication system 1 applied to the present disclosure includes wireless devices, BSs, and a network. The wireless devices refer to devices performing communication by radio access technology (RAT) (e.g., 5G New RAT (NR) or LTE), which may also be called communication/radio/5G devices. The wireless devices may include, but no limited to, a robot 100$a$, vehicles 100$b$-1 and 100$b$-2, an extended reality (XR) device 100$c$, a hand-held device 100$d$, a home appliance 100$e$, an IoT device 100$f$, and an artificial intelligence (AI) device/server 400. For example, the vehicles may include a vehicle equipped with a wireless communication function, an autonomous driving vehicle, and a vehicle capable of performing vehicle-to-vehicle (V2V) communication. The vehicles may include an unmanned aerial vehicle (UAV) (e.g., a drone). The XR device may include an augmented reality (AR)/virtual reality (VR)/mixed reality (MR) device, and may be implemented in the form of a head-mounted device (HMD), a head-up display (HUD) mounted in a vehicle, a television (TV), a smartphone, a computer, a wearable device, a home appliance, a digital signage, a vehicle, a robot, and so on. The hand-held device may include a smartphone, a smartpad, a wearable device (e.g., a smartwatch or smart glasses), and a computer (e.g., a laptop). The home appliance may include a TV, a refrigerator, and a washing machine. The IoT device may include a sensor and a smart meter. For example, the BSs and the network may be implemented as wireless devices, and a specific wireless device 200$a$ may operate as a BS/network node for other wireless devices.

The wireless devices 100$a$ to 100$f$ may be connected to the network 300 via the BSs 200. An AI technology may be applied to the wireless devices 100$a$ to 100$f$, and the wireless devices 100$a$ to 100$f$ may be connected to the AI server 400 via the network 300. The network 300 may be configured by using a 3G network, a 4G (e.g., LTE) network, or a 5G (e.g., NR) network. Although the wireless devices 100$a$ to 100$f$ may communicate with each other through the BSs 200/network 300, the wireless devices 100$a$ to 100$f$ may perform direct communication (e.g., sidelink communication) with each other without intervention of the BSs/network. For example, the vehicles 100$b$-1 and 100$b$-2 may perform direct communication (e.g. V2V/vehicle-to-everything (V2X) communication). The IoT device (e.g., a sensor) may perform direct communication with other IoT devices (e.g., sensors) or other wireless devices 100$a$ to 100$f$.

Wireless communication/connections 150$a$, 150$b$, or 150$c$ may be established between the wireless devices 100$a$ to 100$f$ and the BSs 200, or between the BSs 200. Herein, the wireless communication/connections may be established through various RATs (e.g., 5G NR) such as UL/DL communication 150$a$, sidelink communication 150$b$ (or, D2D communication), or inter-BS communication 150$c$ (e.g. relay, integrated access backhaul (IAB)). A wireless device and a BS/a wireless devices, and BSs may transmit/receive radio signals to/from each other through the wireless communication/connections 150$a$, 150$b$, and 150$c$. To this end, at least a part of various configuration information configuring processes, various signal processing processes (e.g., channel encoding/decoding, modulation/demodulation, and resource mapping/demapping), and resource allocating processes, for transmitting/receiving radio signals, may be performed based on the various proposals of the present disclosure.

Figure 1B:
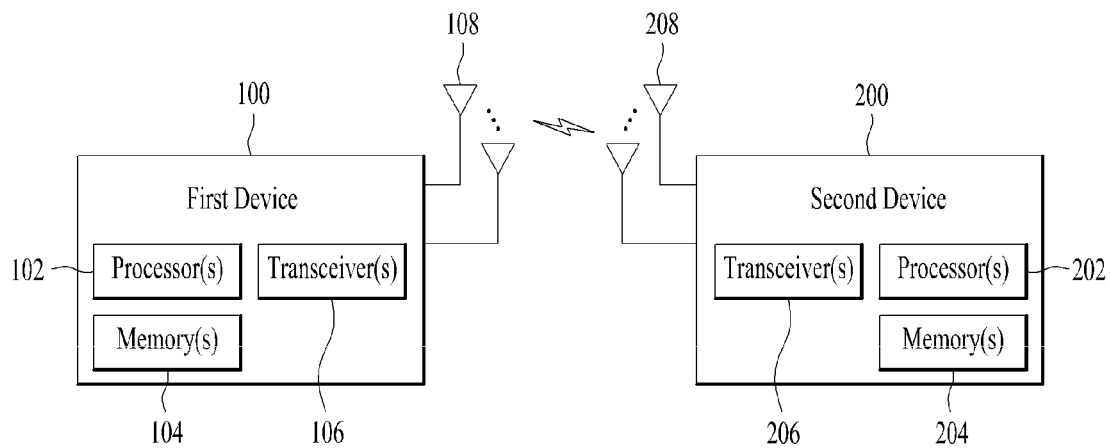
FIG. 1B illustrates wireless devices applicable to the present disclosure.

FIG. 1B illustrates wireless devices applicable to the present disclosure.

Referring to FIG. 1B, a first wireless device 100 and a second wireless device 200 may transmit radio signals through a variety of RATs (e.g., LTE and NR). Herein, (the first wireless device 100 and the second wireless device 200) may correspond to {the wireless devices 100a to 100f and the BSs 200} and/or {the wireless devices 100a to 100f and the wireless devices 100a to 100f} of FIG. 1A.

The first wireless device 100 may include at least one processor 102 and at least one memory 104, and may further include at least one transceiver 106 and/or at least one antenna 108. The processor 102 may control the memory 104 and/or the transceiver 106 and may be configured to implement the descriptions, functions, procedures, proposals, methods, and/or operational flowcharts disclosed in this document. For example, the processor 102 may process information within the memory 104 to generate first information/signal and then transmit a radio signal including the first information/signal through the transceiver 106. The processor 102 may receive a radio signal including second information/signal through the transceiver 106 and then store information obtained by processing the second information/signal in the memory 104. The memory 104 may be coupled to the processor 102 and store various types of information related to operations of the processor 102. For example, the memory 104 may store software code including commands for performing a part or all of processes controlled by the processor 102 or for performing the descriptions, functions, procedures, proposals, methods, and/or operational flowcharts disclosed in this document. Herein, the processor 102 and the memory 104 may be a part of a communication modem/circuit/chip designed to implement an RAT (e.g., LTE or NR). The transceiver 106 may be coupled to the processor 102 and transmit and/or receive radio signals through the at least one antenna 108. The transceiver 106 may include a transmitter and/or a receiver. The transceiver 106 may be interchangeably used with an RF unit. In the present disclosure, a wireless device may refer to a communication modem/circuit/chip.

The second wireless device 200 may include at least one processor 202 and at least one memory 204, and may further include at least one transceiver 206 and/or at least one antenna 208. The processor 202 may control the memory 204 and/or the transceiver 206 and may be configured to implement the descriptions, functions, procedures, proposals, methods, and/or operational flowcharts disclosed in this document. For example, the processor 202 may process information within the memory 204 to generate third information/signal and then transmit a radio signal including the third information/signal through the transceiver 206. The processor 202 may receive a radio signal including fourth information/signal through the transceiver 206 and then store information obtained by processing the fourth information/signal in the memory 204. The memory 204 may be coupled to the processor 202 and store various types of information related to operations of the processor 202. For example, the memory 204 may store software code including commands for performing a part or all of processes controlled by the processor 202 or for performing the descriptions, functions, procedures, proposals, methods, and/or operational flowcharts disclosed in this document. Herein, the processor 202 and the memory 204 may be a part of a communication modem/circuit/chip designed to implement an RAT (e.g., LTE or NR). The transceiver 206 may be coupled to the processor 202 and transmit and/or receive radio signals through the at least one antenna 208. The transceiver 206 may include a transmitter and/or a receiver. The transceiver 206 may be interchangeably used with an RF unit. In the present disclosure, a wireless device may refer to a communication modem/circuit/chip.

Hereinafter, hardware elements of the wireless devices 100 and 200 will be described in greater detail. One or more protocol layers may be implemented by, but not limited to, one or more processors 102 and 202. For example, the one or more processors 102 and 202 may implement one or more layers (e.g., functional layers such as PHY, MAC, RLC, PDCP, RRC, and SDAP). The one or more processors 102 and 202 may generate one or more protocol data units (PDUs) and/or one or more service data units (SDUs) according to the descriptions, functions, procedures, proposals, methods, and/or operational flowcharts disclosed in this document. The one or more processors 102 and 202 may generate messages, control information, data, or information according to the descriptions, functions, procedures, proposals, methods, and/or operational flowcharts disclosed in this document. The one or more processors 102 and 202 may generate signals (e.g., baseband signals) including PDUs, SDUs, messages, control information, data, or information according to the descriptions, functions, procedures, proposals, methods, and/or operational flowcharts disclosed in this document and provide the generated signals to the one or more transceivers 106 and 206. The one or more processors 102 and 202 may receive the signals (e.g., baseband signals) from the one or more transceivers 106 and 206 and acquire the PDUs, SDUs, messages, control information, data, or information according to the descriptions, functions, procedures, proposals, methods, and/or operational flowcharts disclosed in this document.

The one or more processors 102 and 202 may be referred to as controllers, microcontrollers, microprocessors, or microcomputers. The one or more processors 102 and 202 may be implemented in hardware, firmware, software, or a combination thereof. For example, one or more application specific integrated circuits (ASICs), one or more digital signal processors (DSPs), one or more digital signal processing devices (DSPDs), one or more programmable logic devices (PLDs), or one or more field programmable gate arrays (FPGAs) may be included in the one or more processors 102 and 202. The descriptions, functions, procedures, proposals, methods, and/or operational flowcharts disclosed in this document may be implemented in firmware or software, which may be configured to include modules, procedures, or functions. Firmware or software configured to perform the descriptions, functions, procedures, proposals, methods, and/or operational flowcharts disclosed in this document may be included in the one or more processors 102 and 202, or may be stored in the one or more memories 104 and 204 and executed by the one or more processors 102 and 202. The descriptions, functions, procedures, proposals, methods, and/or operational flowcharts disclosed in this document may be implemented as code, instructions, and/or a set of instructions in firmware or software.

The one or more memories 104 and 204 may be coupled to the one or more processors 102 and 202 and store various types of data, signals, messages, information, programs, code, instructions, and/or commands. The one or more memories 104 and 204 may be configured as read-only memories (ROMs), random access memories (RAMs), electrically erasable programmable read-only memories (EPROMs), flash memories, hard drives, registers, cash memories, computer-readable storage media, and/or combinations thereof. The one or more memories 104 and 204 may be located at the interior and/or exterior of the one or more processors 102 and 202. The one or more memories 104 and 204 may be coupled to the one or more processors 102 and 202 through various technologies such as wired or wireless connection.

The one or more transceivers 106 and 206 may transmit user data, control information, and/or radio signals/channels, mentioned in the methods and/or operational flowcharts of this document, to one or more other devices. The one or more transceivers 106 and 206 may receive user data, control information, and/or radio signals/channels, mentioned in the descriptions, functions, procedures, proposals, methods, and/or operational flowcharts disclosed in this document, from one or more other devices. For example, the one or more transceivers 106 and 206 may be coupled to the one or more processors 102 and 202 and transmit and receive radio signals. For example, the one or more processors 102 and 202 may control the one or more transceivers 106 and 206 to transmit user data, control information, or radio signals to one or more other devices. The one or more processors 102 and 202 may control the one or more transceivers 106 and 206 to receive user data, control information, or radio signals from one or more other devices. The one or more transceivers 106 and 206 may be coupled to the one or more antennas 108 and 208 and configured to transmit and receive user data, control information, and/or radio signals/channels, mentioned in the descriptions, functions, procedures, proposals, methods, and/or operational flowcharts disclosed in this document, through the one or more antennas 108 and 208. In this document, the one or more antennas may be a plurality of physical antennas or a plurality of logical antennas (e.g., antenna ports). The one or more transceivers 106 and 206 may convert received radio signals/channels etc. from RF band signals into baseband signals in order to process received user data, control information, radio signals/channels, etc. using the one or more processors 102 and 202. The one or more transceivers 106 and 206 may convert the user data, control information, radio signals/channels, etc. processed using the one or more processors 102 and 202 from the base band signals into the RF band signals. To this end, the one or more transceivers 106 and 206 may include (analog) oscillators and/or filters.

Figure 1C:
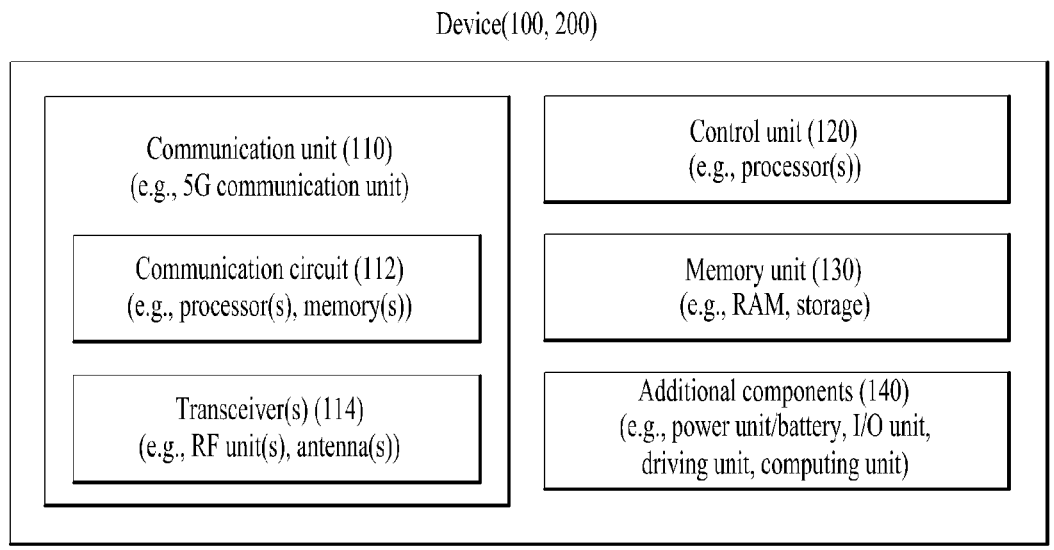
FIG. 1C illustrates other examples of wireless devices applicable to the present disclosure.

FIG. 1C illustrates another example of wireless devices applied to the present disclosure.

The wireless devices may be implemented in various forms according to use-cases/services (refer to FIG. 1A).

Referring to FIG. 1C, wireless devices 100 and 200 may correspond to the wireless devices 100 and 200 of FIG. 1B and may be configured as various elements, components, units/portions, and/or modules. For example, each of the wireless devices 100 and 200 may include a communication unit 110, a control unit 120, a memory unit 130, and additional components 140. The communication unit may include a communication circuit 112 and transceiver(s) 114. For example, the communication circuit 112 may include the one or more processors 102 and 202 and/or the one or more memories 104 and 204 of FIG. 2B. For example, the transceiver(s) 114 may include the one or more transceivers 106 and 206 and/or the one or more antennas 108 and 208 of FIG. 2B. The control unit 120 is electrically coupled to the communication unit 110, the memory unit 130, and the additional components 140 and provides overall control to operations of the wireless devices. For example, the control unit 120 may control an electric/mechanical operation of the wireless device based on programs/code/commands/information stored in the memory unit 130. The control unit 120 may transmit the information stored in the memory unit 130 to the outside (e.g., other communication devices) via the communication unit 110 through a wireless/wired interface or store, in the memory unit 130, information received through the wireless/wired interface from the outside (e.g., other communication devices) via the communication unit 110.

The additional components 140 may be configured in various manners according to the types of wireless devices. For example, the additional components 140 may include at least one of a power unit/battery, an input/output (I/O) unit, a driver, and a computing unit. The wireless device may be configured as, but not limited to, the robot (100*a* of FIG. 1A), the vehicles (100*b*-1 and 100*b*-2 of FIG. 1A), the XR device (100*c* of FIG. 1A), the hand-held device (100*d* of FIG. 1A), the home appliance (100*e* of FIG. 1A), the IoT device (100*f* of FIG. 1A), a digital broadcasting terminal, a hologram device, a public safety device, an MTC device, a medicine device, a FinTech device (or a finance device), a security device, a climate/environment device, the AI server/device (400 of FIG. 1A), the BSs (200 of FIG. 1A), a network node, etc. The wireless device may be mobile or fixed according to a use-case/service.

In FIG. 1C, all of the various elements, components, units/portions, and/or modules in the wireless devices 100 and 200 may be coupled to each other through a wired interface or at least a part thereof may be wirelessly coupled to each other through the communication unit 110. For example, in each of the wireless devices 100 and 200, the control unit 120 and the communication unit 110 may be coupled by wire, and the control unit 120 and first units (e.g., 130 and 140) may be wirelessly coupled through the communication unit 110. Each element, component, unit/portion, and/or module within the wireless devices 100 and 200 may further include one or more elements. For example, the control unit 120 may be configured as a set of one or more processors. For example, the control unit 120 may be configured as a set of a communication control processor, an application processor, an electronic control unit (ECU), a graphical processing unit, and a memory control processor. In another example, the memory unit 130 may be configured as a random access memory (RAM), a dynamic RAM (DRAM), a read only memory (ROM), a flash memory, a volatile memory, a non-volatile memory, and/or a combination thereof.

According to the present disclosure, a device for performing channel coding based on polar coding may include a transceiver, a memory, and at least one processor connected to the transceiver and memory.

The memory may be configured to store instructions that, when executed by the at least one processor, cause the at least one processor to perform operations.

Figure 2:
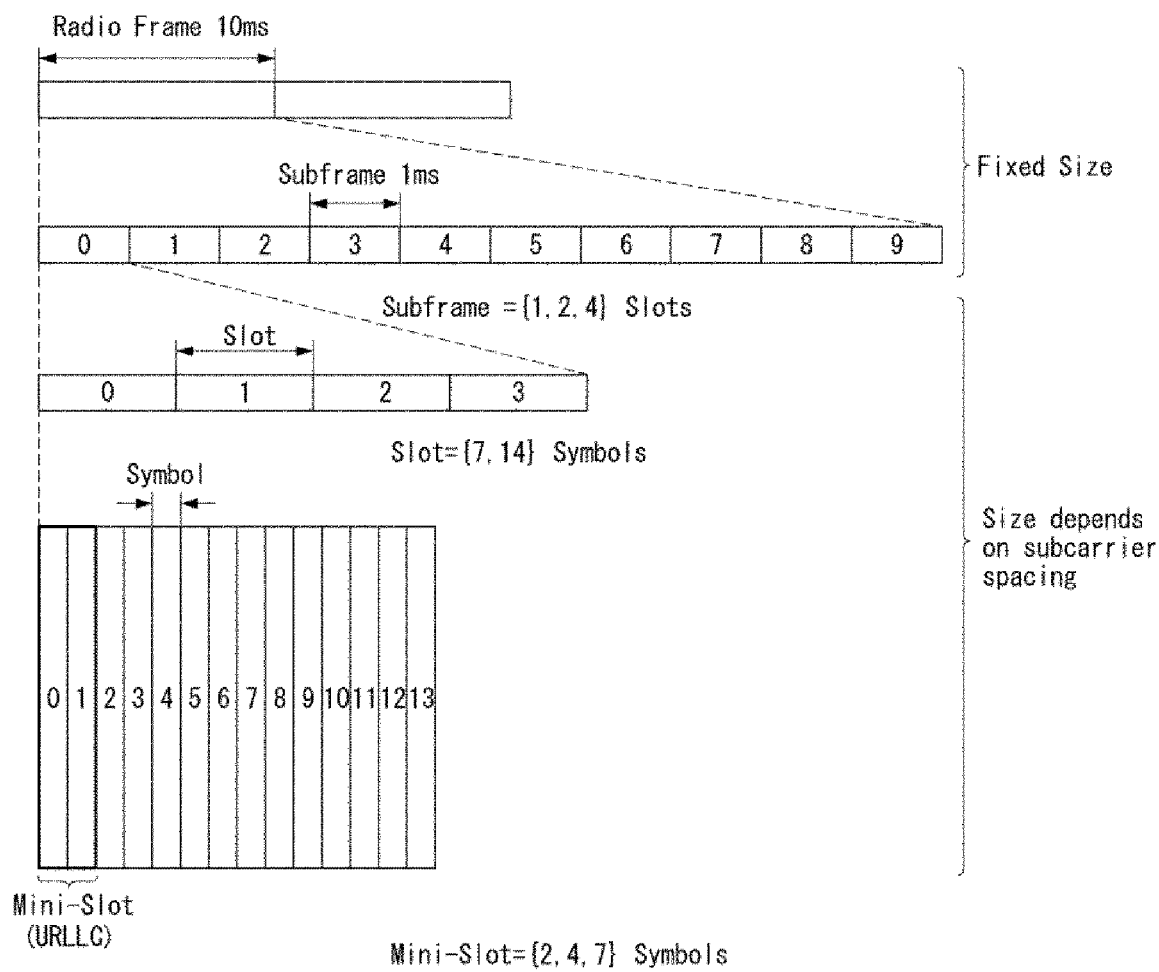
FIG. 2 is a diagram illustrating a frame structure of a new radio access technology (new RAT or NR).

FIG. 2 is a diagram illustrating a frame structure in NR.

The NR system may support multiple numerologies. A numerology may be defined by a subcarrier spacing (SCS) and a cyclic prefix (CP) overhead. Multiple SCSs may be derived by scaling a default SCS by an integer N (or μ). Further, even though it is assumed that a very small SCS is not used in a very high carrier frequency, a numerology to be used may be selected independently of a frequency band. Further, the NR system may support various frame structures according to multiple numerologies.

Now, a description will be given of OFDM numerologies and frame structures which may be considered for the NR system. Multiple OFDM numerologies supported by the NR system may be defined as listed in Table 1.

TABLE 1

| μ | Δf = $2^μ*15$[kHz] | Cyclic prefix(CP) |
|---|---|---|
| 0 | 15 | Normal |
| 1 | 30 | Normal |
| 2 | 60 | Normal, Extended |
| 3 | 120 | Normal |
| 4 | 240 | Normal |

The NR system supports multiple numerologies (e.g., SCSs) to support various 5G services. For example, in an SCS of 15 kHz, the NR system supports a wide area in conventional cellular bands. In an SCS of 30/60 kHz, the NR system supports a dense urban environment, low latency, and wide carrier bandwidth. In an SCS of 60 kHz or above, the NR system supports a bandwidth higher than 24.25 GHz to overcome phase noise.

NR frequency bands are divided into two frequency ranges: frequency range 1 (FR1) and frequency range 2 (FR2). FR1 covers sub-6 GHz frequency bands, and FR2 covers frequency bands above 6 GHz, i.e., bands in the millimeter wavelength (mmWave).

Table 2 shows the definitions of the NR frequency ranges.

TABLE 2

| Frequency Range designation | Corresponding frequency range | Subcarrier Spacing |
|---|---|---|
| FR1 | 450 MHz-6000 MHz | 15, 30, 60 kHz |
| FR2 | 24250 MHz-52600 MHz | 60, 120, 240 kHz |

Regarding a frame structure in the NR system, the time-domain sizes of various fields are represented as multiples of a basic time unit, $T_s=1/(\Delta f_{max} \cdot N_f)$ where $\Delta f_{max}=480 \cdot 10^3$ and $N_f=4096$. DL and UL transmissions are organized into radio frames each having a duration of $T_f=(\Delta f_{max} N_f/100) \cdot T_s=10$ ms. Each radio frame includes 10 subframes each having a duration of $T_{sf}=(\Delta f_{max} N_f/1000) \cdot T_s=1$ ms. In this case, there may exist one set of frames for UL and one set of frames for DL. Further, transmission of UL frame #i from the UE should state a time $T_{TA}=N_{TA}T_s$ before the start of a corresponding DL frame. For a numerology μ, slots are numbered with $n_s^μ \in \{0, \ldots, N_{subframe}^{slots,μ}-1\}$ in an increasing order in a subframe, and with $n_{s,f}^μ \in \{0, \ldots, N_{subframe}^{slots,μ}-1\}$ in an increasing order in a radio frame. One slot includes $N_{symb}^μ$ consecutive OFDM symbols, and $N_{symb}^μ$ depends on a used numerology and slot configuration. The start of a slot $n_s^μ$ in a subframe is aligned in time with the start of an OFDM symbol $n_s^μ N_{symb}^μ$ in the same subframe. All UEs are not capable of simultaneous transmission and reception, which implies that all OFDM symbols of a DL slot or a UL slot may not be used. Table 3 lists the number $N_{symb}^{slot}$ of symbols per slot, the number $N_{slot}^{frame,μ}$ of slots per frame, and the number $N_{slot}^{subframe,μ}$ of slots per subframe, for each SCS in a normal CP case, and Table 4 lists the number of symbols per slot, the number of slots per frame, and the number of slots per subframe, for each SCS in an extended CP case.

TABLE 3

| μ | $N_{symb}^{slot}$ | $N_{slot}^{frame,μ}$ | $N_{slot}^{subframe,μ}$ |
|---|---|---|---|
| 0 | 14 | 10 | 1 |
| 1 | 14 | 20 | 2 |
| 2 | 14 | 40 | 4 |

TABLE 3-continued

| μ | $N_{symb}^{slot}$ | $N_{slot}^{frame,μ}$ | $N_{slot}^{subframe,μ}$ |
|---|---|---|---|
| 3 | 14 | 80 | 8 |
| 4 | 14 | 160 | 16 |

TABLE 4

| μ | $N_{symb}^{slot}$ | $N_{slot}^{frame,μ}$ | $N_{slot}^{subframe,μ}$ |
|---|---|---|---|
| 2 | 12 | 40 | 4 |

FIG. 2 illustrates an example with μ=2, that is, an SCS of 60 kHz, in which referring to Table 2 one subframe may include four slots. One subframe=(1, 2, 4) slots in FIG. 2 which is exemplary, and the number of slot(s) which may be included in one subframe is defined as listed in Table 2.

Further, a mini-slot may include 2, 4 or 7 symbols, fewer symbols than 2, or more symbols than 7.

In the NR system, an antenna port, a resource grid, a resource element, a resource block, a carrier part, etc. may be considered as physical resources. Hereinafter, the physical resources considerable in the NR system will be described in detail.

First, an antenna port may be defined such that a channel conveying symbols on the antenna port is capable of being inferred from a channel conveying other symbols on the same antenna port. When the large-scale properties of a channel carrying symbols on one antenna port are inferred from a channel carrying symbols on another antenna port, the two antenna ports may be said to be in quasi co-located or quasi co-location (QC/QCL) relationship. The large-scale properties may include at least one of the following parameters: delay spread, Doppler spread, frequency shift, average received power, received timing, average delay, and spatial reception (Rx). The spatial Rx parameter refer to a spatial (Rx) channel characteristic parameter such as angle of arrival.

Figure 3:
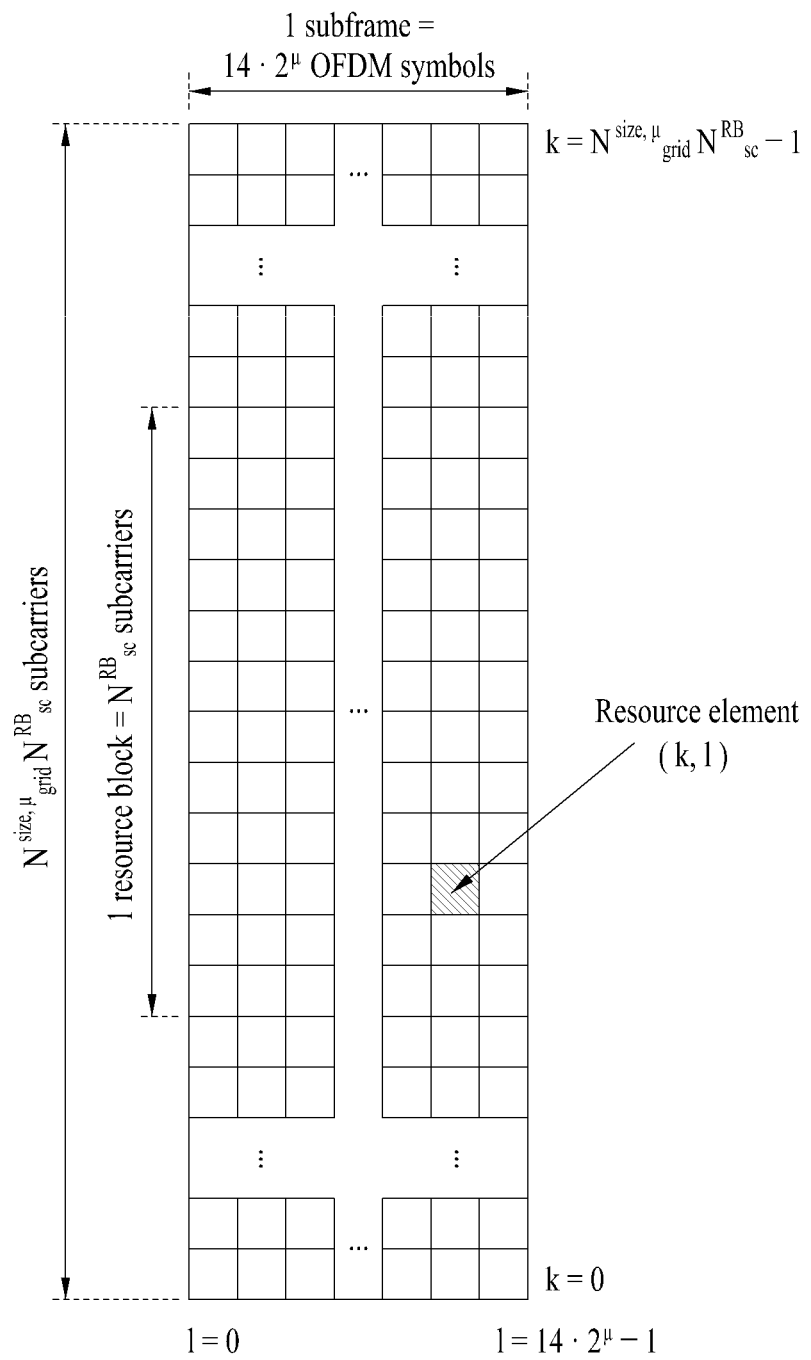
FIG. 3 illustrates a resource grid of NR.

FIG. 3 illustrates a resource grid in the NR system.

Figure 4:
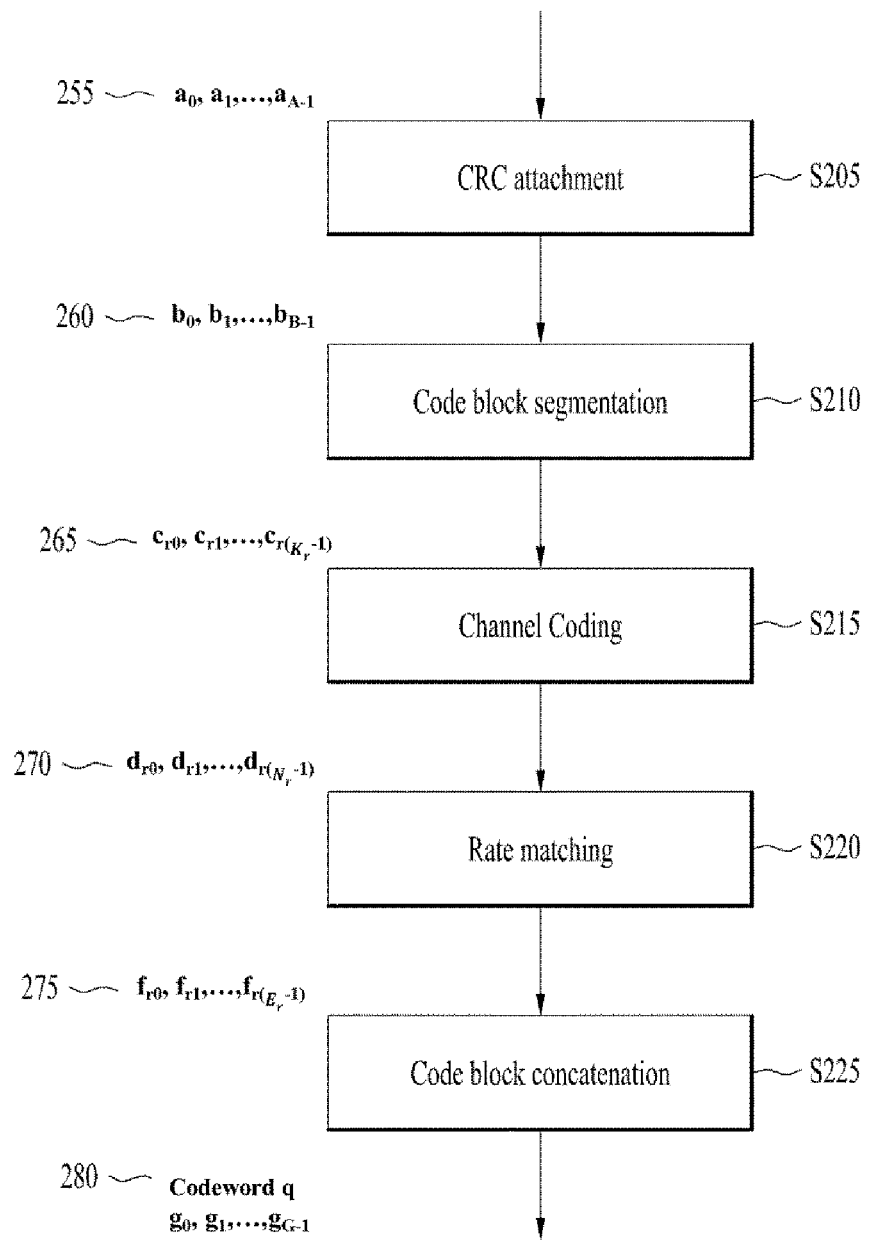
FIG. 4 is a diagram for explaining a channel coding method according to the present disclosure.

Referring to FIG. 3, a resource grid includes $N_{RB}^μ N_{sc}^{RB}$ subcarriers in the time domain, and one subframe $14 \cdot 2^μ$ OFDM symbols, which is exemplary and thus should not be construed as limiting the disclosure. In the NR system, a transmitted signal is described by one or more resource grids including $N_{RB}^μ N_{sc}^{RB}$ subcarriers and $2^μ N_{symb}^{(μ)}$ OFDM symbols, where $N_{RB}^μ \leq N_{RB}^{max,μ}$. $N_{RB}^{max,μ}$ represents a maximum transmission bandwidth, which may be different for UL and DL as well as according to numerologies. In this case, one resource grid may be configured for each neurology μ and each antenna port p, as illustrated in FIG. 4. Each element of the resource grid for the numerology μ and the antenna port p is referred to as an RE, which is uniquely identified by an index pair (k,l) where k=0, . . . , $N_{RB}^μ N_{sc}^{RB}-1$ is a frequency-domain index and l=0, . . . , $2^μ N_{symb}^{(μ)}-1$ indicates the position of a symbol in a subframe. An RE in a slot is indicated by an index pair (k,l) where l=0, . . . , $N_{symb}^μ-1$. An RE(k,l) for the numerology μ and the antenna port p corresponds to a complex value $a_{k,l}^{(p,μ)}$. When there is no risk of confusion or a specific antenna port or a numerology is not specified, the indexes p and μ may be dropped, and as a result, the complex value may be $a_{k,l}^{(p)}$ or $a_{k,l}$. In addition, an RB is defined as $N_{sc}^{RB}=12$ consecutive subcarriers in the frequency domain.

Considering that a UE may be incapable of supporting a wide bandwidth supported in the NR system, the UE may be configured to operate in a part of the frequency BW of a cell (hereinafter referred to as a bandwidth part (BWP)).

In the NR system, resource blocks may be divided into physical resource blocks defined within the BWP and common resource blocks numbered from 0 upward in the frequency domain for an SCS configuration μ.

Point A is obtained as follows.

For a PCell downlink, offsetToPointA represents the frequency offset between point A and the lowest subcarrier of the lowest resource block overlapping with an SS/PBCH block used by the UE for initial cell selection, which is expressed in units of resource blocks on the assumption of an SCS of 15 kHz for FR1 and an SCS of 60 kHz for FR2.

For other cases, absoluteFrequencyPointA represents the frequency location of point A expressed as in the absolute radio-frequency channel number (ARFCN).

The center of subcarrier 0 of common resource block 0 for the SCS configuration μ coincides with point A, which act as the reference point for resource grids. The relationship between a common resource block number $n^μ_{CRB}$ in the frequency domain and a resource elements (k,l) for the SCS configuration μ is given by Equation 1.

$$n^μ_{CRB} = \left\lfloor \frac{k}{N^{RB}_{sc}} \right\rfloor \quad \text{[Equation 1]}$$

In Equation 1, k is defined relative to point A such that k=0 corresponds to a subcarrier around point A. Physical resource blocks are numbered from 0 to $N^{size}_{BWP,i}-1$ within the BWP, where i is the number of the BWP. The relationship between a physical resource block $n_{PRB}$ and a common resource block $n_{CRB}$ in BWP i is given by Equation 2.

$$n_{CRB} = n_{PRB} + N^{start}_{BWP,i} \quad \text{[Equation 2]}$$

In Equation 2, $N^{start}_{BWP,i}$ is a common resource block where the BWP starts relative to common resource block 0.

FIG. 4 is a diagram for explaining a channel coding method according to the present disclosure.

Data subject to channel coding is referred to as a transport block. Typically, depending on the performance of channel coding, the transport block is divided into code blocks, each of which has a size less than or equal to a predetermined value. For example, in turbo coding of 3GPP TS 36.212, the code block may have a maximum size of 6144 bits. In low density parity check (LDPC) coding of 3GPP TS 38.212, the code block may have a maximum size of 8448 bits (in base graph 1) or 3840 bits (in base graph 2). In polar coding, the code block may have a minimum size of 32 bits and a maximum size of 8192 bits. The code block may be subdivided into sub-blocks. In polar coding methods according to the present disclosure, an input bit sequence (265) ($c_{r0}, c_{r1}, \ldots, c_{r(Kr-1)}$) is interleaved, the interleaved input bit sequence (not shown in the drawing) ($c'_{r0}, c'_{r1}, \ldots, c'_{r(Kr-1)}$) may be encoded based on polar codes. The encoded bit sequence (270) ($d_{r0}, d_{r1}, \ldots, d_{r(Nr-1)}$) may be rate matched. The rate matching of the encoded bit sequence (270) may include: subdividing the encoded bit sequence into sub-blocks; interleaving each of the sub-blocks; performing bit selection for each of the interleaved sub-blocks; and interleaving coded bits again. The bit selection for each of the interleaved sub-blocks may include repeating, puncturing, or shortening some bits.

The channel coding method according to the present disclosure may include attaching a cyclic redundancy check (CRC) code to a transport block (S205); dividing the transport block into code blocks (S210); encoding the divided code blocks (S215); perform rate matching of the encoded code blocks (S220); and concatenating the rate-matched code blocks (S225).

In step S205, party bits with a length of L are attached to the transport block (255) ($a_0, \ldots, a_{A-1}$). The length L may be any one of 6, 11, 16, and 24. Typically, cyclic generator polynomials are used to generate party bits. In addition, scrambling operation may be applied to output bits (260) ($b_0, \ldots, b_{B-1}$), which depend on the CRC attachment, with a radio network temporary identifier (RNTI). Exclusive OR (EOR) operation may be applied between a scrambling sequence and corresponding bits based on the scrambling operation.

The output bits (260) ($b_0, \ldots, b_{B-1}$) depending on the CRC attachment may be segmented into code blocks (265) according to code block sizes. This is called code block segmentation. The code block sizes are determined by channel coding methods. A code block size suitable for each channel coding method may be determined theoretically or experimentally. For example, the segmented code blocks (265) ($c_{r0}, \ldots, c_{r(Kr-1)}$) may be encoded as encoded bits (270) ($d_{r0}, \ldots, d_{r(Nr-1)}$), respectively.

The encoded bits (270) ($d_{r0}, \ldots, d_{r(Nr-1)}$) are generated by applying channel coding to the code blocks (265) ($c_{r0}, \ldots, c_{r(Kr-1)}$) (S215). The generated encoded bits (270) may be rate-matched by shortening and puncturing. Alternatively, the encoded bits (270) may be rate-matched by sub-block interleaving, bit selection, and/or interleaving. That is, the encoded bits (270) ($d_{r0}, \ldots, d_{r(Nr-1)}$) are converted into rate-matched bits (275) ($f_{r0}, \ldots, f_{r(gr-1)}$) (S220). Typically, interleaving may refer to a process for changing a sequence of bits and reduce the occurrence of errors. The interleaving is designed in consideration of efficient de-interleaving.

Sub-block interleaving may mean a process for dividing a code block into a plurality of sub-blocks (e.g., 32 sub-blocks) and allocating bits based on the sub-block interleaving.

The bit selection may mean a process for increasing a bit sequence by repeating bits based on the number of bits to be rate-matched or decreasing the bit sequence based on shortening, puncturing, etc. The interleaving may mean a process for interleaving encoded bits after the bit selection.

In another example of the present disclosure, the rate matching may include the bit selection and interleaving. The sub-block interleaving is not mandatory.

After interleaving the encoded bits, code block concatenation is applied to concatenate the code blocks (275) so that a codeword (285) ($g_0, \ldots, g_{G-1}$) may be generated (S225). The generated codeword 280 may be equivalent to one transport block.

Figure 5:
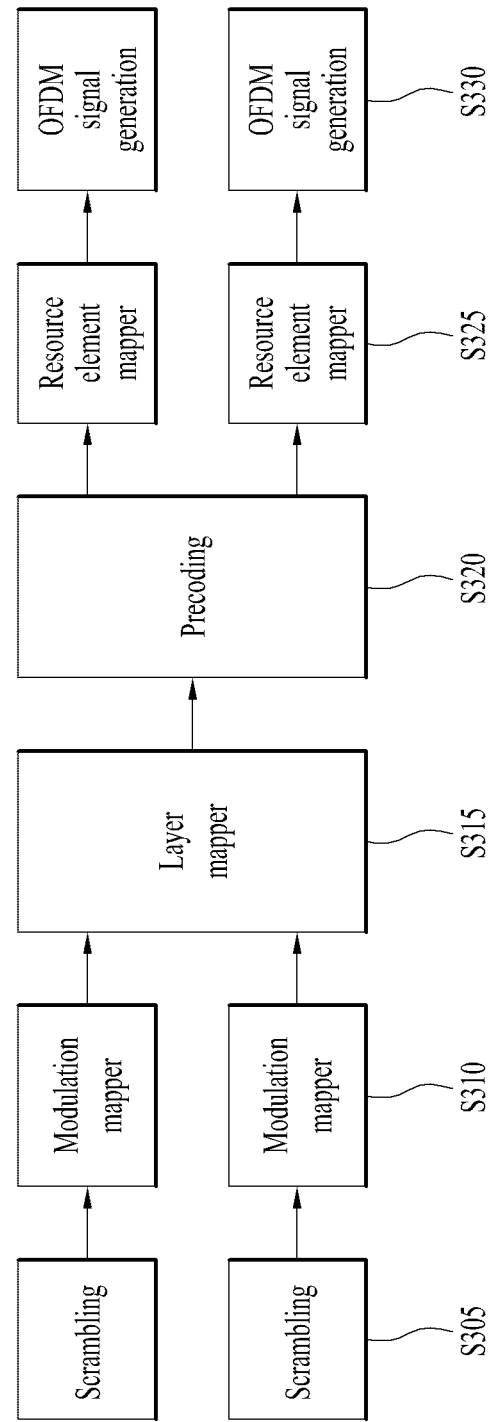
FIGS. 5 and 6 are diagrams for explaining a modulation method according to the present disclosure.
Figure 6:
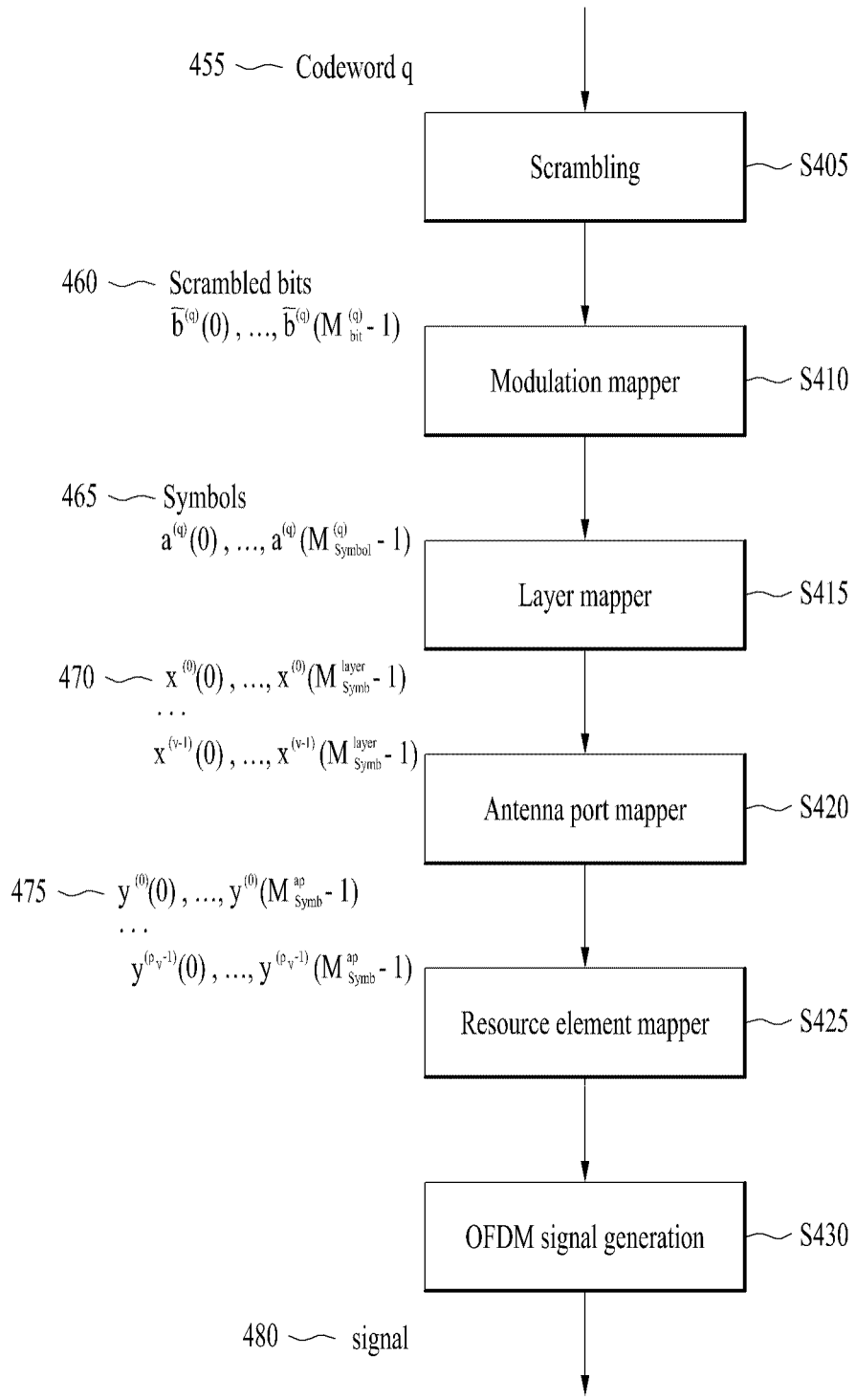

FIGS. 5 and 6 are diagrams for explaining a modulation method according to the present disclosure.

Referring to FIGS. 5 and 6, one or more codewords are input and scrambled (S305 and S405). For example, scrambling may be performed based on EOR operation between an input bit sequence and a predetermined bit sequence. The scrambled bits are modulated (S310 and S410), and the modulated symbols are mapped to layers (S315 and S415). The symbols mapped to the layers are precoded for antenna port mapping. The precoded symbols are mapped to resource elements (S325 and S425). The mapped symbols are generated as OFDM signals (S330 and S430) and transmitted through antennas.

The most important issue in digital communication systems is that information in the form of bits needs to be transmitted from a transmitter to a receiver without errors. To this end, various error correction codes have been proposed, and among these codes, polar codes recently proposed by Arikan have shown excellent performance. Non-systematic polar codes were first proposed, and then systematic polar codes have been developed.

Recently, polar codes have been researched by many people in various ways and adopted as a standard technology for 5G wireless communication systems as well. Although a lot of work has been done on polar codes in the prior art, the following limitations have remained unsolved.

Various hybrid automatic repeat request (HARQ) methods have been proposed based on polar codes. However, these proposals have the following problems: retransmission efficiency is degraded, or it is difficult to fully use the channel polarization of polar codes.

In wireless communication systems, the receiver measures a channel and performs decoding based on the channel measurement. For the channel measurement, the transmitter transmits relatively a large number of pilot signals, and overhead due to the pilot signals is not negligible. In the prior art, since the problem in the pilot signal transmission has been considered separately from error correction codes, performance optimization has not been achieved from the perspective of the whole system.

The present disclosure proposes a polar code based HARQ method for minimizing the number of times of retransmission and improving the performance of error correction by efficiently combining polar codes with HARQ.

The present disclosure proposes a method of improving the performance of a communication system by simultaneously optimizing pilot signal transmission for channel measurement and polar code transmission at a receiver.

Figure 7A:
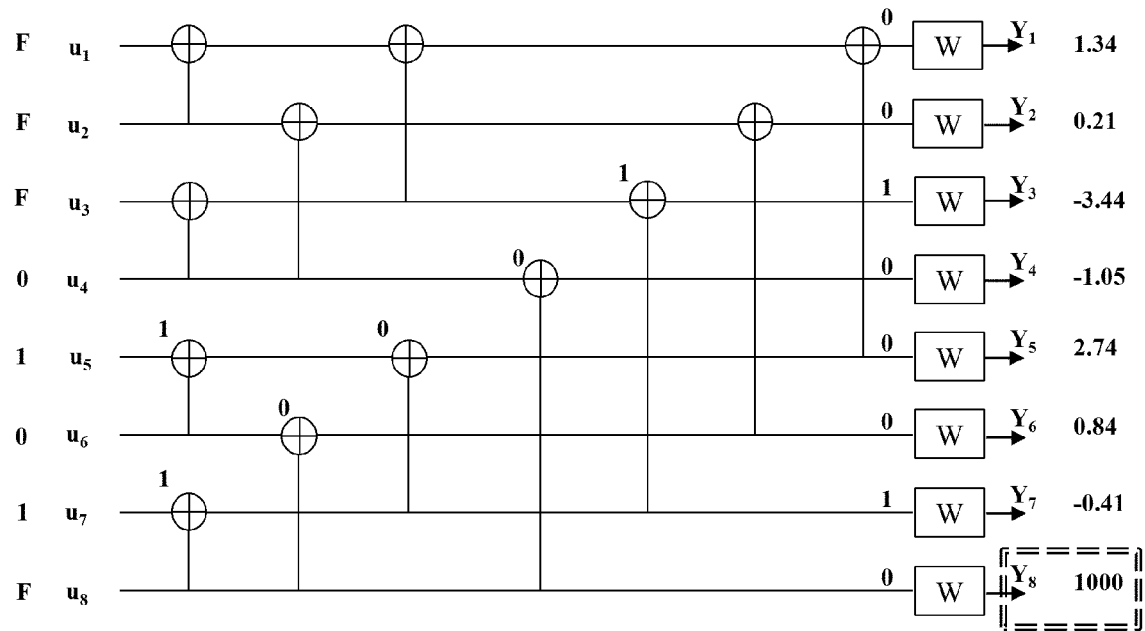
FIGS. 7A and 7B are diagrams for showing performance improvement in polar coding based channel coding according to the present disclosure when pilot signals are applied to codewords of a polar code, compared to when puncturing is applied.
Figure 7B:
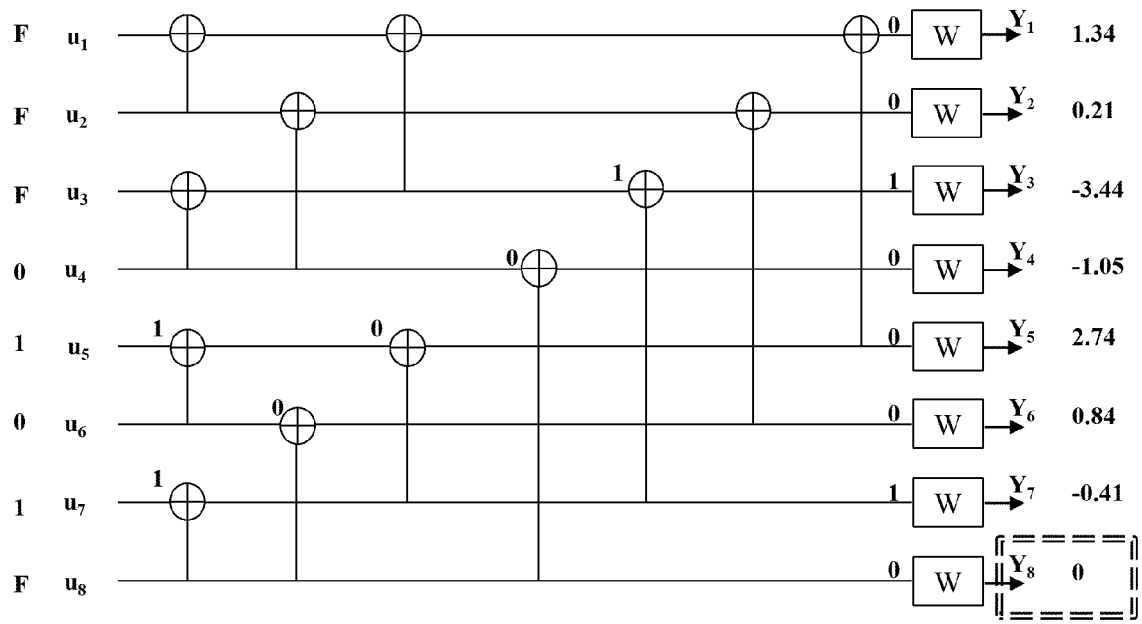

FIGS. 7A and 7B are diagrams for showing performance improvement in polar coding based channel coding according to the present disclosure when pilot signals are applied to codewords of a polar code, compared to when puncturing is applied.

In information technology, a polar code is a linear block error correction code. The code structure is based on multiple recursive concatenation of short kernel codes which transform a physical channel into virtual outer channels.

The block length N of polar codes is a power of 2 ($=2^n$). That is, N may have a value of 2, 4, 8, 16, 32, 64, 128, etc.

For example, the generator matrix of polar codes with N=2 may be given by Equation 3.

$$G = \begin{bmatrix} 1 & 0 \\ 1 & 1 \end{bmatrix} \quad \text{[Equation 3]}$$

Based on Equation 3, the generator matrix of polar codes with N=8 may be given by Equation 4.

$$G = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 1 & 0 & 1 & 0 & 0 & 0 \\ 1 & 1 & 1 & 1 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{[Equation 4]}$$

The generator matrix of polar codes, which are linear block codes, may be determined by the polar code block length, N ($=2^n$).

The polar coding method according to the present disclosure is advantageous in that fast decoding is enabled because the generator matrix is easily determined and a reverse matrix thereof is rapidly computed due to the feature of the polar code generator matrix.

In FIGS. 7A and 7B, it is assumed that when N=8 and K=4, input bits are a vector $U=(u_1, u_2, u_3, u_4, u_5, u_6, u_7, u_8)$, where N is the polar code block length, and K is the length of a message. Although the present disclosure is mainly described on the assumption that N=8 or 16, the technical features of the present disclosure may be extended and applied when $N=2^n$ in consideration of the features of polar codes. For example, a CRC applied to two bits may also be applied to four bits. In addition, although the CRC is assumed to be one bits, the CRC may be two bits or more. In FIG. 7, F denotes a frozen bits, and '0' is used as the frozen bit. On the other hand, '1' may also be used as the frozen bit. However, if the frozen bit is '1', output values vary depending on the location and number of frozen bits so that the amount of calculation is expected to increase. Thus, '0' may be used as the frozen bit in general.

Referring to FIGS. 7A and 7B, the log likelihood ratio (LLR) value of a codeword at the receiver is represented as a vector $Y=(Y_1, Y_2, Y_3, Y_4, Y_5, Y_6, Y_7, Y_8)$.

Since the pilot value is already known, $Y_8$ may have a large (or infinite) value. When puncturing is applied, it is assumed that $Y_8$ is 0. In addition, $Y_4$ may be used as a received value by reversing the sign of the LLR value.

Referring to FIGS. 7A and 7B, $U=(u_1, u_2, u_3, u_4, u_5, u_6, u_7, u_8)=(0, 0, 0, 0, 1, 0, 1, 0)$ and $Y=(Y_1, Y_2, Y_3, Y_4, Y_5, Y_6, Y_7, Y_8)=(0, 0, 1, 0, 0, 0, 1, 0)$. Here, $\oplus$ denotes exclusive OR (or bitwise exclusive OR) (EOR) operation, which is to combine bits. In FIG. 7A, $Y_8$ may be used as a pilot signal, and in FIG. 7B, $Y_8$ may be punctured.

Figure 8A:
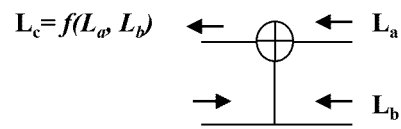
FIGS. 8A and 8B are diagrams for explaining an operator for min-sum based decoding of a successive cancellation (SC) algorithm for polar codes according to the present disclosure.
Figure 8B:
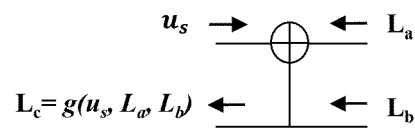

FIGS. 8A and 8B are diagrams for explaining an operator for min-sum based decoding of a successive cancellation (SC) algorithm for polar codes according to the present disclosure.

Referring to FIG. 8A, when input values are $L_a$ and $L_b$, an output value is determined as $L_c=f(L_a, L_b)$, where $f(L_a, L_b)$ is determined as follows.

$$f(L_a, L_b) = \text{sign}(L_a) \text{sign}(L_b) \min(|L_a|, |L_b|) \quad \text{[Equation 5]}$$

Referring to FIG. 8B, when input values are $u_s$, $L_a$, and $L_b$, an output value is determined as $L_c=g(u_s, L_a, L_b)$, where $g(u_s, L_a, L_b)$ is determined as follows.

$$g(u_s, L_a, L_b) = (-1)^{u_s} L_a + L_b \quad \text{[Equation 6]}$$

Figure 9A:
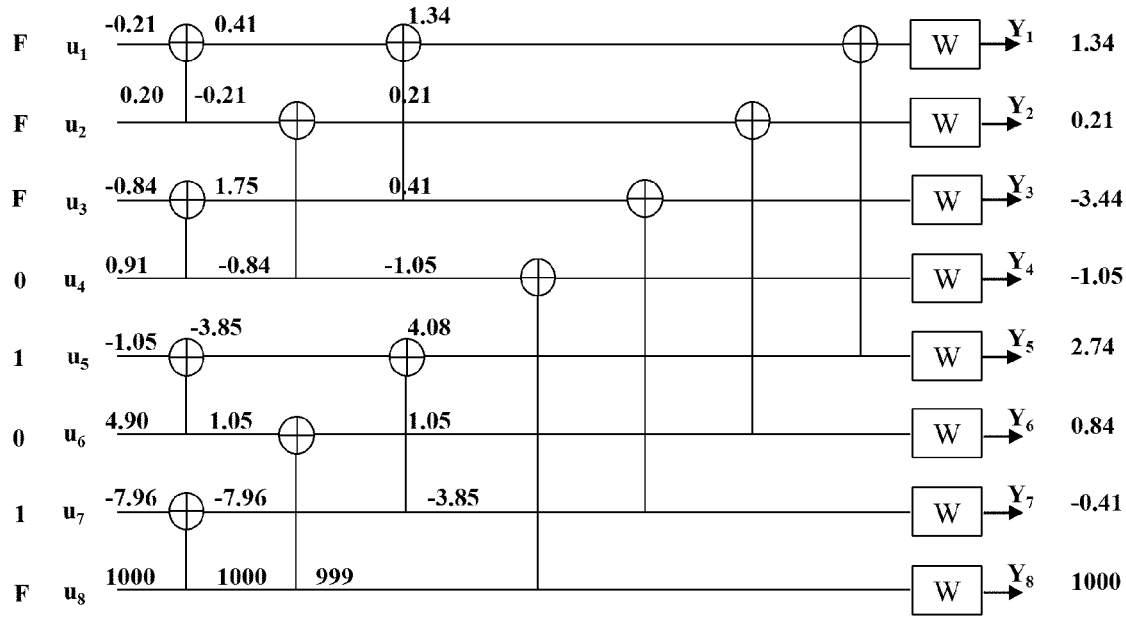
FIGS. 9A and 9B are diagrams for explaining min-sum decoding results by the min-sum decoding operator.
Figure 9B:
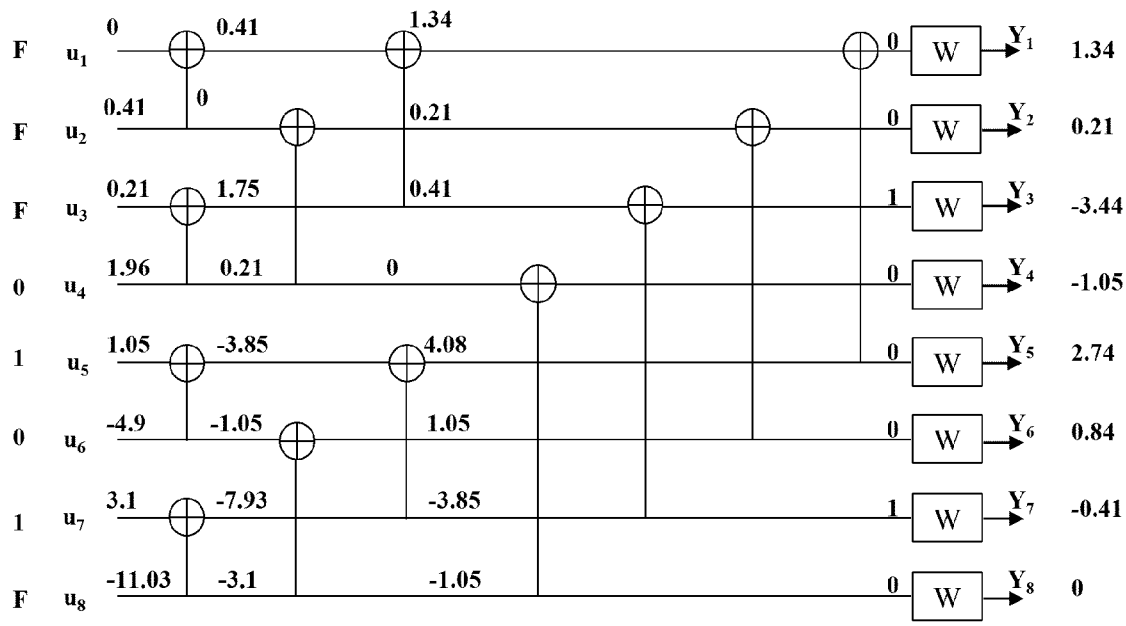

FIGS. 9A and 9B are diagrams for explaining min-sum decoding results by the min-sum decoding operator.

Specifically, FIG. 9A shows a case of using pilot signals, and FIG. 9B shows a case of puncturing. In addition, FIG. 9A shows normal decoding results, and FIG. 9B shows erroneous (decoding) results.

It may be seen that the pilot signals of FIG. 9A guarantee better performance than the puncturing of FIG. 9B.

Referring to FIG. 9A, an input bit corresponding to $u_8$ is a frozen bit, the bit value of $Y_8$ may be 0. Thus, a pilot signal may be allocated to $Y_8$. Referring to FIG. 9B, an input bit corresponding to $u_8$ is a frozen bit, and the bit value of $Y_8$ may be 0. Thus, $Y_8$ may be punctured.

Hereinbelow, a HARQ retransmission method using polar codes based on channel polarization maximization and selective retransmission will be described.

1. Polar Coded HARQ Based on Channel Polarization Maximization and Selective Retransmission 1.1. Legacy Polar Coded HARQ 1.1.1 Polar Coded HARQ Based on Selective Retransmission FIG. 10 is a diagram for explaining a polar coded HARQ method based on selective retransmission according to the present disclosure.

Figure 10:
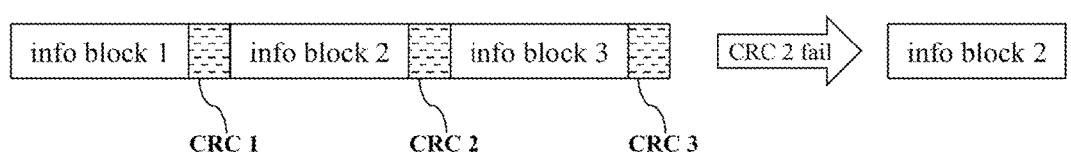
FIG. 10 is a diagram for explaining a polar coded hybrid automatic repeat request (HARQ) method based on selective retransmission according to the present disclosure.

Referring to FIG. 10, information bits are divided into three groups (information blocks 1, 2, and 3), and one CRC is added to each information block (info block). The information blocks and CRCs may be encoded by non-systematic polar coding or systematic polar coding. Encoded codewords are transferred to the receiver after passing through a channel where noise exists. The receiver performs polar error-correction decoding, which is related to the polar coding used for encoding. In general, successive interference cancellation (SIC) decoding or belief propagation (BP) decoding is performed. After performing the decoding based on polar codes, the receiver performs a CRC check for each information block. In the case of a CRC check failure, the receiver transmits to the transmitter the index (or location) of an information block where the CRC check fails. The transmitter may retransmit only the information block related to the index (or location) to the receiver. In this case, the transmitter may transmit the information block with no error correction encoding. Alternatively, the transmitter may transmit codewords by applying the polar coding again to the information block.

Figure 11:
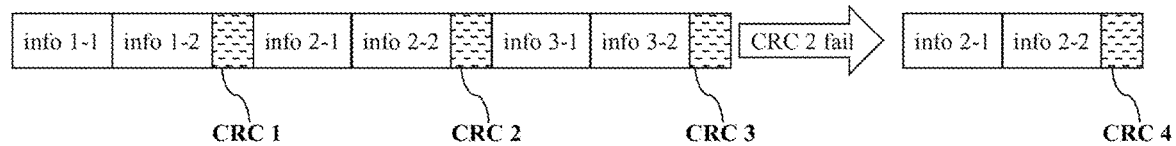
FIG. 11 is a diagram for explaining a polar coded HARQ method based on binary search and selective retransmission.
Figure 11:
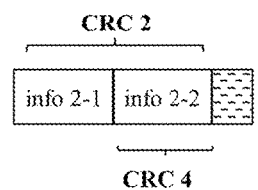

FIG. 11 is a diagram for explaining a polar coded HARQ method based on binary search and selective retransmission.

The method of FIG. 11 shows better performance than the method of FIG. 10. Referring to FIG. 11, the receiver may confirm that CRC decoding fails in the second information block (info 2-1 and info 2-2) through a CRC check. The receiver informs the transmitter of the CRC decoding failure in the second information block. That is, the transmitter may know that an error occurs in the second information block and thus retransmit the second information block. However, the transmitter may not accurately know at which point in the second block the error occurs. According to the method of FIG. 10, the entirety of the second information block may be retransmitted. The receiver may successfully complete error correction based on the retransmission of the second information block. However, in some cases, the receiver may not succeed in correcting the error in the second block even though the second information block is retransmitted. When the receivers fails to correct the error in spite of the retransmission, the transmitter needs to transmit the entirety of the second information block again, and this may be inefficient.

According to the method of FIG. 11, it is possible to avoid the retransmission. Referring to FIG. 11, when the second information block is retransmitted, one CRC (e.g., CRC4 of FIG. 11) may be added. The added CRC may be applied to some bits (info 2-2 of FIG. 11) in the second information block. In other words, the accurate location of the CRC decoding failure may be obtained by transmitting an additional CRC through segmentation of an information block where transmission fails. Specifically, when the error occurs in the second information block, the receiver may know whether the error occurs in the front or rear portion of the second information block by checking CRC 2 and CRC 4. The receiver may transmit the location (e.g., front or rear portion) in the second information block where the error occurs to the transmitter.

Compared to the initial transmission, the receiver may obtain the accurate location of the transmission failure (CRC decoding failure) from the retransmission, and thus the transmitter may also obtain the accurate location of the error based on a retransmission failure report from the receiver. The transmitter may determine a portion to transmit to the receiver based on the error occurrence location. The transmitter may improve transmission efficiency by transmitting only the part where the error occurs. Although FIG. 11 shows a case in which the retransmission is performed one time, the method may be applied when the retransmission is performed multiple times. That is, the method may be hierarchically applied by adding CRCs depending on the number of transmission failures to improve the transmission efficiency. The above-described method may be implemented by applying the concept of the binary searching (or bisection method) or Newton's method (Newton-Raphson method) to polar coded HARQ with multiple CRCs.

According to the selective retransmission schemes of FIGS. 10 and 11, since the transmitter is capable of knowing the location of an information block where an error occurs, the transmitter may perform retransmission a minimum number of times as needed. In particular, when the binary search method is additionally applied as shown in FIG. 11, the performance may be further improved. However, the selective retransmission schemes of FIGS. 10 and 11 have the following limitations. That is, it is difficult to obtain an effect as if the length of a codeword of a polar code increases from retransmission. In addition, considering the basic concept of polar codes that information is transmitted over an excellent channel based on the fact that channel polarization increases as the length of a codeword increases, it is difficult to further improve the channel polarization from retransmission in the selective retransmission schemes of FIGS. F01 and F02.

1.1.2 Polar Coded HARQ for Maximizing Channel Polarization

Figure 12:
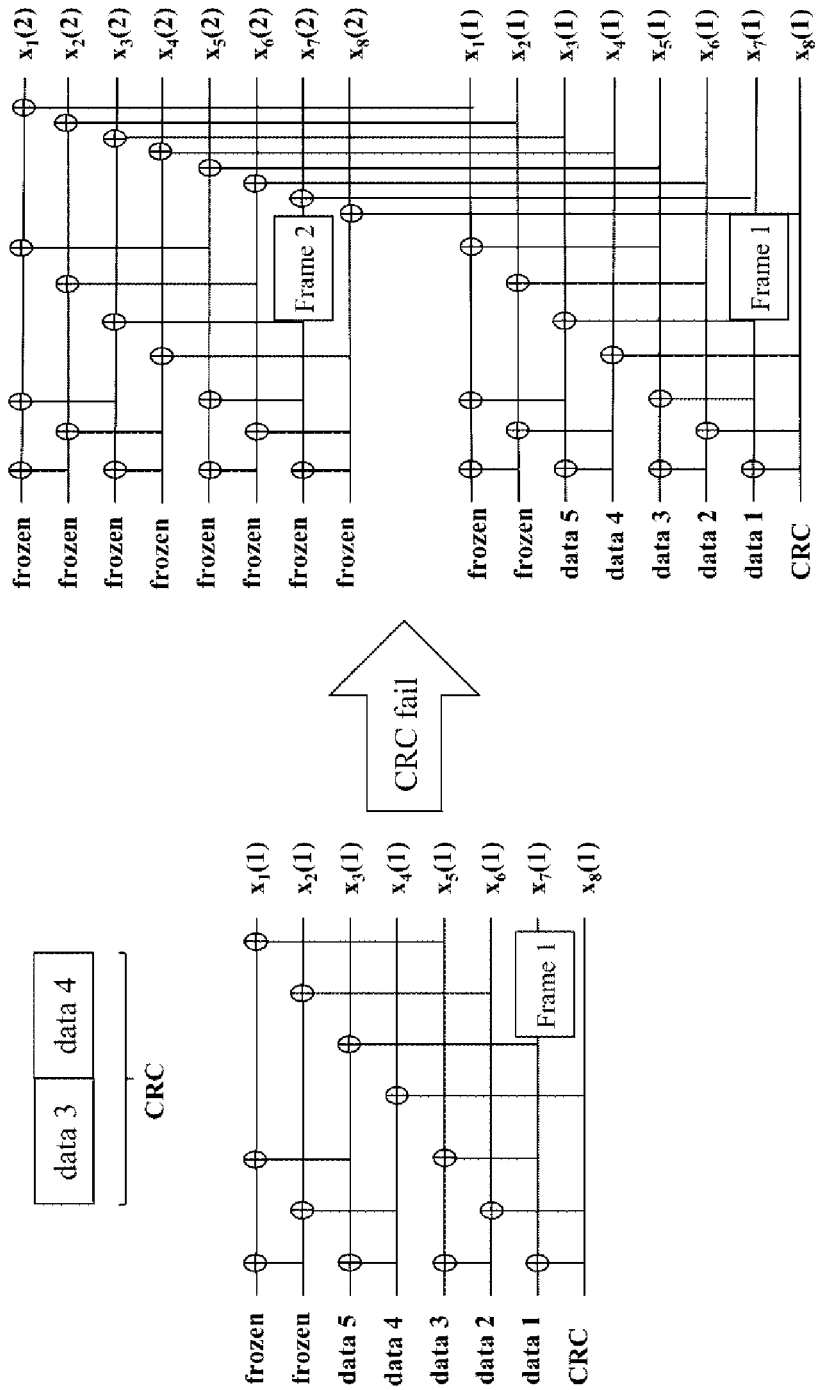
FIG. 12 is a diagram for explaining a polar coded HARQ method for maximizing channel polarization according to the present disclosure.

FIG. 12 is a diagram for explaining a polar coded HARQ method for maximizing channel polarization according to the present disclosure.

For first transmission (frame 1), one CRC is used, and the receiver determines whether decoding is successful by checking the CRC. In the case of a decoding failure, the receiver transmits frame 2 for retransmission as shown in FIG. 12. In this case, frames 1 and 2 are formed as one polar codeword at the receiver. In FIG. 12, frame 1 is a length-8 polar code, and thus, the combination of frames 1 and 2 is a length-16 polar code. That is, a polar codeword having an increased length is formed by retransmission at the receiver, and thus channel polarization may be improved. When additional retransmission is performed, a lengthened polar code is formed. Thus, the channel polarization is further improved whenever retransmission is performed. Eventually, error correction capability is improved.

However, the method of FIG. 12 has the following disadvantages. First, the method may be inefficient in that although the channel polarization is improved, reliability is improved for all bits regardless of error occurrence. The fundamental reason for this is that since only one CRC is used, it is difficult for the receiver to estimate the location of erroneous information bits.

1.2 Non-Systematic Polar Codes

The present disclosure proposes a HARQ method based on non-systematic polar codes capable of overcoming disadvantages of selective retransmission or channel polarization maximization. It is assumed that in first transmission, information bits are divided into two information blocks and a CRC is added to each block.

Figure 13:
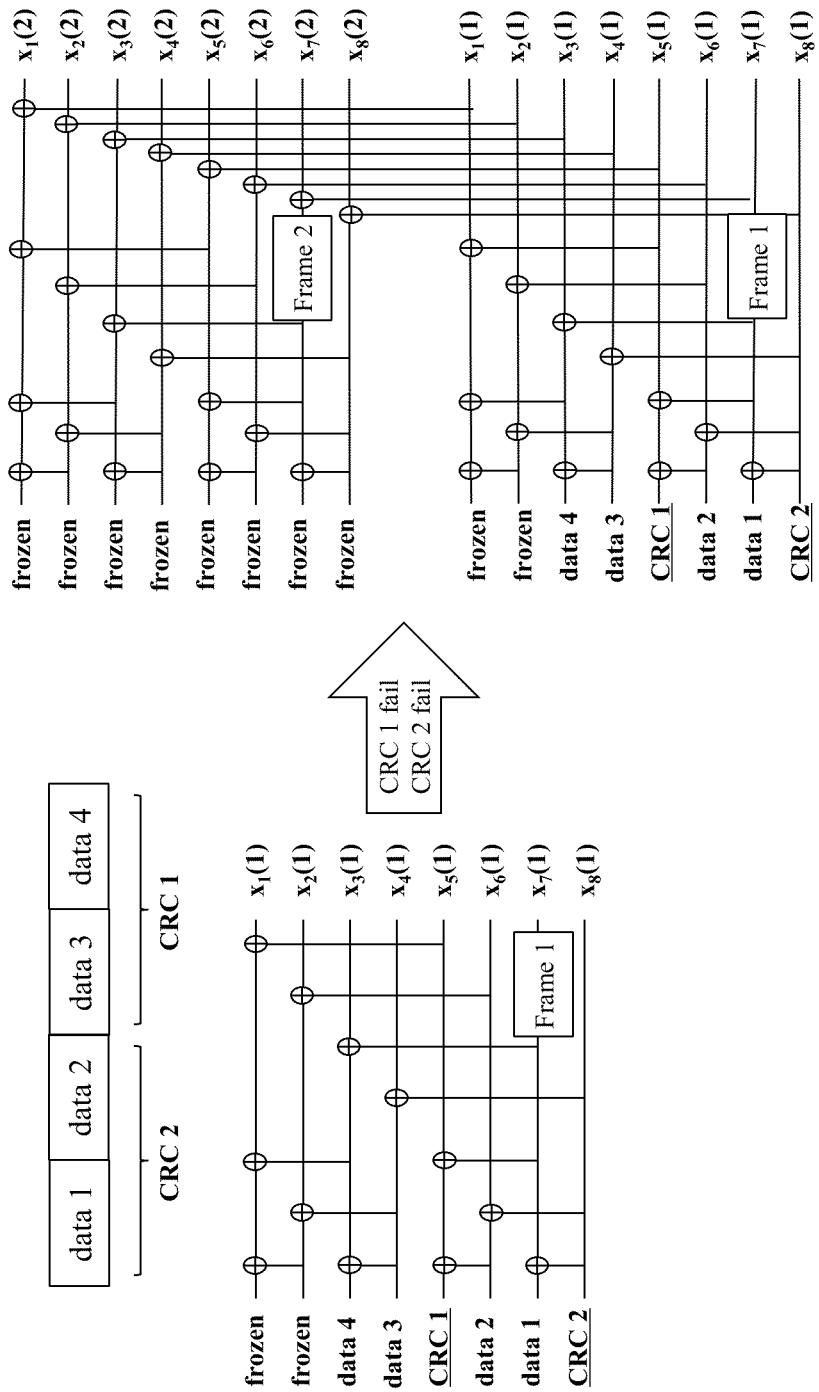
FIG. 13 is a diagram for explaining a HARQ method using non-systematic polar coding based on channel polarization maximization and selective retransmission for error pattern 1 according to the present disclosure.

FIG. 13 is a diagram for explaining a HARQ method using non-systematic polar coding based on channel polarization maximization and selective retransmission for error pattern 1 according to the present disclosure.

FIG. 13 shows a case in which errors occur in the two information blocks (two CRC checks fail). Such a case may be defined as error pattern 1. In this case, the actual length of a polar codeword constructed by retransmission is doubled (16 in FIG. F04), and the code rate becomes half (6/16 in FIG. 13).

Figure 14:
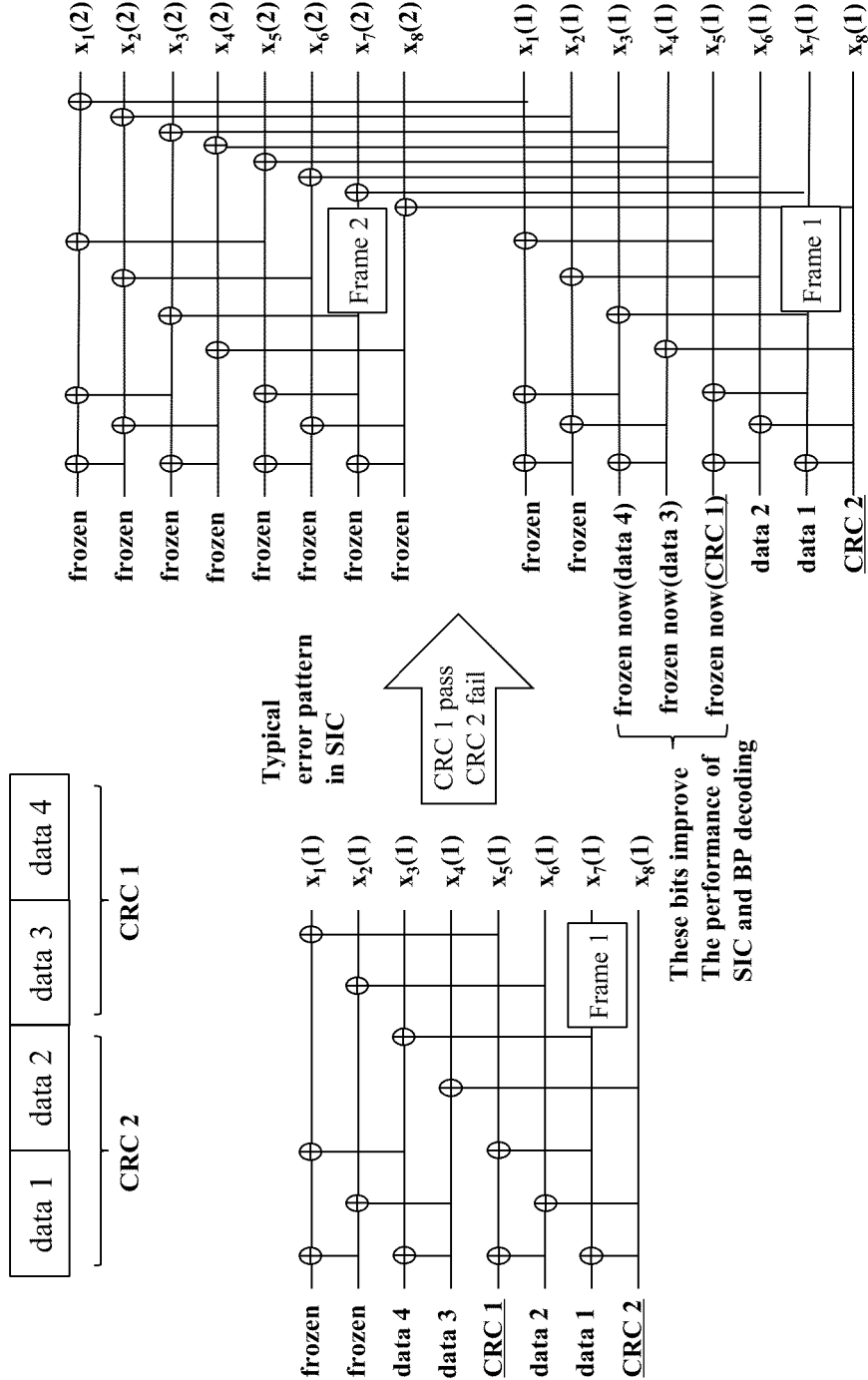
FIG. 14 is a diagram for explaining a HARQ method using non-systematic polar coding based on channel polarization maximization and selective retransmission for error pattern 2 according to the present disclosure.

FIG. 14 is a diagram for explaining a HARQ method using non-systematic polar coding based on channel polarization maximization and selective retransmission for error pattern 2 according to the present disclosure.

FIG. 14 shows a case in which a first information block (data 3 and data 4) of two information blocks is decoded with no errors, but an error occurs in a second information block (data 1 and data 2). This case may be defined as error pattern 2. The transmitter may equally perform retransmission for both error patterns 1 and 2. However, decoding at the receiver may vary for each case. For error pattern 2, when decoding polar codes, the receiver may perform the decoding by considering bits in the first information block as frozen bits. Since the receiver recognizes that data 3 and data 4 are correctly received by checking CRC 1 during initial transmission, the receiver may achieve efficient decoding compared to when using data 3, data 4, and CRC 1 as frozen bits. In the example of FIG. 14, the actual code rate becomes 3/16. The decoding may be SIC decoding or BP decoding.

Figure 15:
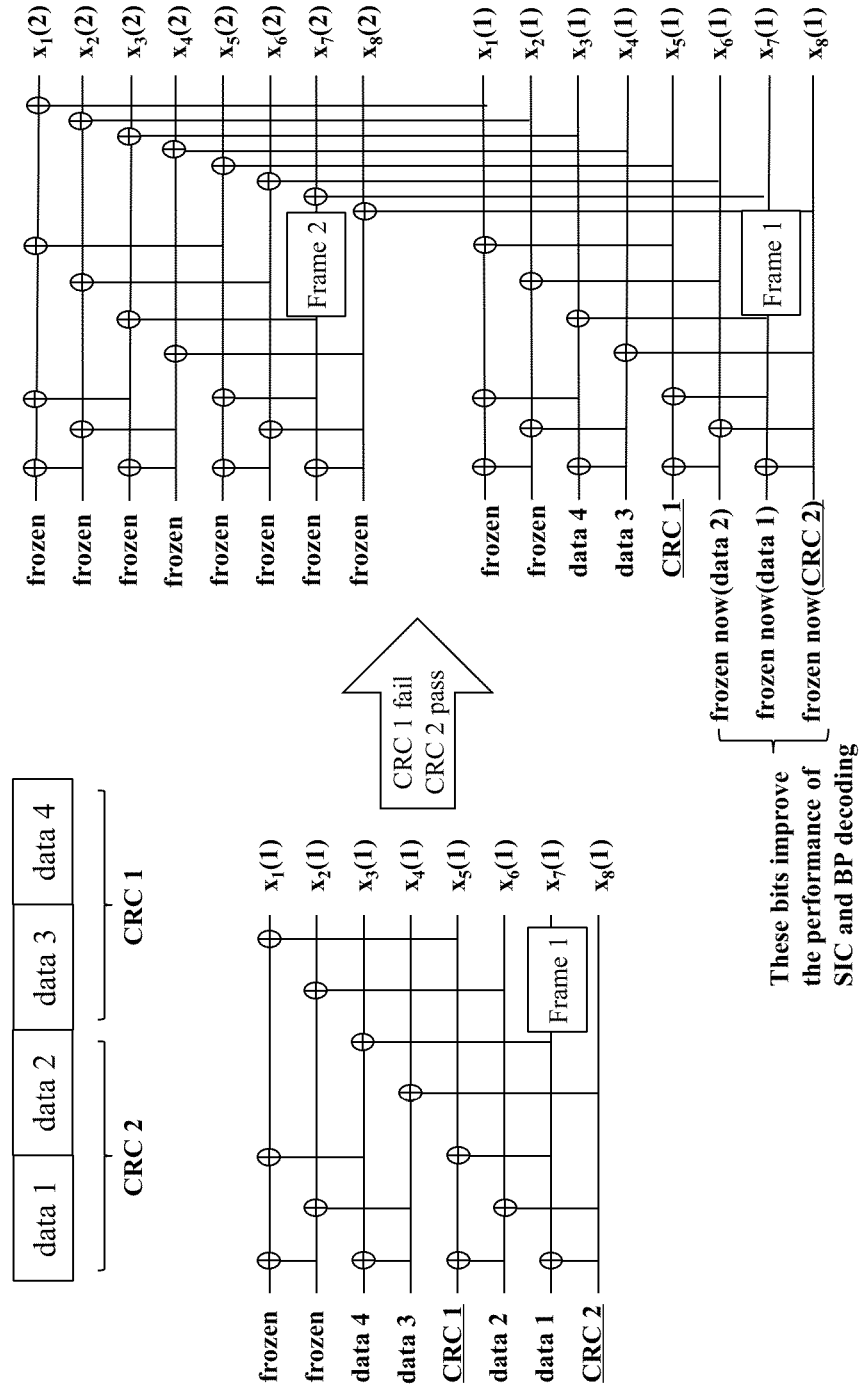
FIG. 15 is a diagram for explaining a HARQ method based on non-systematic polar coding combined with channel polarization maximization and selective retransmission for error pattern 3 according to the present disclosure.

FIG. 15 is a diagram for explaining a HARQ method based on non-systematic polar coding combined with channel polarization maximization and selective retransmission for error pattern 3 according to the present disclosure.

FIG. 15 shows a case in which a second information block (data 1 and data 2) of two information blocks is decoded with no errors, but an error occurs in a first information block (data 3 and data 4). This case may be defined as error pattern 3. The transmitter may equally perform retransmission for all of error patterns 1, 2, and 3. However, decoding at the receiver may vary for each case. For error pattern 3, when decoding polar codes, the receiver may perform the decoding by considering bits in the second information block as frozen bits. In this case, efficient decoding may be achieved. In the example of FIG. 15, the actual code rate becomes 3/16.

Figure 16:
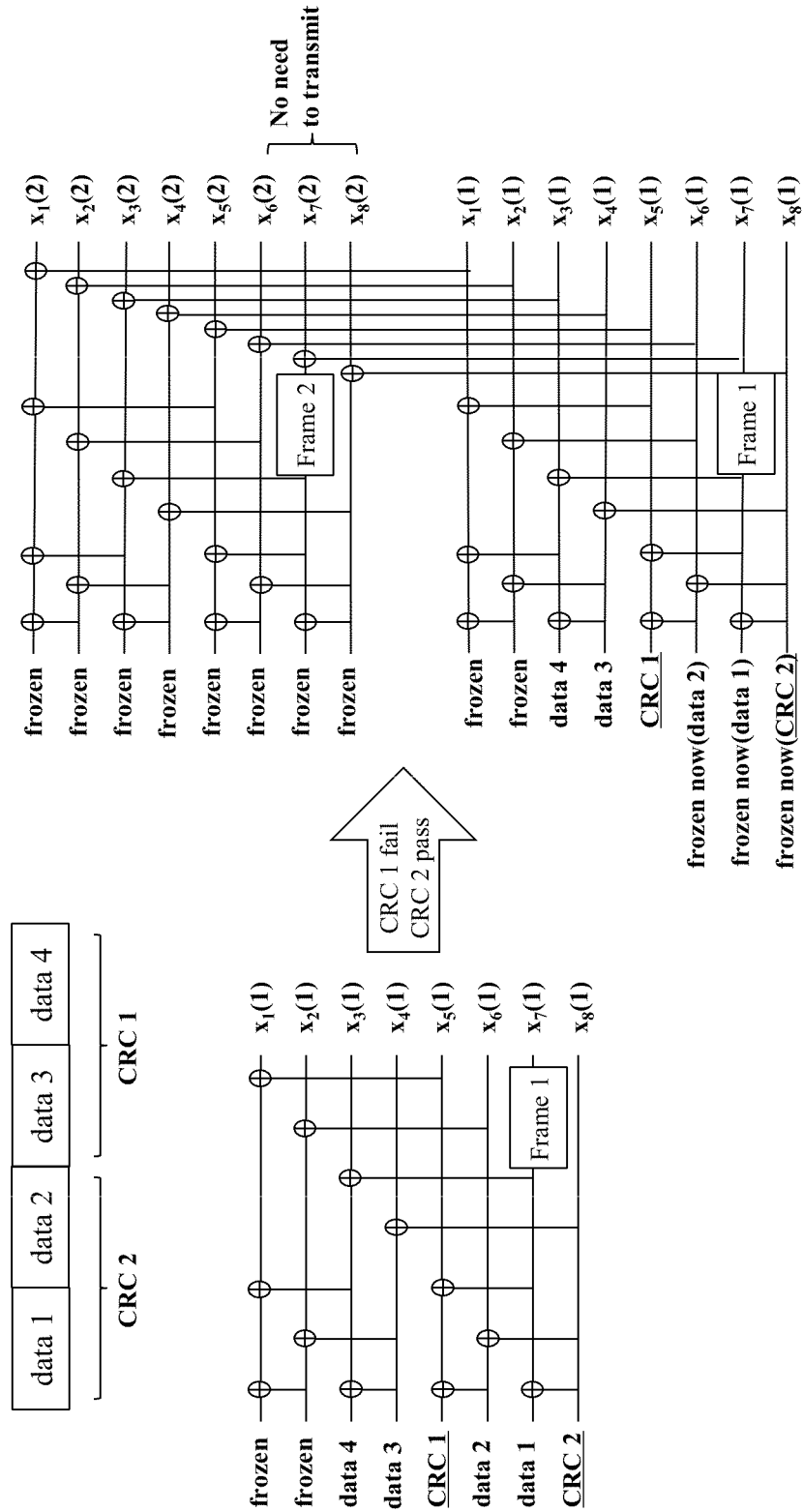
FIG. 16 is a diagram for explaining a HARQ method based on non-systematic polar coding combined with channel polarization maximization and selective retransmission when parts of a codeword known to a receiver are not transmitted according to the present disclosure.

FIG. 16 is a diagram for explaining a HARQ method based on non-systematic polar coding combined with channel polarization maximization and selective retransmission when parts of a codeword known to the receiver are not transmitted according to the present disclosure.

Specifically, FIG. 16 shows that the same performance is obtained when only parts of a codeword (frame 2) are transmitted during retransmission depending on the error pattern type according to the present disclosure. Since data 1, data 2, CRC 2, and input signals for polar coding are decoded with no errors, the receiver may accurately know these values. In this case, the receiver may accurately know $X_6(2)$, $X_7(2)$, and $X_8(2)$ in the codeword (frame 2), which are transmitted during the retransmission, due to the unique features of polar codes. Referring to FIG. F07, it may be seen that data $2=X_6(2)$, data $1=X_7(2)$, and CRC $2=X_8(2)$. Thus, the transmitter may not transmit the known bits in the codeword during the retransmission, and thus minimize use of channels. Referring to FIG. 16, since the receiver may know the values of $X_6(2)$, $X_7(2)$, and $X_8(2)$, $X_6(2)$, $X_7(2)$, and $X_8(2)$ may not be transmitted.

Codeword bits that do not need to be transmitted may be determined mathematically. Assuming that u is a vector of polar coding input bits, x is a codeword generated by polar coding, and G is a polar code generator matrix, Equation 7 may be established.

$$x = uG = [u_A \quad u_A c] \begin{bmatrix} G_A \\ G_{A^c} \end{bmatrix}$$
$$= u_A G_A + u_{A^c} G_{A^c}$$
$$\overset{(a)}{\Rightarrow} u_A G_A$$

[Equation 7]

In Equation 7, (a) is established when all frozen bits are given as 0 (i.e., $u_{A^c}=0$), where A is a set of bit indices representing information bits except the frozen bits among input bits. It is assumed that the transmitter divides the information bits ($u_A$) into two blocks, and $u_{A,1}$ and $u_{A,2}$ denote first and second input information bit vectors, respectively.

$$u_A = uG = [u_{A,1} \quad u_{A,2}] \begin{bmatrix} G_{A,11} & 0 \\ G_{A,21} & G_{A,22} \end{bmatrix}$$
$$= [u_{A,1} G_{A,11} + u_{A,2} G_{A,21}, u_{A,2} G_{A,22}]$$
$$= : [x_1, x_2]$$

[Equation 8]

Referring to FIG. 16, when CRC 2 is successfully checked, the receiver may accurately know $u_{A,2}$. Thus, the receiver may also know $u_{A,2} G_{A,22}$. In this case, the receiver may accurately know a vector of $x_2 = u_{A,2} G_{A,22}$, and thus codeword bits in the vector ($x_6(2)$, $x_7(2)$, $x_8(2)$) may not need to be transmitted.

Figure 17:
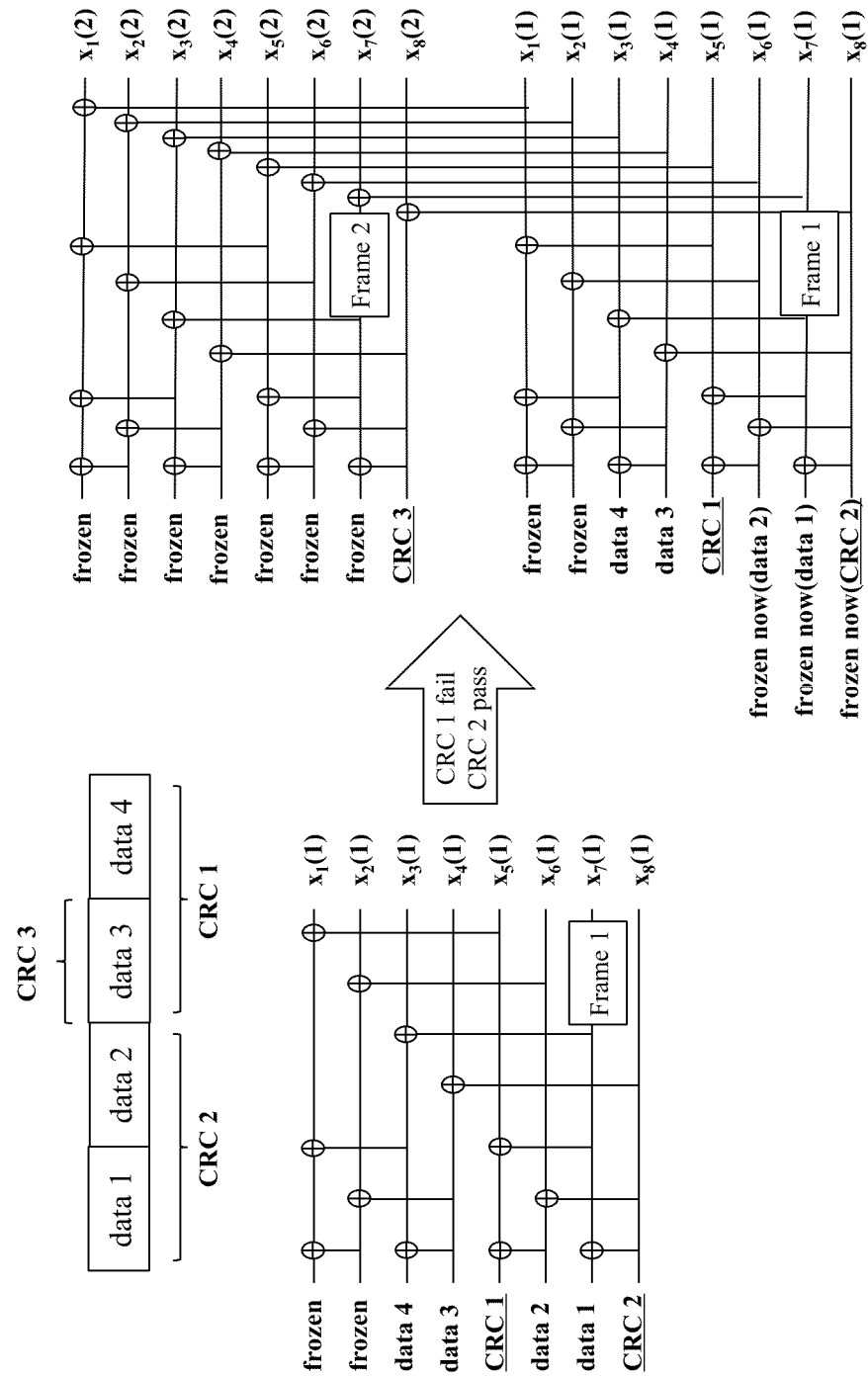
FIG. 17 is a diagram for explaining a HARQ method based on non-systematic polar coding combined with channel polarization maximization and selective retransmission when binary search is applied thereto according to the present disclosure.

FIG. 17 is a diagram for explaining a HARQ method based on non-systematic polar coding combined with channel polarization maximization and selective retransmission when binary search is applied thereto according to the present disclosure.

FIG. 17 shows a case in which the binary search is applied to the non-systematic polar coded HARQ combined with the channel polarization maximization and selective retransmission. In this case, the performance may be further improved.

Codeword bits corresponding to $x_2$ may not be transmitted as shown in FIG. 16. However, since the polar code block size N is fixed while the same transport block is processed, the coding rate may be reduced if successfully transmitted bits are not transmitted, and throughput may also decrease. In FIG. 17, a portion of frame 2 processed as frozen bits in FIG. 16 may be used as input bits for CRC 3. Since $x_8(2)$ does not need to be transmitted, CRC 3 may be additionally transmitted. That is, referring to FIG. 17, data 1, data 2, and CRC 2 of frame 1 may be processed as frozen bits, and CRC 3 may be added to frame 2. The performance may be improved if redundancy for data 3 is checked by adding CRC 3 to frame 2.

Although the above example shows that only 1-bit CRC 3 is added, it is apparent that CRC bits may be added to frame 2 as many as the number of frozen bits of frame 1. In FIG. 17, a maximum of three bits may be added. In addition to CRC bits, data bits may also be added to frame 2 as many as the number of frozen bits of frame 1. Typically, decoding reliability may be improved when unsuccessfully decoded bits are added.

Although FIG. 17 illustrates polar codes with a block size of 8, it is apparent that the technical features of the present disclosure are applicable to polar codes with a block size of N (=$2^n$). According to the present disclosure, the size of an information block may increase. To improve the reliability and integrity of decoding, a CRC larger than the information block may be added.

In the present disclosure, a method of transmitting, by an encoder, a signal based on polar coding is provided. The method may include: transmitting to a decoder a first frame including a plurality of information blocks and first CRCs for the plurality of information blocks; receiving from the decoder information about one or more unsuccessfully decoded information blocks among the plurality of information blocks included in the first frame; and transmitting a second frame generated based on the first frame and the information about the one or more unsuccessfully decoded information blocks.

In the present disclosure, a method of receiving, by a decoder, a signal based on polar coding is provided. The method may include: receiving from an encoder a first frame including a plurality of information blocks and first CRCs for the plurality of information blocks; transmitting to the encoder information about one or more unsuccessfully decoded information blocks among the plurality of information blocks included in the first frame; and receiving a second frame generated based on the first frame and the information about the one or more unsuccessfully decoded information blocks.

Whether the plurality of information blocks are successfully decoded may be confirmed by checking the first CRCs. The first frame may further include one or more frozen bits. The bit value of each frozen bit may be 0.

When bits of one or more successfully decoded information blocks among the plurality of information blocks included in the first frame are set as frozen bits, the second frame may be generated. Second CRCs may be included in input bits of the second frame corresponding to the bits of the one or more successfully decoded information blocks, which are set as the frozen bits. The second CRCs may be related to information sub-blocks obtained by segmenting the one or more unsuccessfully decoded information blocks. That is, the second CRCs may include CRC values for the information sub-blocks.

The input bits of the second frame may further include two or more bits in the one or more unsuccessfully decoded information blocks. That is, the second frame may include bits in the one or more unsuccessfully decoded information blocks at the locations of bits allocated to the one or more successfully decoded information blocks. Consequently, the second frame may repeat and include the bits in the one or more unsuccessfully decoded information blocks.

In the present disclosure, a method of transmitting, by an encoder, a signal based on polar coding is provided. The method may include: obtaining a first frame by applying the polar coding to a plurality of information blocks to which first CRCs are added; transmitting the first frame to a decoder; receiving from the decoder information about one or more successfully decoded information blocks among the plurality of information blocks; regenerating the plurality of information blocks by processing bits in the one or more successfully decoded information blocks among the plurality of information blocks as frozen bits; generating a second frame by applying the polar coding to the plurality of regenerated information blocks; concatenating the second frame with a third frame having the same size as the second frame; processing all input bits of the third frame as frozen bits; applying the polar coding to the third frame concatenated with the second frame; and transmitting the third frame to the decoder.

The third frame may further include second CRCs for one or more unsuccessfully decoded information blocks among the plurality of information blocks.

In the present disclosure, a method of receiving, by a decoder, a signal based on polar coding is provided. The method may include: receiving from an encoder a first frame obtained by applying the polar coding to a plurality of information blocks to which CRCs are added; confirming whether the plurality of information blocks are successfully decoded by checking the CRCs of the plurality; transmitting to the encoder information about one or more successfully decoded information blocks among the plurality of information blocks; receiving a second frame with the same size as the first frame; and decoding the second frame when bits in the one or more successfully decoded information blocks among the plurality of information blocks are processed as frozen bits.

The second frame may further include second CRCs for one or more unsuccessfully decoded information blocks among the plurality of information blocks.

Figure 18:
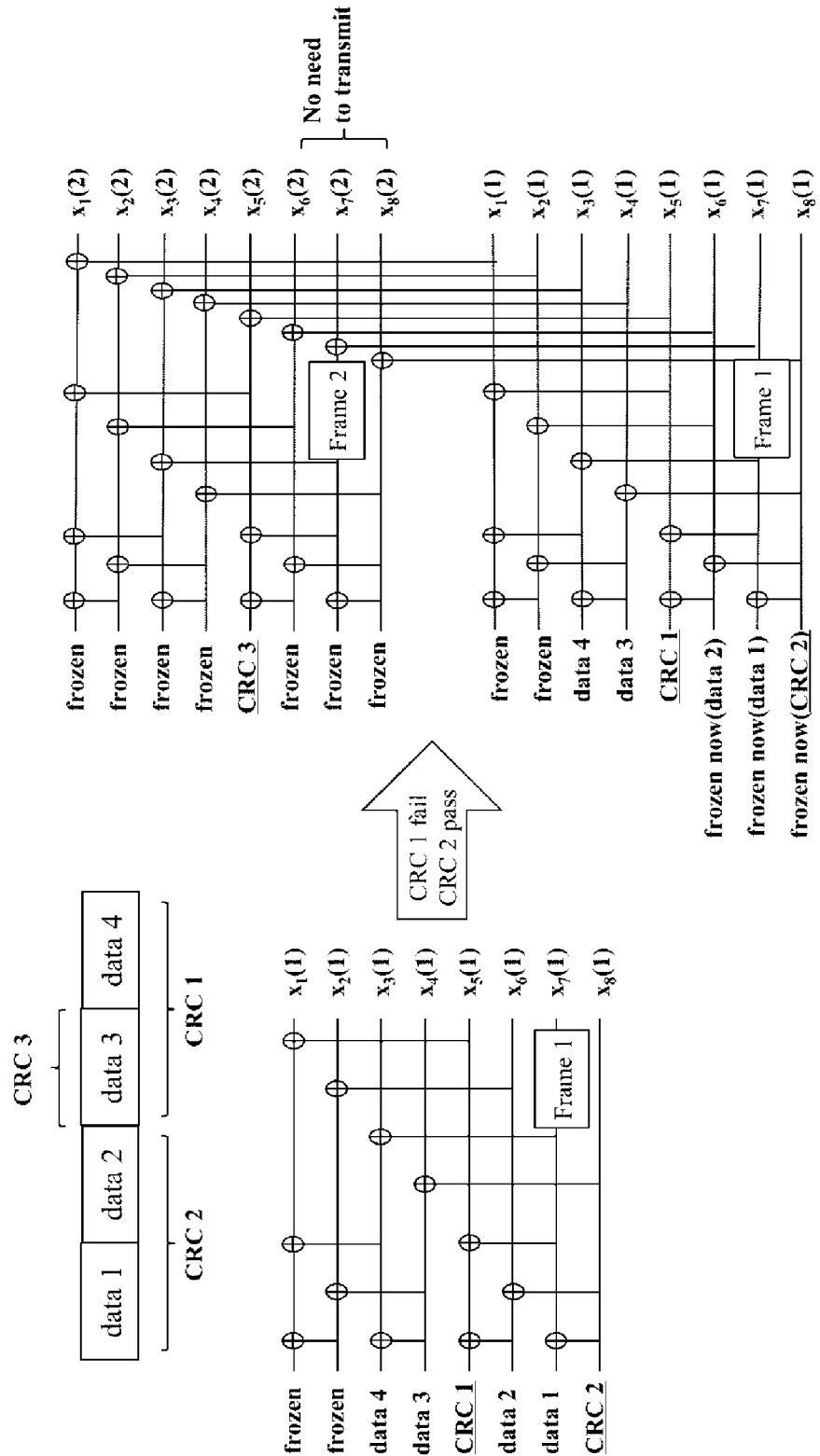
FIG. 18 is a diagram for explaining a HARQ method based on non-systematic polar coding combined with channel polarization maximization and selective retransmission when binary search is applied and known parts of a codeword are not transmitted according to the present disclosure.

FIG. 18 is a diagram for explaining a HARQ method based on non-systematic polar coding combined with channel polarization maximization and selective retransmission when binary search is applied and known parts of a codeword are not transmitted according to the present disclosure.

FIG. 18 shows a case in which the binary search is applied to the non-systematic polar coded HARQ combined with the channel polarization maximization and selective retransmission and bits known to the receiver among codeword bits are not transmitted during retransmission.

The method of FIG. 18 is different from that of FIG. 16 in that CRC 3 is additionally transmitted at the location of $u_5$. The two methods are similar in that $x_6$, $x_7$, and $x_8$ are not transmitted, but in the former, CRC 3 (CRC for data 3) is added at the location of $u_5$ of frame 2 to check redundancy for data 3, thereby improving the performance.

In the present disclosure, a method of transmitting, by an encoder, a signal based on polar coding is provided. The method may include: transmitting to a decoder, a first information block, a second information block, a first CRC for the first information block, and a second CRC for the second information block; receiving from the decoder information on whether the first information block is successfully decoded and information on whether the second information block is successfully decoded; and transmitting a first frame and a second frame, wherein the second frame is generated based on the information on whether the first information block is successfully decoded and the information on whether the second information block is successfully decoded.

In the present disclosure, a method of receiving, by a decoder, a signal based on polar coding is provided. The method may include: receiving from a encoder, a first information block, a second information block, a first CRC for the first information block, and a second CRC for the second information block; transmitting to the encoder information on whether the first information block is successfully decoded and information on whether the second information block is successfully decoded; and receiving a first frame and a second frame, wherein the second frame is generated based on the information on whether the first information block is successfully decoded and the information on whether the second information block is successfully decoded.

When one of the first and second information blocks is successfully decoded and the other one is unsuccessfully decoded, bits of the successfully decoded information block may be set as frozen bits, and only the successfully decoded information block may be retransmitted.

For example, when the first information block is successfully decoded and the second information block is unsuccessfully decoded, the second frame may be generated as follows: the second frame includes the second information block and the second CRC for the second information block, but the first information block and the first CRC for the first information block are set as frozen bits (bit values are 0).

The second information block may be segmented into a first information sub-block and a second information sub-block, and then a third CRC for the first information sub-block may be obtained.

The input value of the second frame, which corresponds to the bits set as the frozen bits, may be the third CRC.

Upon receiving the second frame, the decoder may obtain the second information block, second CRC, first information sub-block, third CRC, and second information sub-block based on the first information block and first CRC, which are previously obtained, and the second frame. The second information block may include the first and second information sub-blocks.

Whether the first and second information sub-blocks are successfully decoded may be confirmed based on the first information block, first CRC, second CRC, first information sub-block, third CRC, and second information sub-block.

When the decoder reports to the encoder that the first information sub-block is unsuccessfully decoded, the encoder may segment the first information sub-block into two information sub-blocks again, generate a new frame (e.g., third frame) that includes a fourth CRC for one information sub-block, and then transmit the new frame to the decoder.

Whenever the encoder fails to decode an information block, the encoder may segment the information block into two information sub-blocks, add a CRC for one of the two segmented information sub-blocks, and then perform transmission so that the decoder may know an unsuccessfully decoded portion more accurately.

Figure 19:
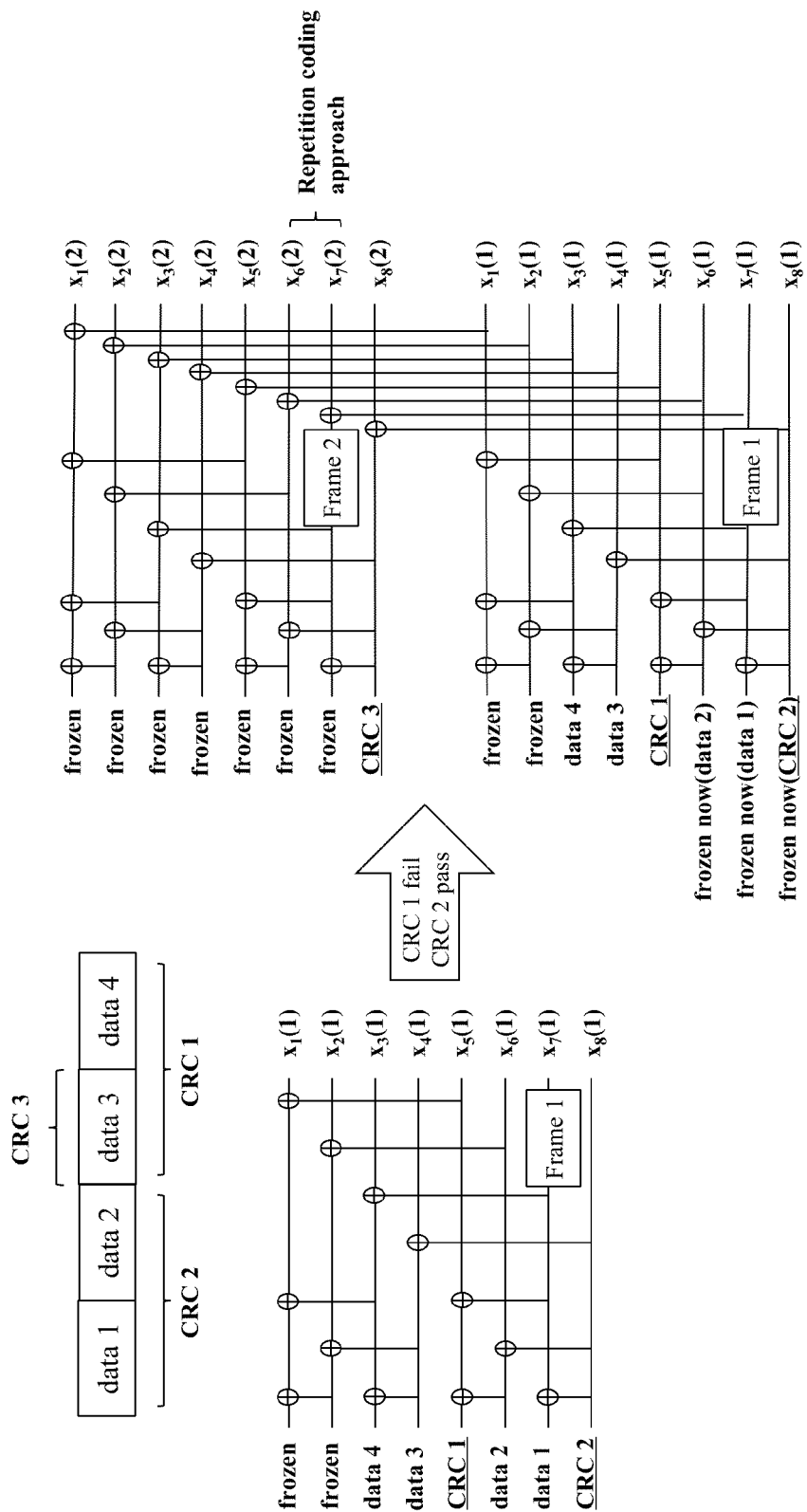
FIG. 19 is a diagram for explaining a HARQ method based on non-systematic polar coding combined with channel polarization maximization and selective retransmission when binary search and repetition coding are applied according to the present disclosure.

FIG. 19 is a diagram for explaining a HARQ method based on non-systematic polar coding combined with channel polarization maximization and selective retransmission when binary search and repetition coding are applied according to the present disclosure.

Referring to FIG. 19, the binary search is applied to the non-systematic polar coded HARQ combined with the channel polarization maximization and selective retransmission, and unsuccessfully decoded bits in initial transmission are transmitted during retransmission by applying the repetition coding. This method may further improve the success probability of decoding.

As shown in the example of FIG. 18, CRC 3 is included at the location of $u_8$ of frame 2 (see FIGS. 7A and 9A). If data 3 and data 4 are allocated at the locations of $u_6$ and $u_7$ (see FIGS. 7A and 9A), repeated transmission may improve the decoding reliability.

Figure 20:
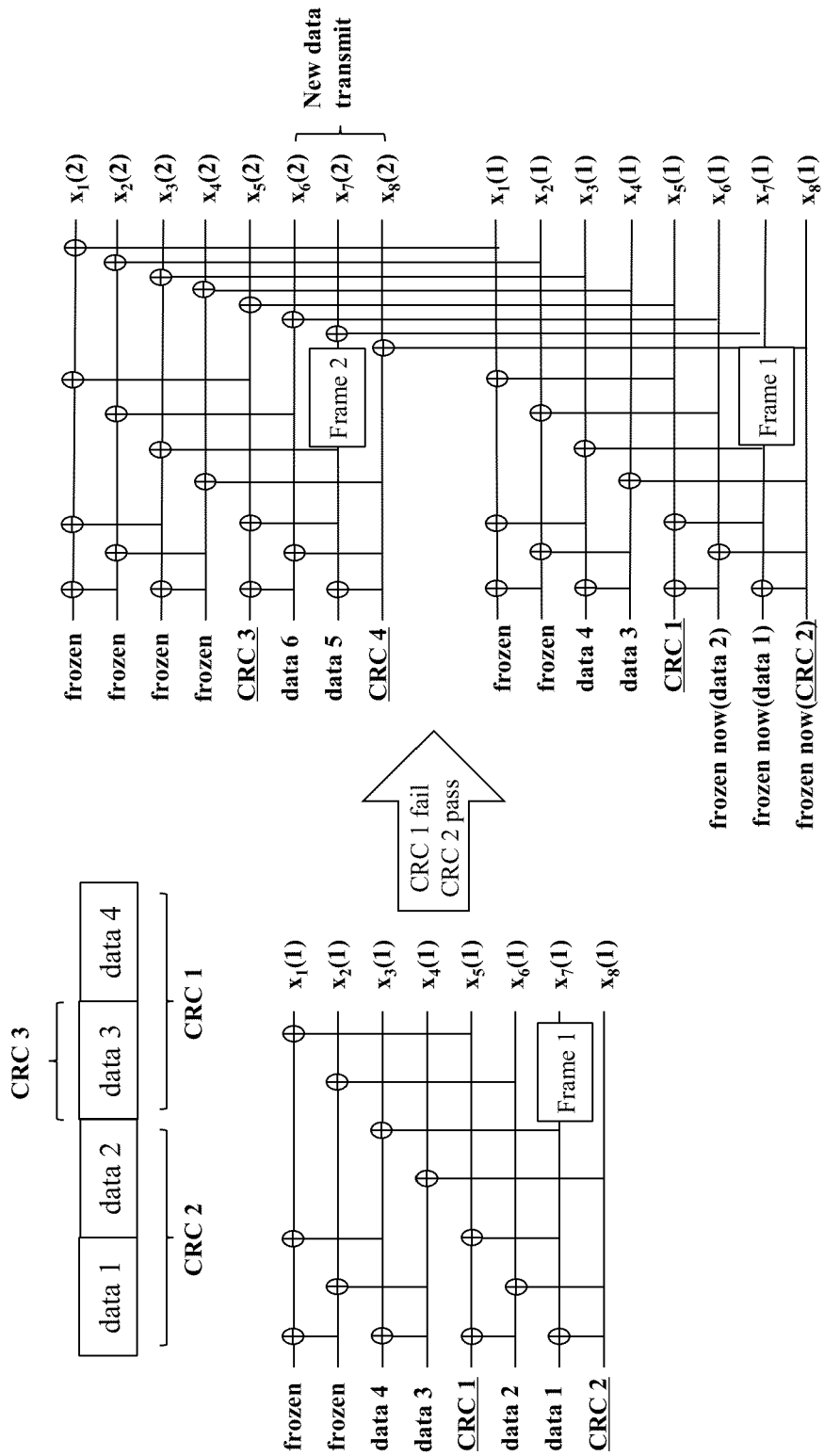
FIG. 20 is a diagram for explaining a HARQ method based on non-systematic polar coding combined with channel polarization maximization and selective retransmission when binary search is applied and new data is transmitted during retransmission according to the present disclosure.

FIG. 20 is a diagram for explaining a HARQ method based on non-systematic polar coding combined with channel polarization maximization and selective retransmission when binary search is applied and new data is transmitted during retransmission according to the present disclosure.

Referring to FIG. 20, the binary search is applied to the non-systematic polar coded HARQ combined with the channel polarization maximization and selective retransmission, and new data is transmitted during the retransmission. This method may not be classified as the HARQ method because new data is transmitted during the retransmission. However, the method may not only improve the reliability of bits unsuccessfully decoded during initial transmission through the retransmission but also enhance the overall information throughput by transmitting the new data.

1.3 Systematic Polar Code

Hereinabove, enhanced polar coded HARQ methods based on non-systematic polar codes have been described. In the following, methods based on systematic polar codes will be described with reference to the above-described methods using non-systematic polar codes.

Figure 21:
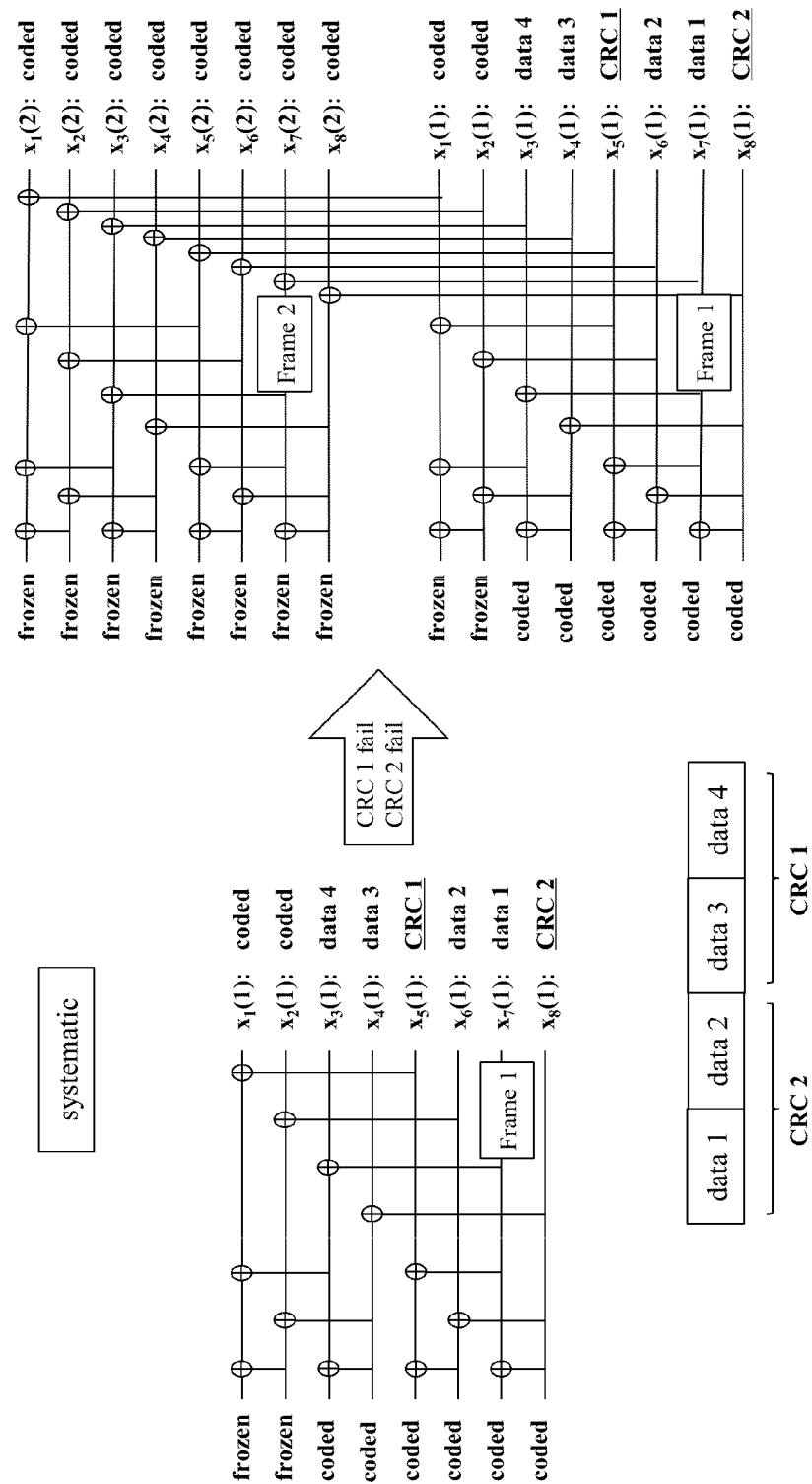
FIG. 21 is a diagram for explaining a HARQ method based on systematic polar coding combined with channel polarization maximization and selective retransmission for error pattern 1 according to the present disclosure.

FIG. 21 is a diagram for explaining a HARQ method based on systematic polar coding combined with channel polarization maximization and selective retransmission for error pattern 1 according to the present disclosure.

Error pattern 1 refers to a case in which errors occur in two information blocks (two CRC checks fails).

FIG. 21 shows a case of applying the non-systematic polar code transmission method of FIG. 13 to systematic polar codes.

In non-systematic polar coding, since coded data contains no raw information block data unlike LDPC and turbo coding, decoding needs to be performed to obtain the raw information block data. That is, in the LDCP and turbo coding, since a systematic sequence having the same bit values as raw information block data is generally included in coded data (this may be distorted or damaged by interference during transmission and reception), a soft estimation value may be easily calculated. However, decoding must be performed in the non-systematic polar coding.

To overcome such a disadvantage, systematic polar coding has been proposed. In the systematic polar coding, the above-described polar code generator matrix is used as it is, but input data is generated such that raw data in an information block is included in coded data. According to above equations, an output vector x and an input vector u satisfy Equation 9.

$$x = uG \qquad \text{[Equation 9]}$$

Referring to FIG. 21, assuming that $x_3(1)$ to $x_8(1)$ correspond to data 4, data 3, CRC 1, data 2, data 1, and CRC 2, two bits of u which are not equivalent to data 4, data 3, CRC 1, data 2, data 1, and CRC 2 are frozen bits, new x' and new u' may be given as follows: x'=(coded, coded, data 4, data 3, CRC 1, data 2, data 1, CRC 2) and u'=(frozen, frozen, coded, coded, coded, coded, coded, coded).

By doing so, Equation 10 is established.

$$x' = u'G \qquad \text{[Equation 10]}$$

In this case, u' may be computed according to Equation 10.

The input vector u may be determined to satisfy $x_1(1)=0$ and $x_2(1)=0$. In this case, frozen bits of the input vector may be coded. That is, $u = x \, G^{\wedge}(-1)$ is satisfied. Since the inverse matrix of the generator matrix is easily computed, u may be easily obtained. When $x_1(1)=0$ and $x_2(1)=0$ are confirmed, whether decoding is required may be anticipated from a soft value. However, this method may not be desirable in terms of channel estimation because decoding values are fixed as follows: $x_1(1)=0$, $x_2(1)=0$.

In FIG. 21, when both information block 1 (data 4, data 3, and CRC 1) and information block 2 (data 2, data 1, and CRC 2) are unsuccessfully decoded, frame 2 may transmitted. Alternatively, the decoding reliability may be improved by transmitting both frames 1 and 2.

Further, the channel polarization may be maximized by changing the connection relationship between frames 1 and 2, unlike FIG. 21. The locations of CRCs and data bits may be determined based on channel states.

The computational complexity of the systematic polar coding may increase in that polar coding operation needs to be performed twice in terms of encoding, compared to the non-systematic polar coding. However, regarding decoding, since the soft value is capable of being used as the estimate of raw data, early termination is enabled.

Figure 22:
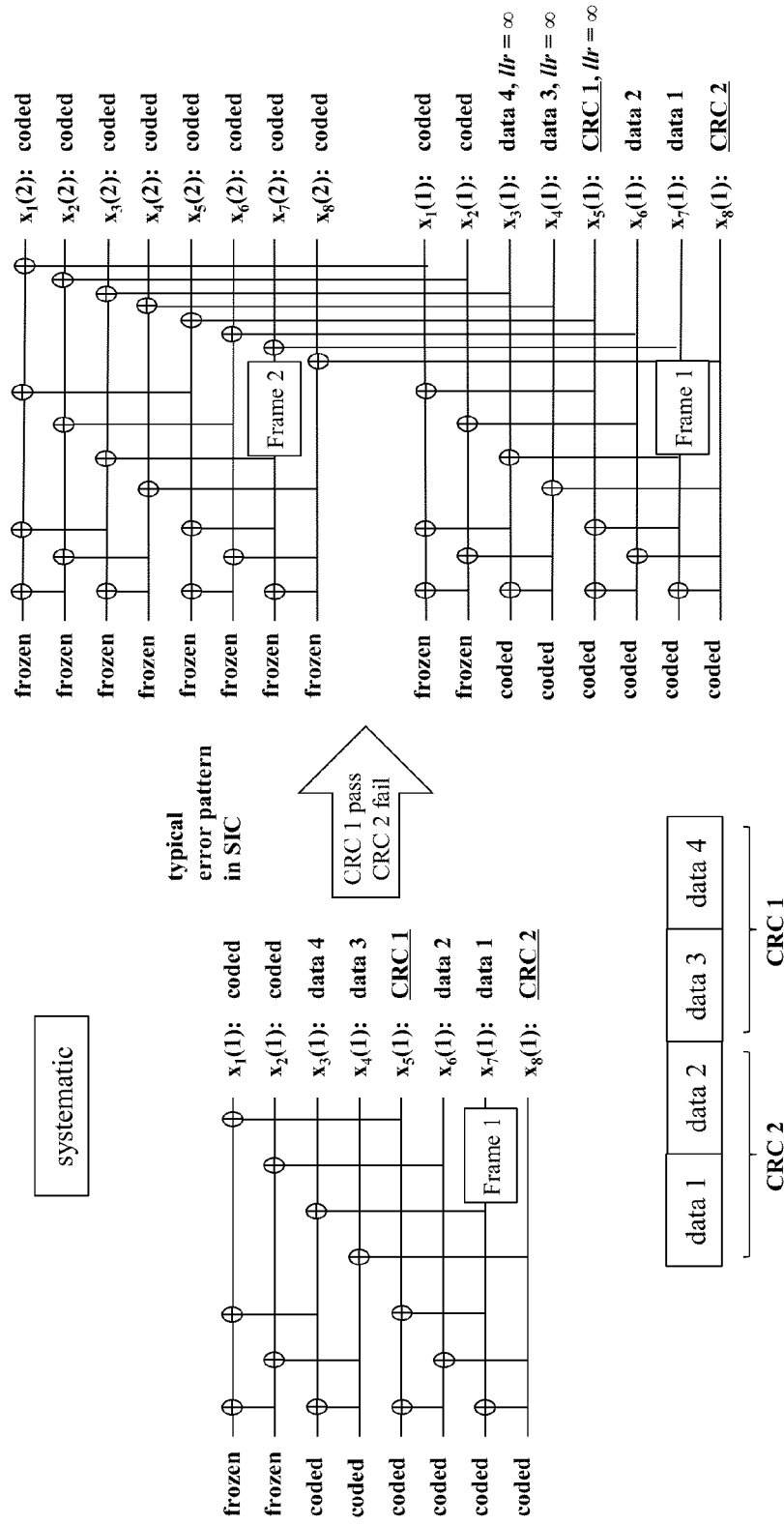
FIG. 22 is a diagram for explaining a HARQ method based on systematic polar coding combined with channel polarization maximization and selective retransmission for error pattern 2 according to the present disclosure.

FIG. 22 is a diagram for explaining a HARQ method based on systematic polar coding combined with channel polarization maximization and selective retransmission for error pattern 2 according to the present disclosure.

Error pattern 2 means a case in which a first information block (data 4, data 3, and CRC 1) of two information blocks is successfully decoded, but a second information block (data 2, data 1, and CRC 2) is not successfully decoded.

FIG. 22 shows a case of applying the non-systematic polar code transmission method of FIG. 14 to systematic polar codes. In the non-systematic polar codes, decoding is performed by setting bits known to the receiver as frozen bits. In the systematic polar codes, since bits known to the receiver are parts of received codeword bits, decoding may be performed by setting the LLR values of the known codeword bits to infinite.

Referring to FIG. 22, since the first block is successfully decoded, decoding may be performed by setting the LLR values of $x_3(1)$, $x_4(1)$, and $x_5(1)$ to infinite.

Figure 23:
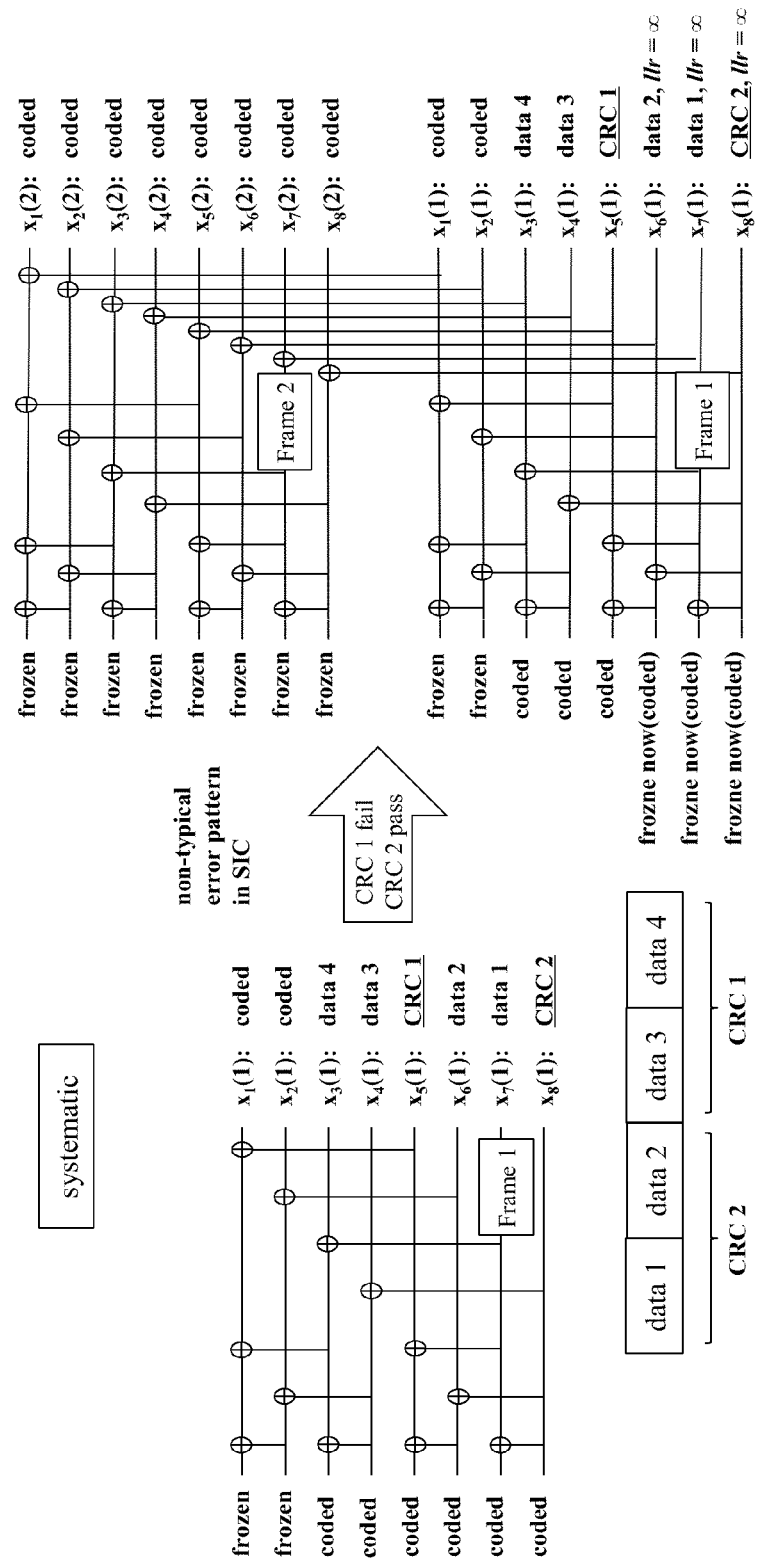
FIG. 23 is a diagram for explaining a HARQ method based on systematic polar coding combined with channel polarization maximization and selective retransmission for error pattern 3 according to the present disclosure.

FIG. 23 is a diagram for explaining a HARQ method based on systematic polar coding combined with channel polarization maximization and selective retransmission for error pattern 3 according to the present disclosure.

FIG. 23 shows a case of applying the non-systematic polar code transmission method of FIG. 15 to systematic polar codes. In the systematic polar codes shown in FIG. F13, since bits known to the receiver are parts of received codeword bits, decoding may be performed by setting the LLR values of the known codeword bits to infinite.

In FIG. 23, since the second block is successfully decoded as in FIG. 22, decoding may be performed by setting the LLR values of $x_6(1)$, $x_7(1)$, and $x_8(1)$ to infinite.

Figure 24:
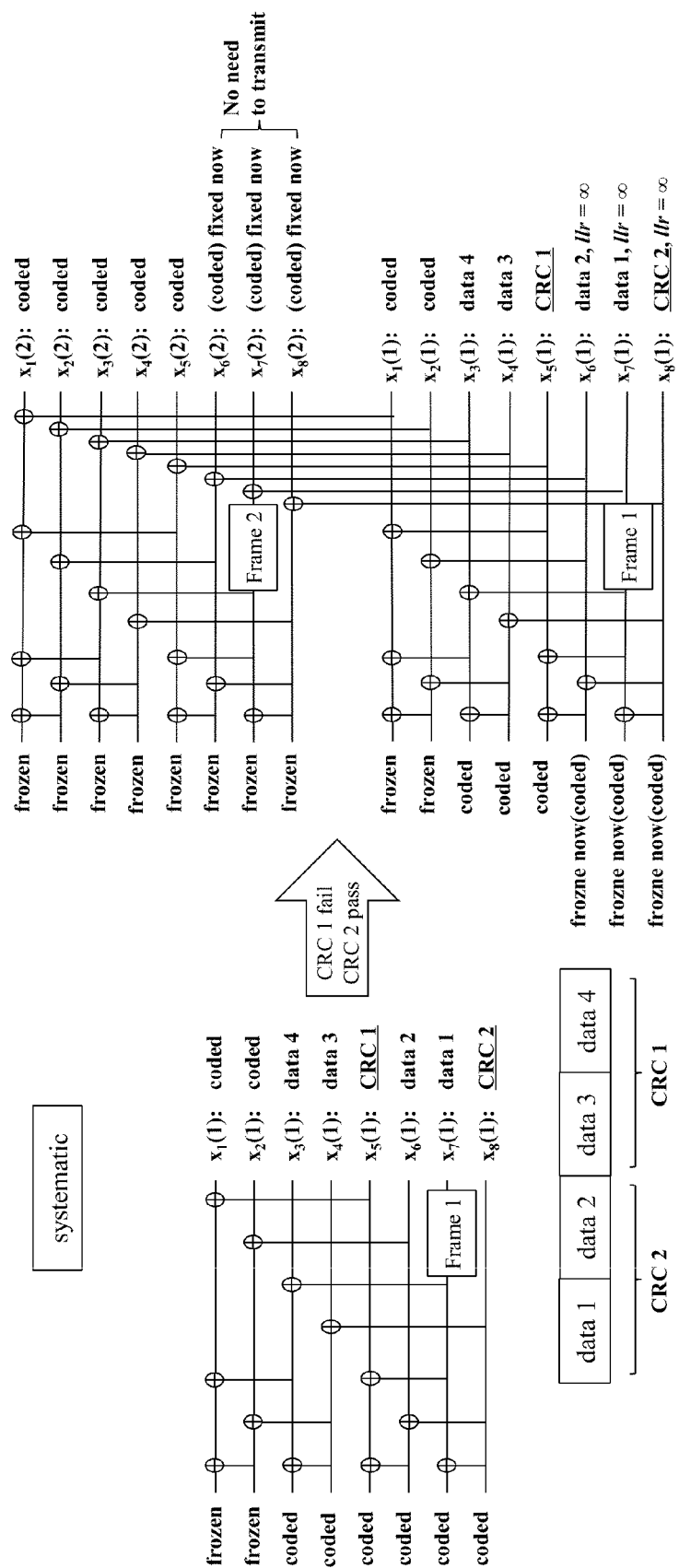
FIG. 24 is a diagram for explaining a HARQ method based on systematic polar coding combined with channel polarization maximization and selective retransmission when parts of a codeword known to a receiver are not transmitted according to the present disclosure.

FIG. 24 is a diagram for explaining a HARQ method based on systematic polar coding combined with channel polarization maximization and selective retransmission when parts of a codeword known to the receiver are not transmitted according to the present disclosure.

FIG. 24 shows a case of applying the non-systematic polar code transmission method of FIG. 16 to systematic polar codes. In the systematic polar codes, parts of a codeword may be known to the receiver, and such bits are not transmitted to the transmitter during retransmission. In this case, the codeword bits which may not need to be transmitted may be mathematically determined as follows. Equation 11 is established for the systematic polar codes.

$$u_A = (x_A - u_{A^c} G_{A^c A})(G_{AA})^{-1}$$

$$\stackrel{(a)}{\Rightarrow} x_A (G_{AA})^{-1}$$

[Equation 11]

In Equation 11, (a) is established when all frozen bits are given as 0 (i.e., $u_{A^c}=0$), and $(G_{AA})^{-1}$ is a lower triangular matrix. Assuming that $x_{A,1}$ and $x_{A,2}$ are a first group of transmitted information bits and a second group of transmitted information bits, Equation 12 is established.

$$u_A = [x_{A,1} \quad x_{A,2}] \begin{bmatrix} B_{11} & 0 \\ B_{21} & B_{22} \end{bmatrix}$$

$$= [x_{A,1}B_{11} + x_{A,2}B_{21}, x_{A,2}B_{22}]$$

$$= : [u_{A,1}, u_{A,2}]$$

[Equation 12]

When CRC 2 is successfully checked, $x_{A,2}$ ($x_6(1)$, $x_7(1)$, and $x_8(1)$) is known to the receiver. This may be interpreted to mean that $u_{A,2}$ ($u_6(1)$, $u_7(1)$, and $u_8(1)$) is known to the receiver. Referring to FIGS. 3 and 5 for the non-systematic polar codes, since codeword bits included in the vector $u_{A,2}G_{A,22}$ ($x_6(1)$, $x_7(1)$, and $x_8(1)$) are already known to the receiver, these bits may not need to be transmitted. Since $x_6(1)$, $x_7(1)$, and $x_8(1)$ of frame 1 are connected to $x_6(2)$, $x_7(2)$, and $x_8(2)$ of frame 2, respectively, $x_6(2)$, $x_7(2)$, and $x_8(2)$ may not be transmitted.

Figure 25:
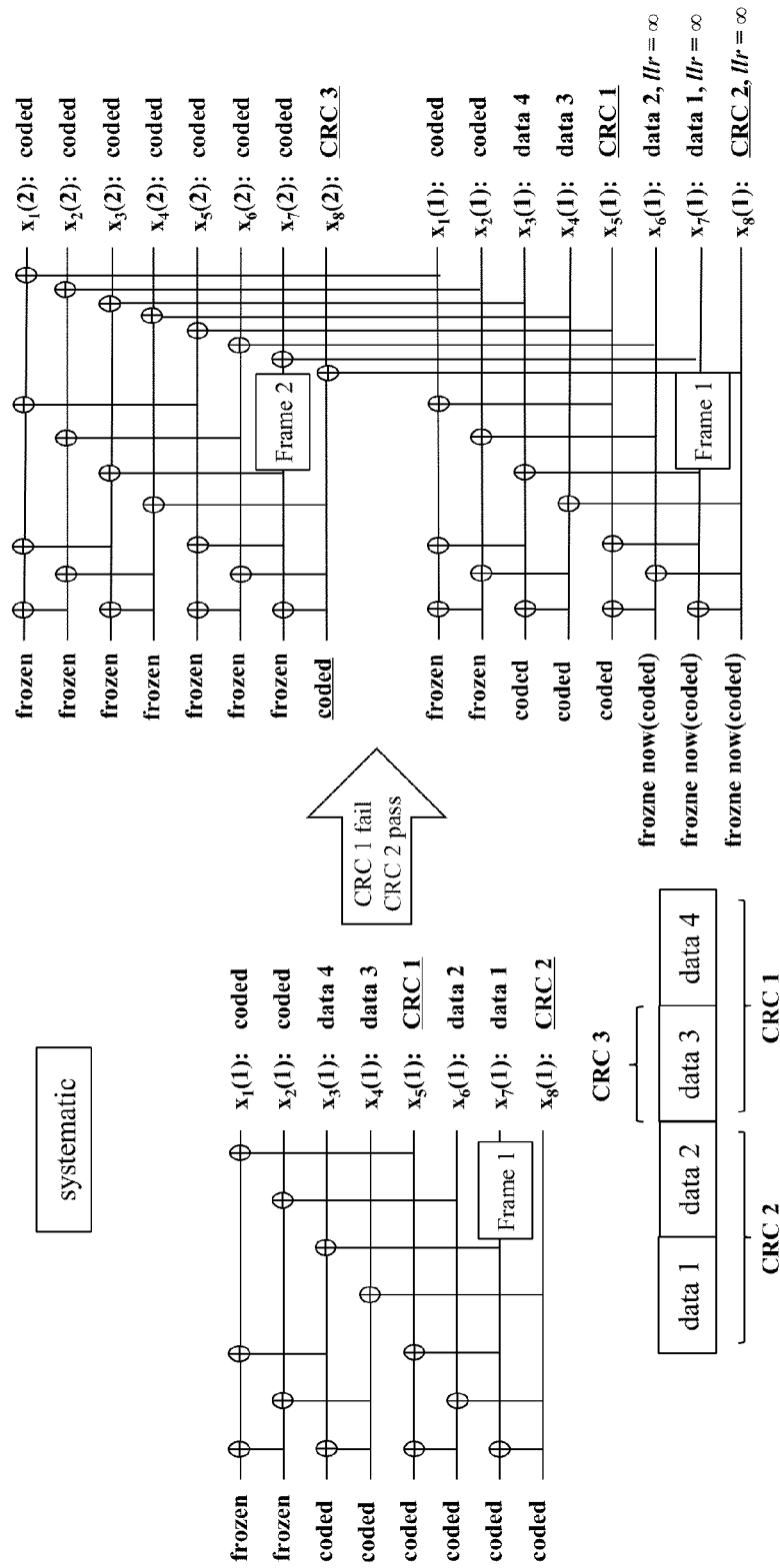
FIG. 25 is a diagram for explaining a HARQ method based on systematic polar coding combined with channel polarization maximization and selective retransmission when binary search is applied thereto according to the present disclosure.

FIG. 25 is a diagram for explaining a HARQ method based on systematic polar coding combined with channel polarization maximization and selective retransmission when binary search is applied thereto according to the present disclosure.

FIG. 25 shows a case of applying the non-systematic polar code transmission method of FIG. 17 to systematic polar codes.

Codeword bits corresponding to the vector $x_{A,2}$ may not be transmitted as in FIG. 24. However, since the polar code block size N is fixed while the same transport block is processed, the coding rate may be reduced if successfully transmitted bits are not transmitted, and throughput may also decrease. In FIG. 25, a portion of frame 2 processed as frozen bits in FIG. 24 may be used as coded bits so that corresponding output bits may become CRC 3. In FIG. 25, since $x_8(2)$ may be processed as non-transmitted bits, CRC 3 may be additionally transmitted by allocating coded bits at the location of $u_8$. As shown in FIG. 25, CRC 3 may refer to a CRC for data 3. That is, referring to FIG. 25, coded bits at the locations of $u_6$, $u_7$, and $u_8$ of frame 1 may be processed as frozen bits, and CRC 3 may be added to frame 2. The performance may be improved if redundancy for data 3 is checked by adding CRC 3 to frame 2.

Although FIG. 25 shows that 1-bit CRC 3 is added to frame 2, it is apparent that CRC bits may be added to frame 2 as many as the number of frozen bits of frame 1. In FIG. 25, a maximum of three bits may be added. In addition to CRC bits, data bits may also be added to frame 2 as many as the number of frozen bits of frame 1. For example, when data 4 and data 3 are allocated at the locations of $u_7$ and $u_8$ of frame 2, the decoding reliability of data 4 and data 3 may be improved. That is, the decoding reliability may be improved when unsuccessfully decoded bits are repeatedly input.

Although FIG. 25 illustrates polar codes with a block size of 8, it is apparent that the technical features of the present disclosure are applicable to polar codes with a block size of N (=$2^n$). The size of the information block may increase. To improve the reliability and integrity of decoding, a CRC larger than the information block may be added.

In the present disclosure, a method of transmitting, by an encoder, a signal based on polar coding is provided. The method may include: transmitting to a decoder a first frame including a plurality of information blocks and first CRCs for the plurality of information blocks, wherein the first frame includes output bits of a systematic polar code; receiving from the decoder information about one or more unsuccessfully decoded information blocks among the plurality of information blocks included in the first frame; and transmitting a second frame generated based on the first frame and the information about the one or more unsuccessfully decoded information blocks, wherein the second frame includes output bits of a systematic polar code.

In the present disclosure, a method of receiving, by a decoder, a signal based on polar coding is provided. The method may include: receiving from an encoder a first frame including a plurality of information blocks and first CRCs for the plurality of information blocks; transmitting to the encoder information about one or more unsuccessfully decoded information blocks among the plurality of information blocks included in the first frame; and receiving a second frame generated based on the first frame and the information about the one or more unsuccessfully decoded information blocks.

The first and second frames may include output bits of systematic polar codes.

Whether the plurality of information blocks are successfully decoded may be confirmed by checking the first CRCs. The first frame may further include one or more frozen bits. The bit value of each frozen bit may be 0.

When bits of one or more successfully decoded information blocks among the plurality of information blocks included in the first frame are set as frozen bits, the second frame may be generated. Second CRCs may be included in input bits of the second frame corresponding to the bits of the one or more successfully decoded information blocks, which are set as the frozen bits. The second CRCs may correspond to information sub-blocks obtained by segmenting the one or more unsuccessfully decoded information blocks. That is, the second CRCs may include CRC values for the information sub-blocks.

The input bits of the second frame may further include two or more bits in the one or more unsuccessfully decoded information blocks. That is, the second frame may include bits in the one or more unsuccessfully decoded information blocks at the locations of bits allocated to the one or more successfully decoded information blocks. Consequently, the second frame may repeat and include the bits in the one or more unsuccessfully decoded information blocks.

In the present disclosure, a method of transmitting, by an encoder, a signal based on polar coding is provided. The method may include: obtaining a first frame by applying the polar coding to a plurality of information blocks to which first CRCs are added; transmitting the first frame to a decoder; receiving from the decoder information about one or more successfully decoded information blocks among the plurality of information blocks; regenerating the plurality of information blocks by processing bits in the one or more successfully decoded information blocks among the plurality of information blocks as frozen bits; generating a second frame by applying the polar coding to the plurality of regenerated information blocks; concatenating the second frame with a third frame having the same size as the second frame; processing all input bits of the third frame as frozen bits; applying the polar coding to the third frame concatenated with the second frame; and transmitting the third frame to the decoder.

The third frame may further include second CRCs for one or more unsuccessfully decoded information blocks among the plurality of information blocks.

In the present disclosure, a method of receiving, by a decoder, a signal based on polar coding is provided. The method may include: receiving from an encoder a first frame obtained by applying the polar coding to a plurality of information blocks to which CRCs are added; confirming whether the plurality of information blocks are successfully decoded by checking the CRCs of the plurality; transmitting to the encoder information about one or more successfully decoded information blocks among the plurality of information blocks; receiving a second frame with the same size as the first frame; and decoding the second frame when bits in the one or more successfully decoded information blocks among the plurality of information blocks are processed as frozen bits.

The second frame may further include second CRCs for one or more unsuccessfully decoded information blocks among the plurality of information blocks.

Figure 26:
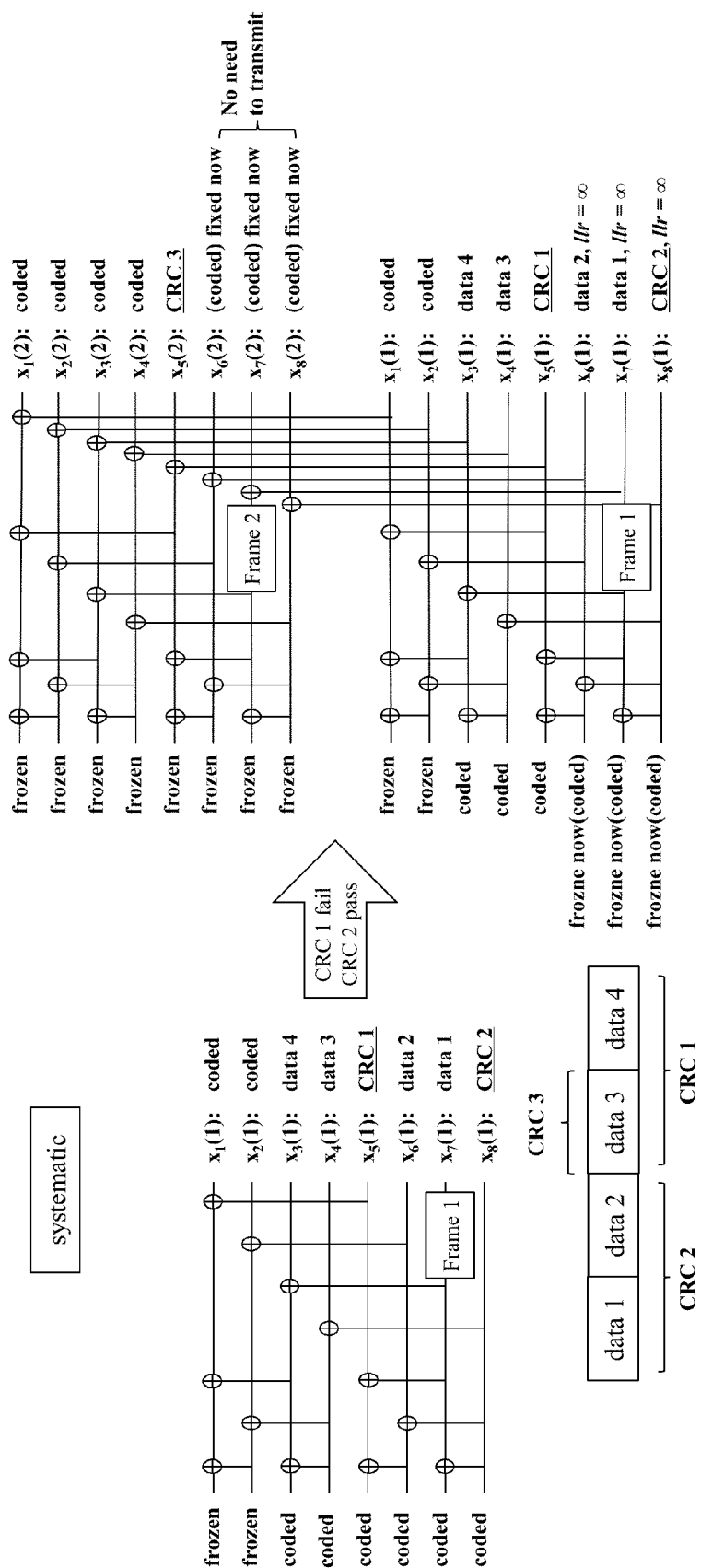
FIG. 26 is a diagram for explaining a HARQ method based on systematic polar coding combined with channel polarization maximization and selective retransmission when binary search is applied and known parts of a codeword are not transmitted according to the present disclosure.

FIG. 26 is a diagram for explaining a HARQ method based on systematic polar coding combined with channel polarization maximization and selective retransmission when binary search is applied and known parts of a codeword are not transmitted according to the present disclosure.

FIG. 26 shows a case of applying the non-systematic polar code transmission method of FIG. 18 to systematic polar codes.

The method of FIG. 26 is different from that of FIG. 24 in that CRC 3 is additionally transmitted at the location of $x_5$ of frame 2. The two methods are similar in that $x_6$, $x_7$, and $x_8$ are not transmitted, but in the former, CRC 3 (CRC for data 3) is added at the location of $x_5$ of frame 2 to check redundancy for data 3, thereby improving the performance.

Figure 27:
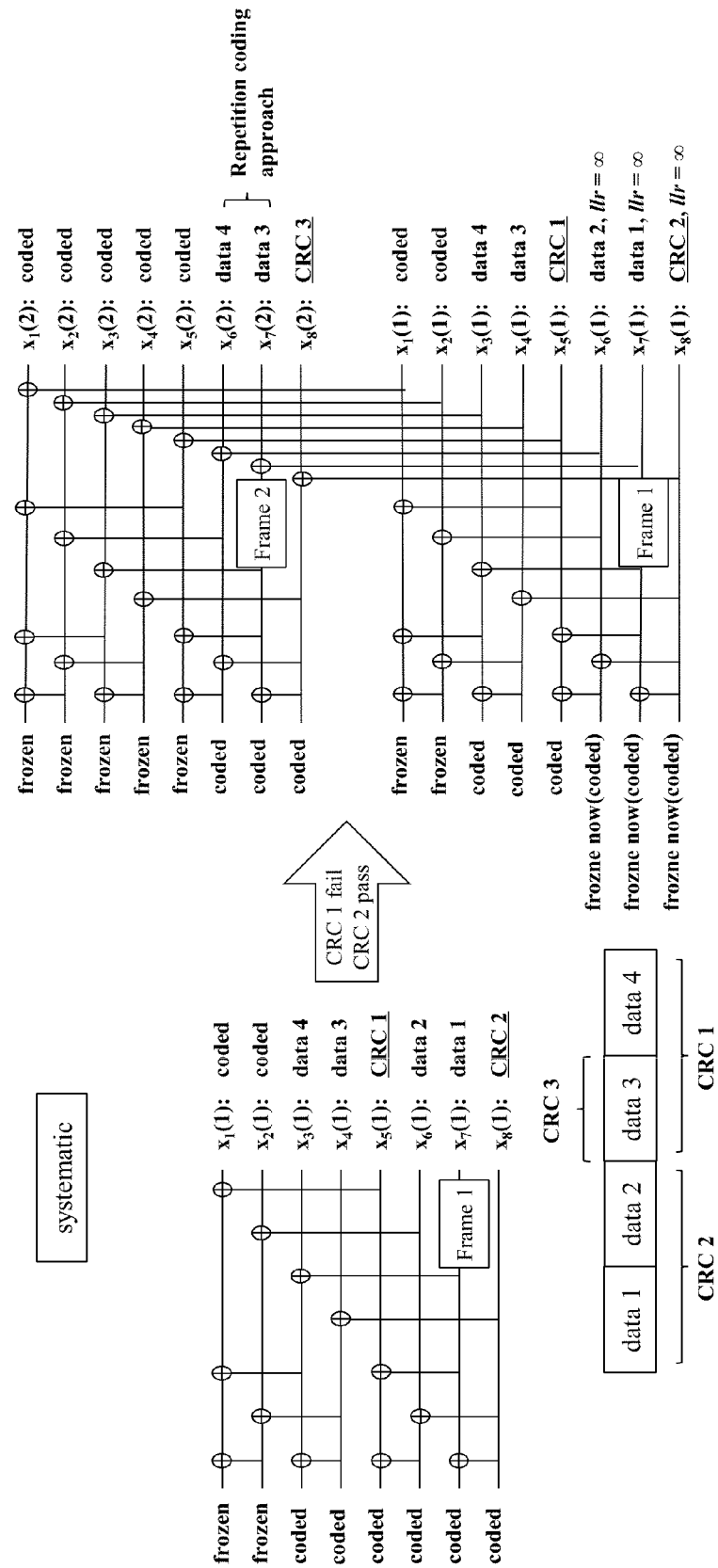
FIG. 27 is a diagram for explaining a HARQ method based on systematic polar coding combined with channel polarization maximization and selective retransmission when binary search and repetition coding are applied according to the present disclosure.

FIG. 27 is a diagram for explaining a HARQ method based on systematic polar coding combined with channel polarization maximization and selective retransmission when binary search and repetition coding are applied according to the present disclosure.

FIG. 27 shows a case of applying the non-systematic polar code transmission method of FIG. 19 to systematic polar codes.

Figure 28:
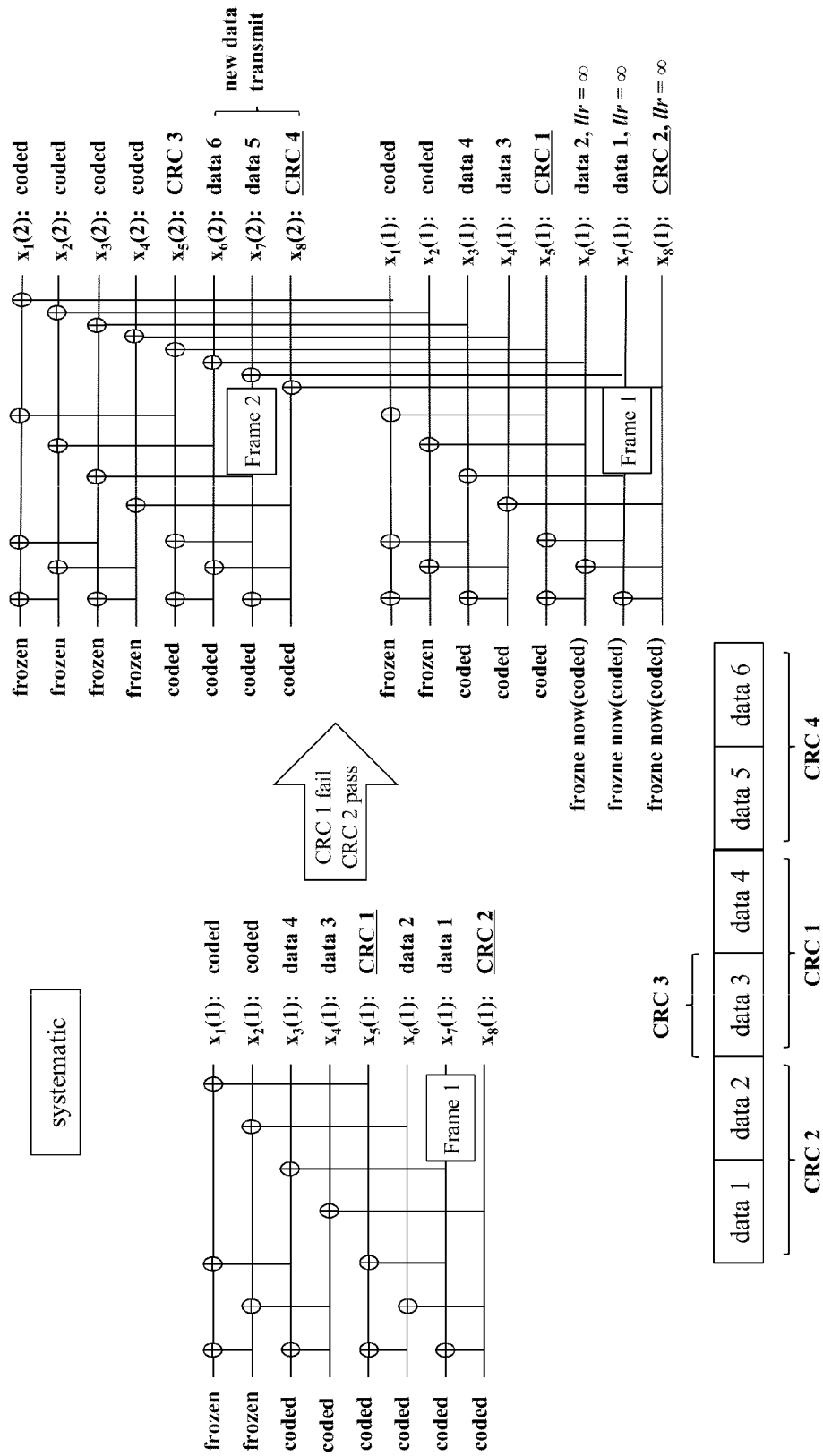
FIG. 28 is a diagram for explaining a HARQ method based on systematic polar coding combined with channel polarization maximization and selective retransmission when binary search is applied and new data is transmitted during retransmission according to the present disclosure.

FIG. 28 is a diagram for explaining a HARQ method based on systematic polar coding combined with channel polarization maximization and selective retransmission when binary search is applied and new data is transmitted during retransmission according to the present disclosure.

FIG. 28 shows a case of applying the non-systematic polar code transmission method of FIG. 20 to systematic polar codes.

2. Combination of Polar Code and Channel Measurement 2.1 Combination of Systematic Polar Code and Channel Measurement In general, it is assumed that a receiver has accurate channel information. However, in real environments, the receiver needs to perform channel estimation and thus uses a number of pilot signal for accurate channel estimation. In particular, when the number of antennas increases or the channel environment rapidly changes, the number of required pilot signals may increase. Since the use of many pilot signals may decrease the amount of data transfer (throughput), the number of pilot signals should be limited. That is, the channel estimation is performed based on a limited number of pilot signals. In this case, the channel information measured by the receiver may not be perfect, and thus, some channel measurement errors are inevitable. In real systems, a fair number of pilot signals are transmitted to reduce such channel measurement errors. In the prior art, pilot signal transmission and error correction codes have been considered individually. In addition, these two issues tends to be separately optimized. However, if channel measurement is combined with systematic polar coding, the efficiency of channel coding may be improved.

Figure 29:
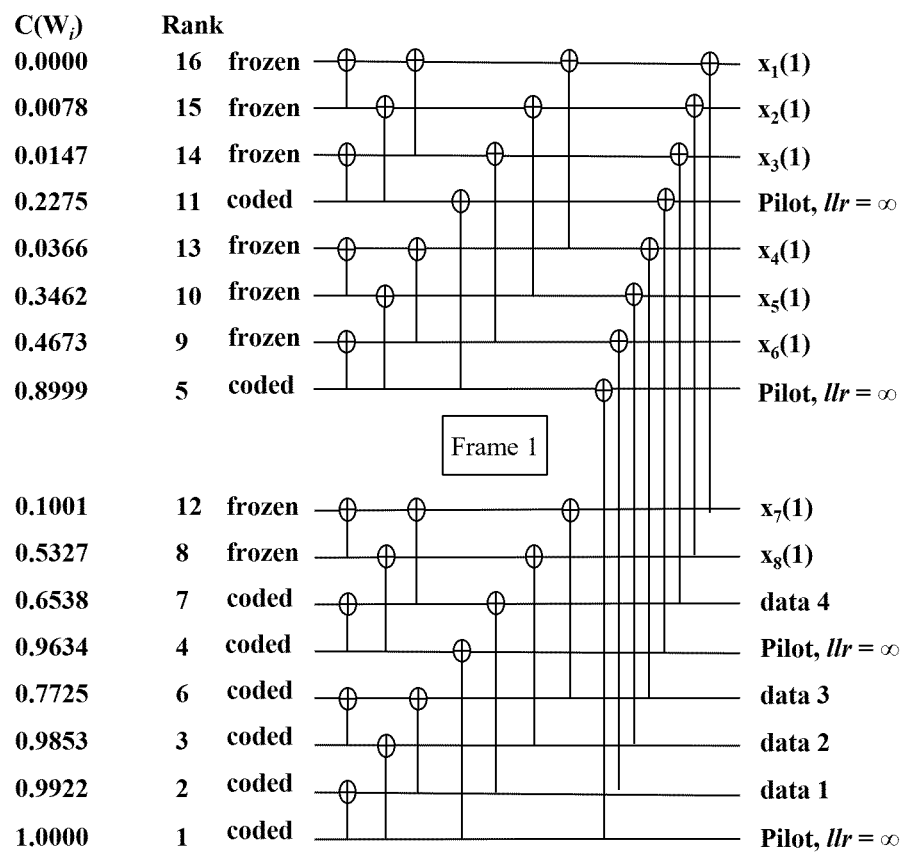
FIG. 29 is a diagram for explaining a method of combining a systematic polar code with channel measurement according to the present disclosure.

FIG. 29 is a diagram for explaining a method of combining a systematic polar code with channel measurement according to the present disclosure.

Referring to FIG. 12, a length-16 polar code is generated by combining a length-12 systematic polar code and four pilot signals. Here, the four pilot signals may be charge in the following two functions at the same time.

1) performing channel measurement
2) increasing the actual code length to improve the reliability of transmitted information bits If the pilot signals and polar code are separately transmitted, the polar code length becomes 12, and the coding rate is 4/12=1/3. On the other hand, when the pilot signals and polar code are transmitted together, the actual code length becomes 16, and the coding rate is 8/16. However, since the LRR values of received symbols corresponding to the four pilot signals are infinite, the actual code rate becomes 4/16, which is less than 1/3. Consequently, the reliability of information bits may be improved.

2.2 Method of Combining Systematic Polar Code with Channel Measurement

Referring to FIG. 29, four pilot signals are transmitted at a fixed interval. If the channel varies over time, transmitting pilot signals at a fixed interval may be best in terms of channel estimation. However, such pilot signal allocation may not be best from the point of view of systematic polar codes.

In the method of FIG. 29, 4th, 8th, 12th, and 16th input signals (Rank 11, 5, 4, and 1) are converted into parity check bits (code bits) other than frozen bits. That is, 1st, 2nd, 3rd, 5th, 6th, 7th, 9th, and 10th input bits are used as frozen bits.

The bit-channel capacity of the 10th input bit used as one frozen bit is 0.53274. Specifically, the 10th input bit corresponds to a bit channel with the 8th highest bit-channel capacity among the 16 input bits. The fundamental concept of polar codes is that input bits with high bit-channel capacities are used as information bits and input bits with low bit-channel capacities are used as frozen bits. Thus, the locations of the frozen bits of the method of FIG. 29 (or the locations of the information bits) are not optimized.

Figure 30:
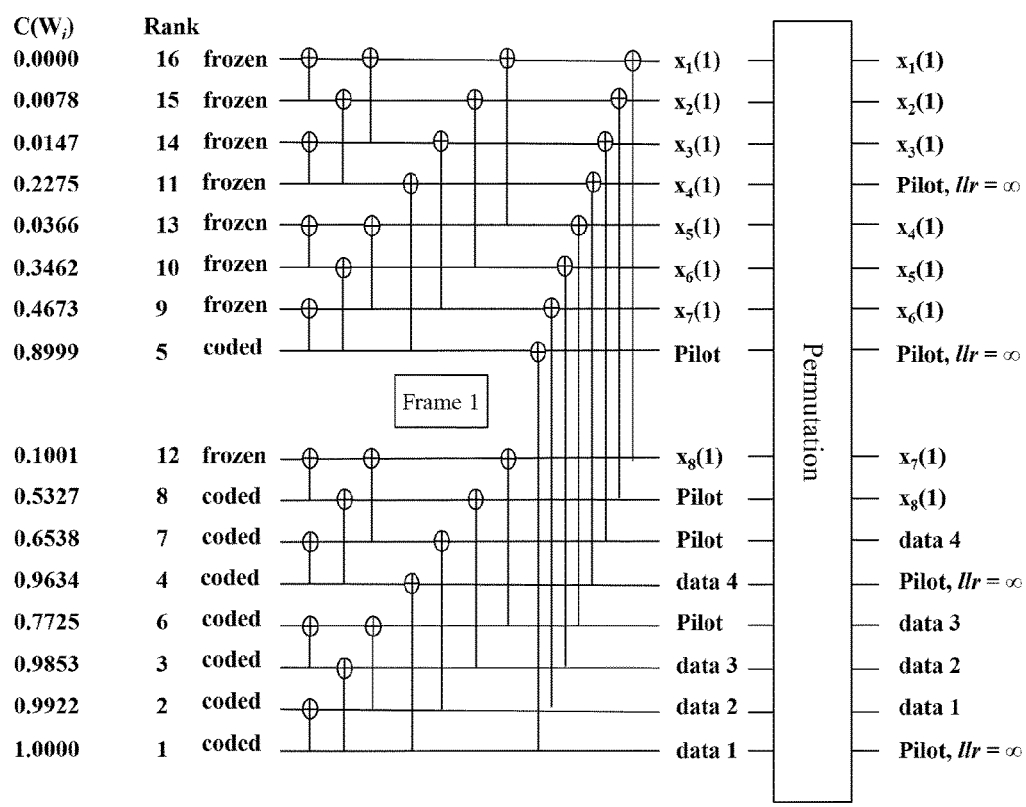
FIG. 30 is a diagram for explaining a method of combining a systematic polar code with channel measurement according to the present disclosure.

FIG. 30 is a diagram for explaining a method of combining a systematic polar code with channel measurement according to the present disclosure.

According to the method of FIG. 30, the problem mentioned above in FIG. 29 may be solved.

Specifically, FIG. 30 shows the method of combining the systematic polar code and channel measurement based on bit-channel capacities.

First, frozen bits are transmitted on bit channels with the lowest bit-channel capacities among all input bits. However, when frozen bits are allocated as described above, pilot signals may not be arranged at a fixed interval. Permutation operation may be applied to solve this problem, that is, to arrange the pilot signals at a fixed interval.

According to the method of FIG. 30, since the pilot bits are known bits, the LLR values thereof may become infinite during decoding.

2.3. Method of Combining Non-Systematic Polar Code with Channel Measurement

Figure 31:
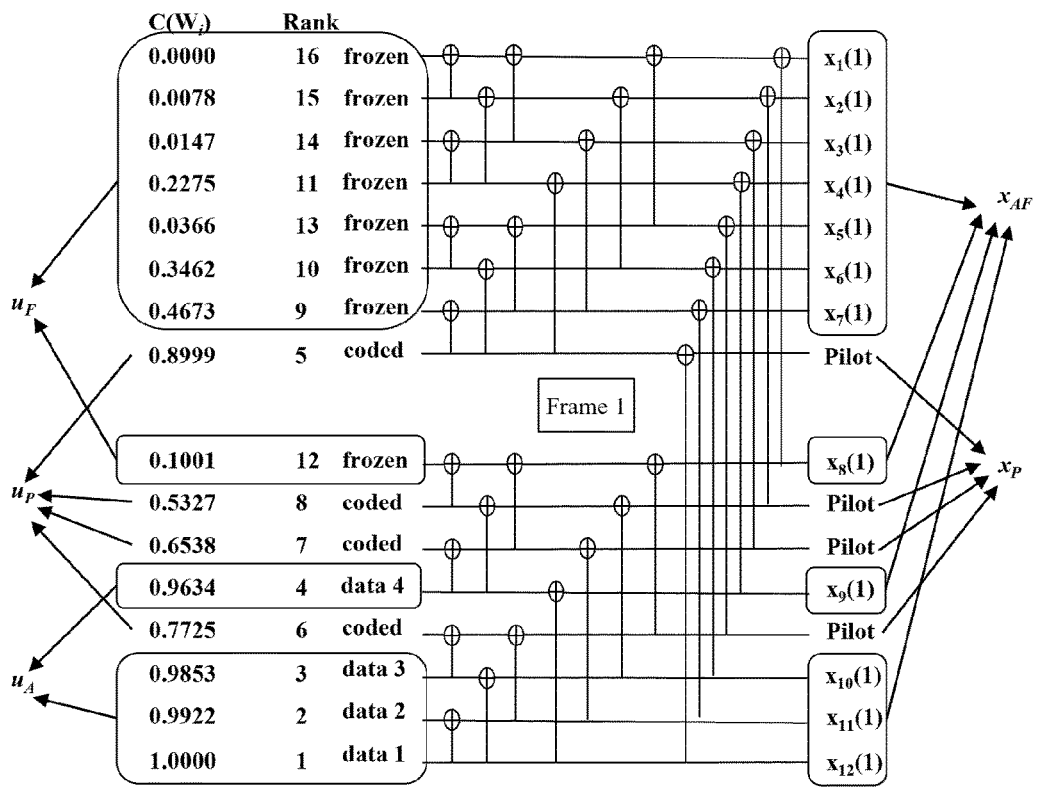
FIG. 31 is a diagram for explaining a method of combining a non-systematic polar code with channel measurement according to the present disclosure.

Hereinabove, how the systematic polar coding is combined with the channel measurement according to the present disclosure have been described with reference to FIGS. 29 and 30. However, non-systematic polar coding may be used more frequently. Thus, how the non-systematic polar coding is combined with the channel measurement will be described. In FIG. 31, a method of combining the non-systematic polar coding with the channel measurement will be described.

In this document, the following notation may be used.
Bit Channel Indices
A: an index set of information bits
P: an index set of pilot signal bits
F: an index set of frozen bits
Output Bit Vector
$x=(x_P, x_{A,F})$: polar coding output bit vector (codeword)
$x_P$: a vector set of pilot signal bits in a codeword corresponding to a bit index, that is, an output bit vector in a codeword positioned at the same location as an input bit vector $u_P$. In other words, the input bit vector $u_P$ is related to the output bit vector $x_P$.
$x_{A,F}$: an output bit vector in a codeword positioned at the same location of input bit vectors $u_A$ and $u_F$. That is, the output bit vector $x_{A,F}$ is related to input bit vectors $u_A$ and $u_F$.
Input Bit Vector
$u=(u_A, u_P, u_F)$: a total input bit vector
$u_A$: an input bit vector related to the indices of information bits
$u_P$: a vector of input bits positioned at the same location as pilot signals in a codeword related to the indices of pilot signal bits
$u_F$: a frozen bit vector related to the indices of frozen bits
Generator Matrix
G: a polar code (coding) generator matrix
$G_{AF,P}$: As a sub-matrix of G, an (i, j)-th element $G_{i,j}$ may satisfy the following condition: $i \in A \cup F$, $j \in P$.
$G_{P,P}$, $G_{P,AF}$, and $G_{AF,AF}$: are defined similarly to $G_{AF,P}$ To combine the non-systematic polar coding and channel measurement, encoding needs to be performed as follow. First, Equation 13 below is established from the polar code generator matrix.

$$x_P = u_P G_{P,P} + (u_A, u_F) G_{AF,P}$$

$$x_{AF} = u_P G_{P,AF} + (u_A, u_F) G_{AF,AF} \quad \text{[Equation 13]}$$

Based on the above relation, $u_p$ is computed, and then $x_{AF}$ is computed based on the value of $u_p$.

(step 1): $u_P = (x_P - (u_A, u_F) G_{AF,P}) G_{P,P}^{-1}$ (step 2): $x_{AF} = u_P G_{P,AF} + (u_A, u_F) G_{AF,AF}$ [Equation 14]

Decoding of systematic polar codes is basically equal to that of non-systematic polar codes. However, since the receiver knows codeword symbols corresponding to pilot signals, the LLR values thereof may be set infinite.

FIG. 31 is a diagram for explaining a method of combining a non-systematic polar code with channel measurement according to the present disclosure.

Specifically, FIG. 31 shows the proposed method of combining the non-systematic polar code with the above-described channel measurement.

Referring to FIG. 31, $u_F$, and $u_A$ correspond to $x_{AF}$, and $U_p$ corresponds to $x_P$. Here, the correspondence means that the locations of input bits ($u_F$, $u_A$, and $u_P$) are related to those of output bits ($x_{AF}$ and $x_P$). As shown in FIG. 31, input bits are converted into output bits based on the polar code generator matrix. The bit values of input bits set as frozen bits may be 0, and pilot signal bits may be bit sequences used as pilot signals. That is, coded bits may be determined such that the pilot signal bits are equivalent to the bit sequences used as pilot signals.

Since the bit sequences used as pilot signals are already known, the pilot signal bits among output bits obtained from polar coding may be known bits.

Figure 32:
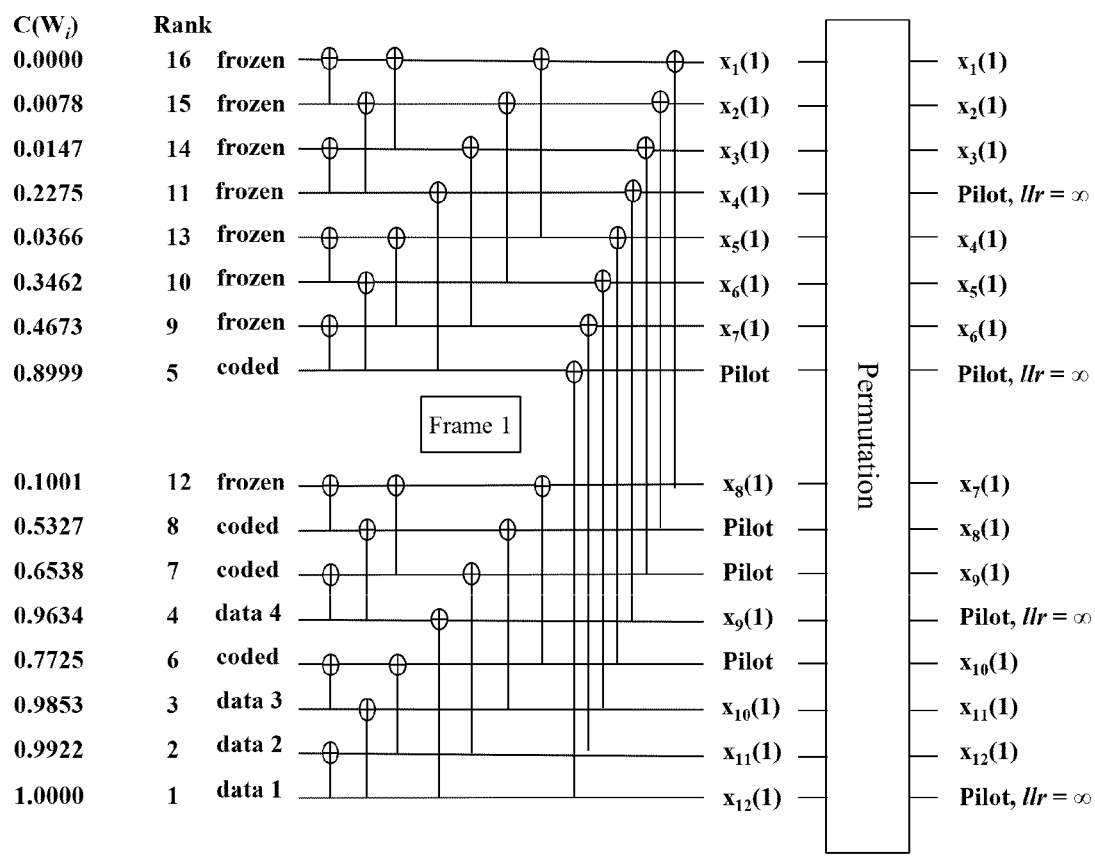
FIG. 32 is a diagram for explaining a method of combining a non-systematic polar code with channel measurement where permutation is used to arrange pilot signals at a fixed interval according to the present disclosure.

FIG. 32 is a diagram for explaining a method of combining a non-systematic polar code with channel measurement where permutation is used to arrange pilot signals at a fixed interval according to the present disclosure.

In the method of FIG. 32, permutation operation is additionally applied to the method of FIG. 31 in order to arrange the pilot signals at the fixed interval.

Referring to FIG. 31, when polar coding is combined with channel measurement based on pilot signals, the locations of coded bits for generating pilot signal bits are determined by channel capacity. In addition, since the pilot signal bits are generated such that the locations thereof correspond to those of the coded bits, the distance between the locations of the pilot signal bits among polar coding output bits is determined by the channel capacity.

Referring to FIG. 32, since it is desirable that the pilot signal bits are arranged at the same interval, the locations of the pilot signal bits may be changed by the permutation operation.

Figure 33:
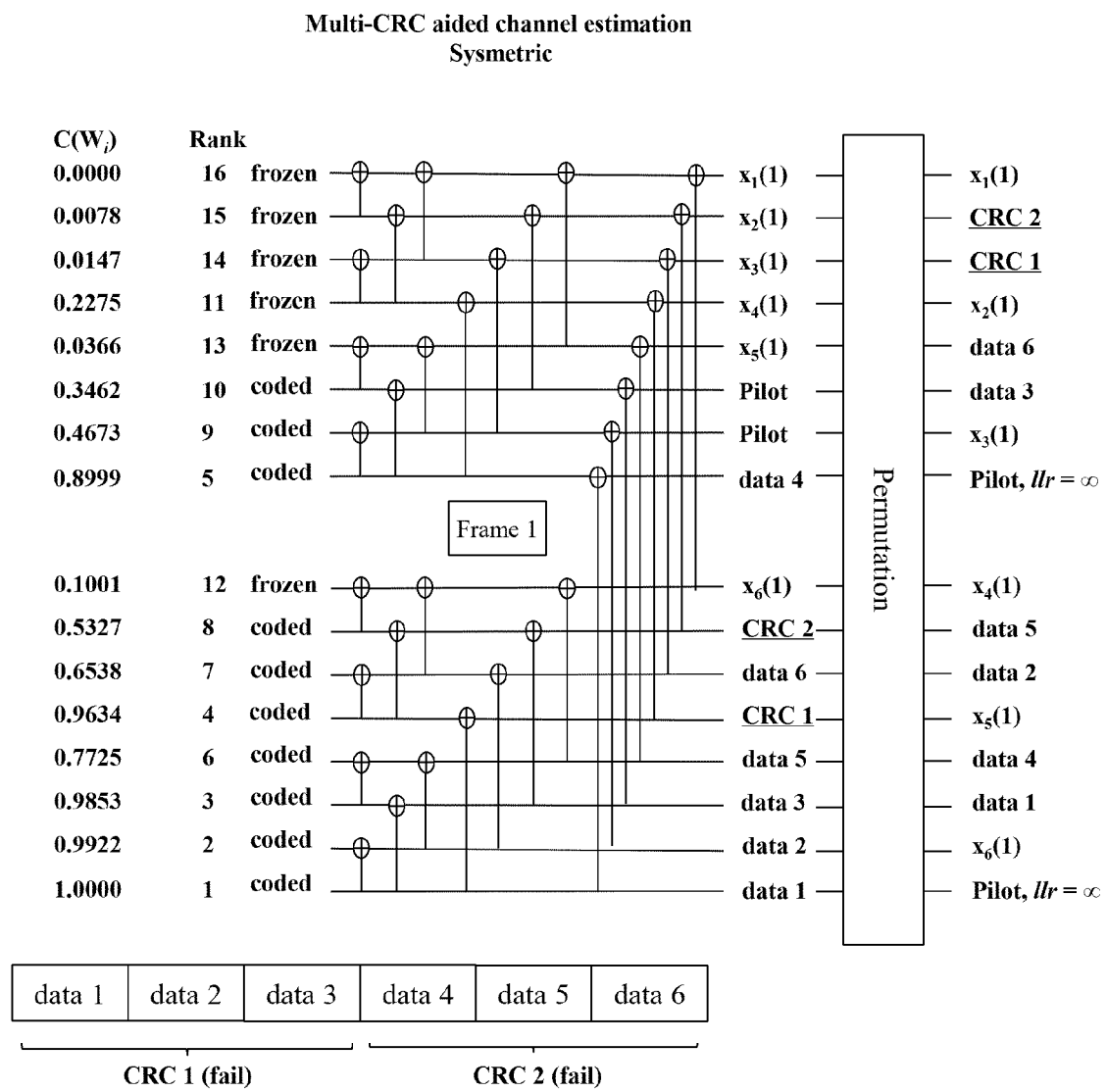
FIG. 33 is a diagram for explaining a method of combining a systematic polar code and multi-CRC (cyclic redundancy check) with channel measurement when both first and second information blocks are unsuccessfully decoded according to the present disclosure.
Figure 34:
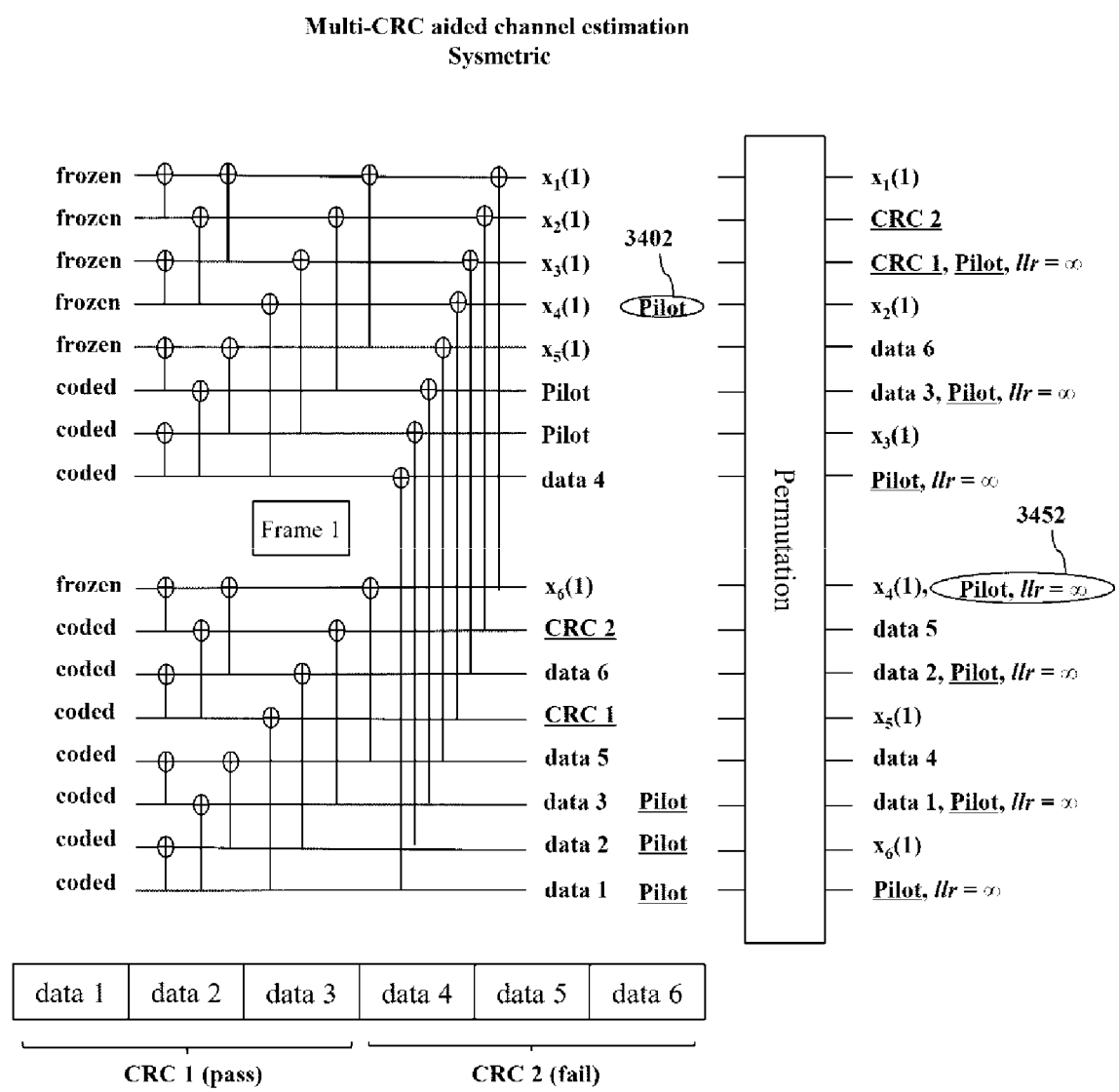
FIG. 34 is a diagram for explaining a method of combining a systematic polar code and multi-CRC with channel measurement when a second information block is unsuccessfully decoded according to the present disclosure.
Figure 35:
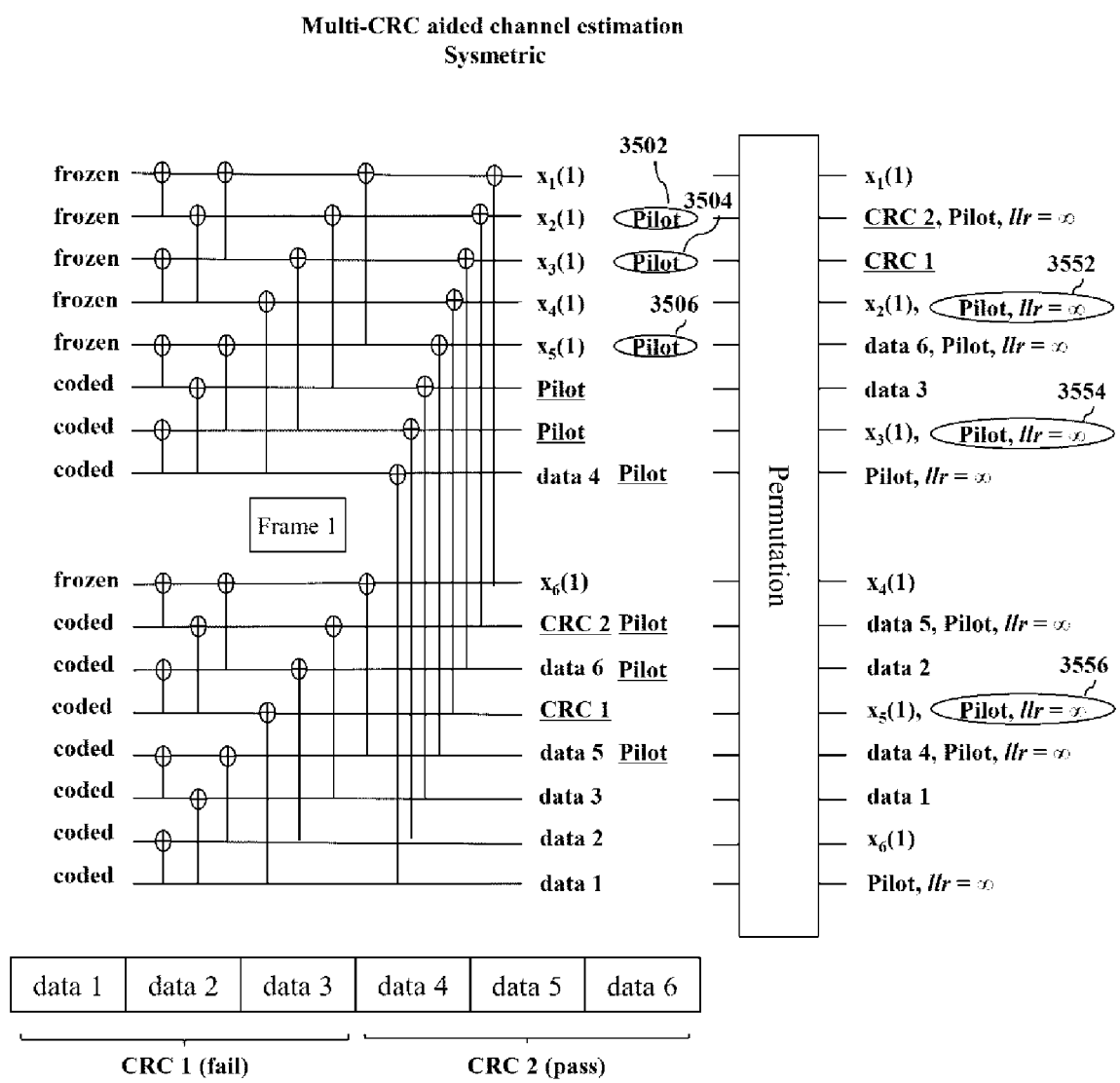
FIG. 35 is a diagram for explaining a method of combining a systematic polar code and multi-CRC with channel measurement when a first information block is unsuccessfully decoded according to the present disclosure.

2.4 Method of Combining Systematic Polar Code and Multi-CRC with Channel Measurement FIGS. 33 to 35 are diagrams for explaining methods of combining a systematic polar code and multi-CRC with channel measurement according to the present disclosure.

FIG. 33 is a diagram for explaining a method of combining a systematic polar code and multi-CRC with channel measurement when both first and second information blocks are unsuccessfully decoded according to the present disclosure.

In FIG. 33, the two information blocks are unsuccessfully decoded. In this case, decoding is performed by setting only the LLR values of codeword symbols corresponding to pilot signals to be infinite.

FIG. 34 is a diagram for explaining a method of combining a systematic polar code and multi-CRC with channel measurement when a second information block is unsuccessfully decoded according to the present disclosure.

In FIG. 34, a first information block of two information blocks is successfully decoded, and the second information block is unsuccessfully decoded. In this case, decoding may be performed in two stages. In the first decoding stage, channel estimation is performed based on only actual pilot signals, and then decoding is performed based on channel estimates. After the first decoding stage, the first information block may be successfully decoded, but the second information block may be unsuccessfully decoded.

Then, the second decoding stage is performed. Specifically, decoding may be performed once again by using signals in the first information block, which is successfully decoded in the first decoding, as pilot signals. In this case, since the reliability of the channel measurement is improved, the second information block, which is unsuccessfully decoded in the first decoding, may be successfully decoded.

The circles (3402 and 3452) of FIG. 34 represent codeword bits determined immediately after the successful decoding of the first information block due to the unique characteristics of the polar code generator matrix. That is, when successfully decoding the first information block, the receiver may know the accurate value of a bit represented by the blue circle. The receiver may further improve the reliability of the channel estimation by using the bit as a pilot signal for the second decoding.

FIG. 35 is a diagram for explaining a method of combining a systematic polar code and multi-CRC with channel measurement when a first information block is unsuccessfully decoded according to the present disclosure.

Referring to FIG. 35, a first information block of two information blocks is unsuccessfully decoded, and a second information block is successfully decoded. In the first decoding, channel estimation is performed based on only actual pilot signals, and then decoding is performed based on channel estimates. In the second decoding, the channel estimation is performed by using the successfully decoded information bits as pilot signals, and then decoding is performed. Thus, the reliability of the channel estimation is improved, and the information bits in the first information block may be successfully decoded in the second decoding. Bits included in the circles (3502, 3504, 3506, 3552, 3554, and 3556) of FIG. 35 are codeword bits determined immediately after the successful decoding of the second information block, and these bits are used as pilot signals in the second decoding.

Figure 36:
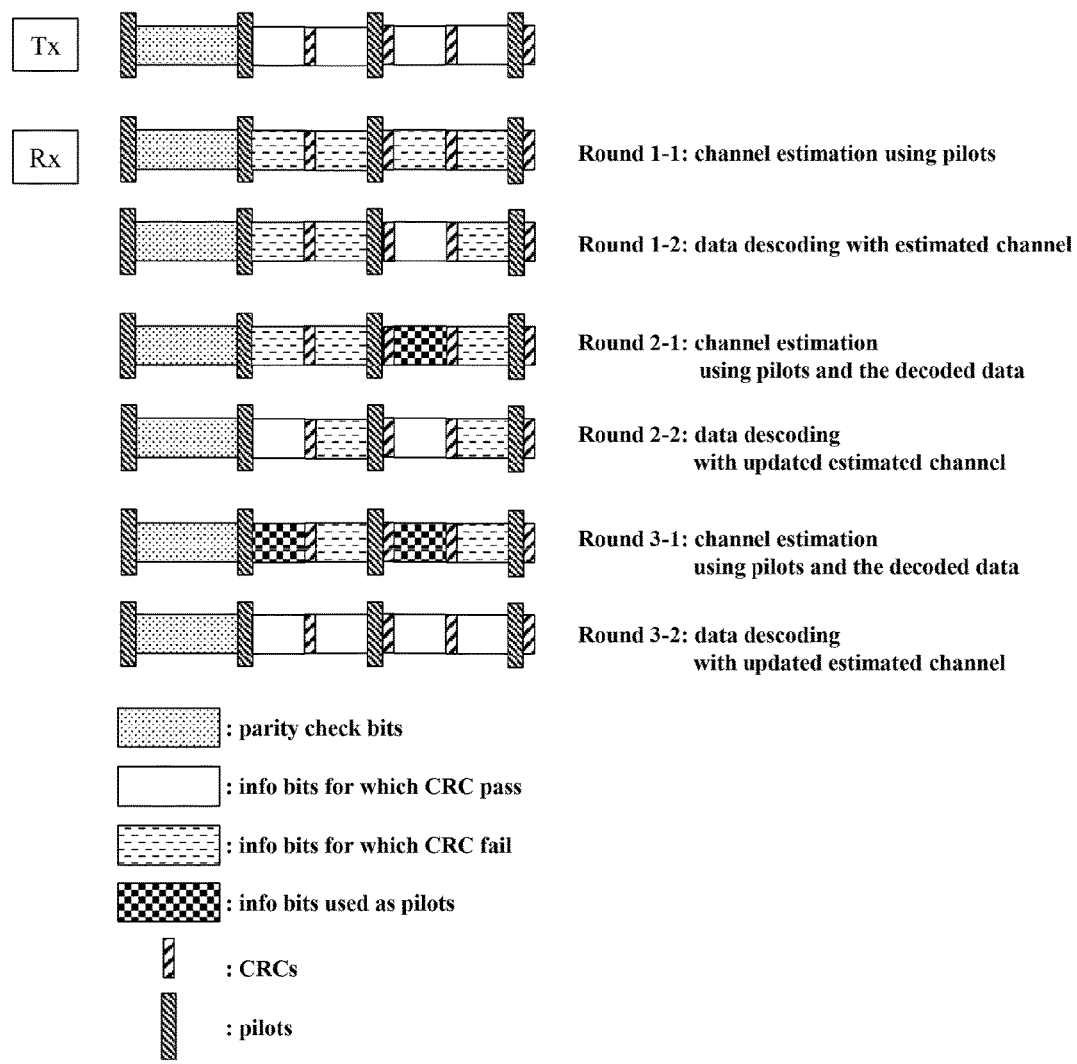
FIG. 36 is a diagram for explaining a method of combining a systematic polar code and multi-CRC with channel measurement for iterative decoding according to the present disclosure.

FIG. 36 is a diagram for explaining a method of combining a systematic polar code and multi-CRC with channel measurement for iterative decoding according to the present disclosure.

FIG. 36 shows an iterative decoding method where channel estimation and decoding are repeated over multiple steps.

Figure 37:
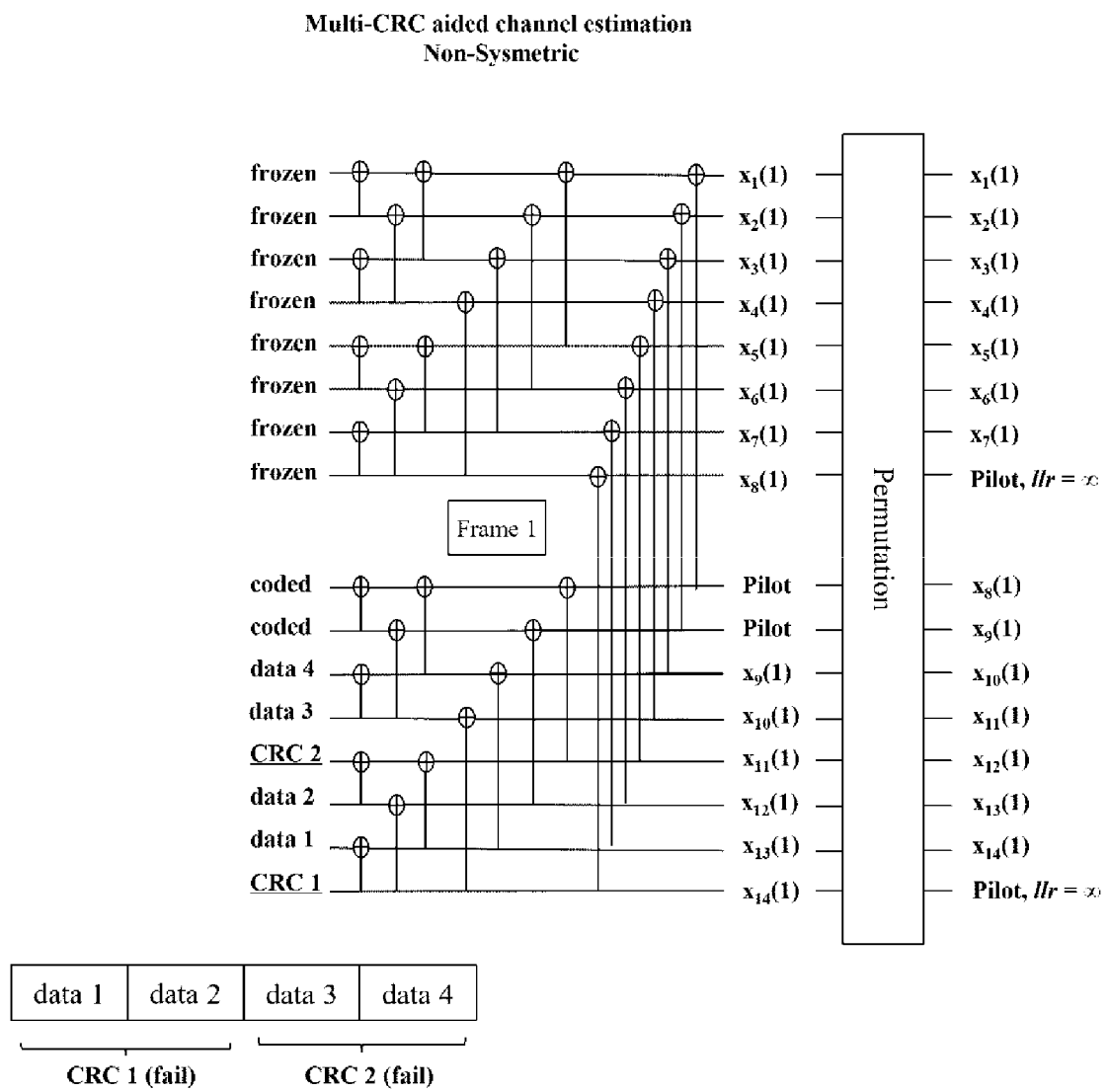
FIG. 37 is a diagram for explaining a method of combining a non-systematic polar code and multi-CRC with channel measurement when both first and second information blocks are unsuccessfully decoded according to the present disclosure.
Figure 38:
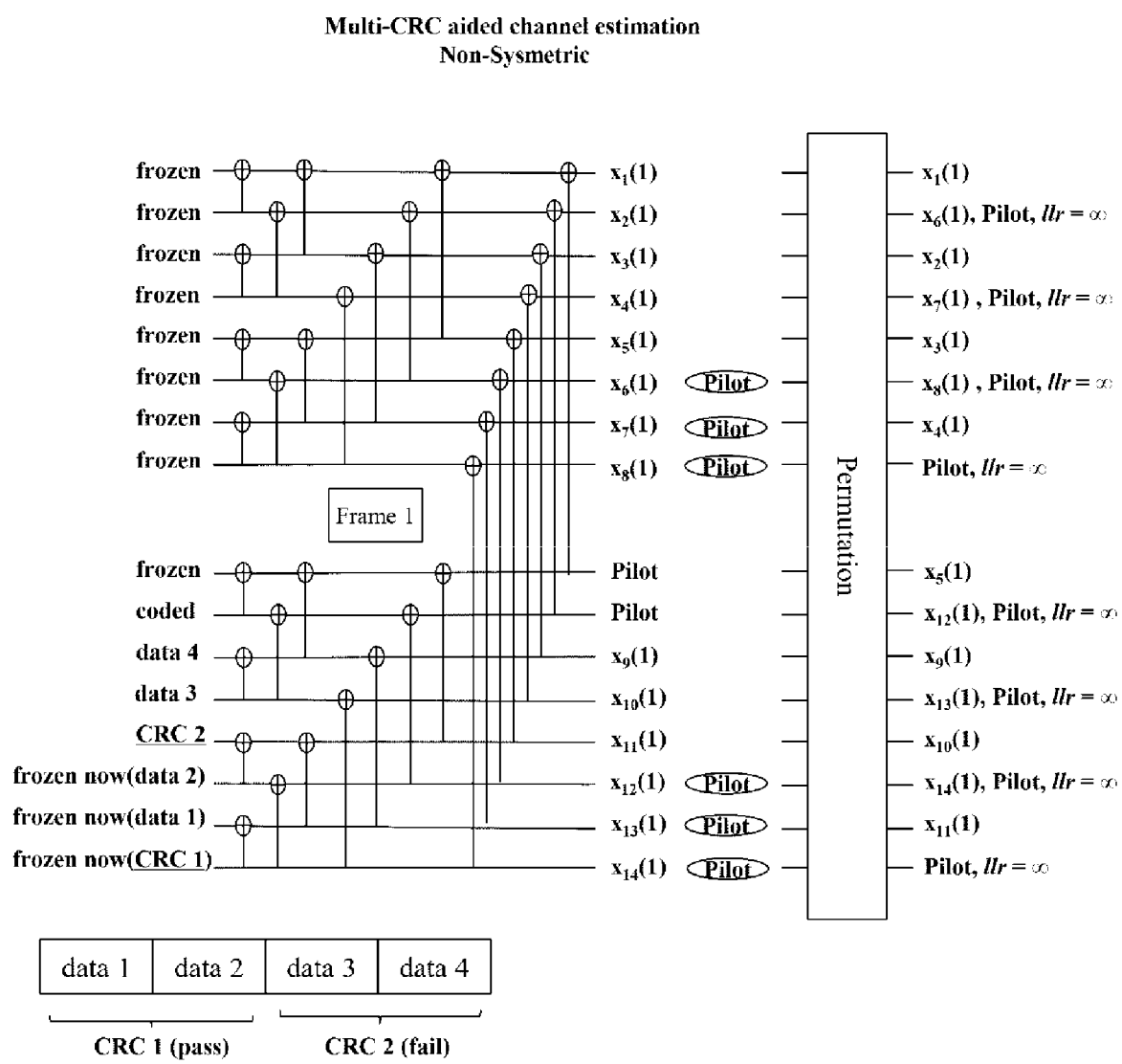
FIG. 38 is a diagram for explaining a method of combining a non-systematic polar code and multi-CRC with channel measurement when a second information block is unsuccessfully decoded according to the present disclosure.

2.5 Method of Combining Non-Systematic Polar Code and Multi-CRC with Channel Measurement FIGS. 37 and 38 are diagrams for explaining methods of combining a non-systematic polar code and multi-CRC with channel measurement according to the present disclosure.

FIG. 37 is a diagram for explaining a method of combining a non-systematic polar code and multi-CRC with channel measurement when both first and second information blocks are unsuccessfully decoded according to the present disclosure.

In FIG. 37, the two information blocks are unsuccessfully decoded. In this case, decoding is performed by setting only the LLR values of codeword symbols corresponding to pilot signals to be infinite.

FIG. 38 is a diagram for explaining a method of combining a non-systematic polar code and multi-CRC with channel measurement when a second information block is unsuccessfully decoded according to the present disclosure.

In FIG. 38, a first information block of two information blocks is successfully decoded, and the second information block is unsuccessfully decoded. In this case, decoding may be performed in two stages. In the first decoding stage, channel estimation is performed based on only actual pilot signals, and then decoding is performed based on channel estimates. After the first decoding stage, the first information block may be successfully decoded, but the second information block may be unsuccessfully decoded.

Then, the second decoding stage is performed. Specifically, the channel estimation is performed based on the values of codeword bits accurately configured by signals in the first information block, which is successfully decoded in the first decoding, and then decoding is performed. Referring to FIG. 31, the values of 6 bits except two actual pilot signals among codeword bits may be accurately determined (the values of bits in the first information block are accurately determined). The 6 bits may be used for the channel estimation together with the two actual pilot signal. Thus, the reliability of the channel estimation may be improved at the second stage.

Figure 39:
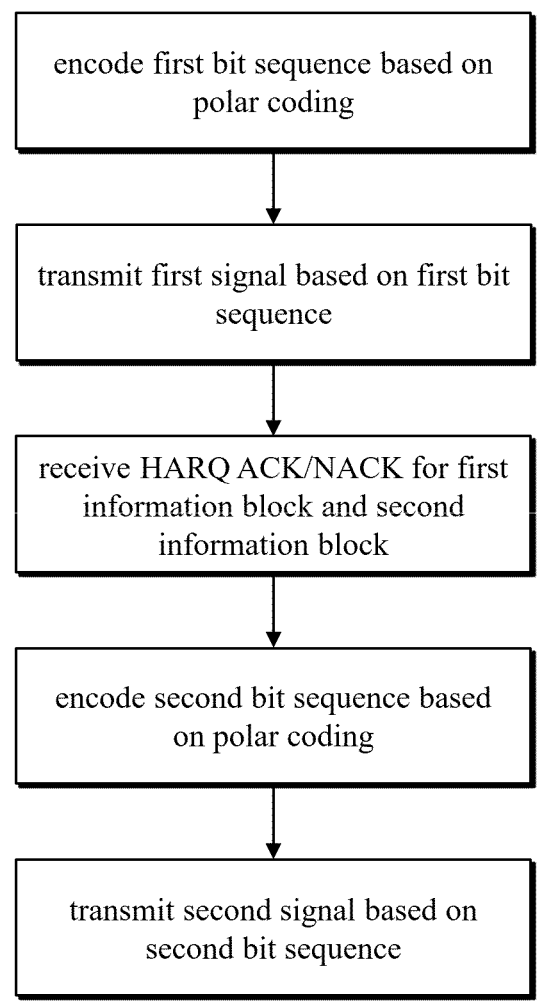
FIG. 39 is a diagram for explaining a method for an encoder to transmit a signal based on polar coding according to the present disclosure.

FIG. 39 is a diagram for explaining a method for an encoder to transmit a signal based on polar coding according to the present disclosure.

With reference to FIG. 39, a method of transmitting, by a first device to a second device, a signal based on polar coding is provided. The method may include: encoding a first bit sequence having a length of K and including a first information block, a second information block, a first CRC for the first information block, and a second CRC for the second information block based on a polar code with a size of N; transmitting a first signal based on the encoded first bit sequence; receiving first hybrid automatic repeat request acknowledgement/negative-acknowledgement (HARQ ACK/NACK) information for the first bit sequence; when the first HARQ ACK/NACK information includes information about failure in transmission of the second information block, segmenting the second information block into a first information sub-block and a second information sub-block and generating a third CRC for the first information sub-block; encoding a second bit sequence having a length of L and including the third CRC based on the polar code; and transmitting a second signal based on the encoded second bit sequence.

The first HARQ ACK/NACK information may further include information about success in transmission of the first information block. The second bit sequence may further include the second information block. The first bit sequence may be placed and encoded at K predetermined input bit locations among N input bits of the polar code. The third CRC of the second bit sequence may be placed and encoded at some of the input bit locations related to the first information block and first CRC among the K input bit locations.

The second information block of the second bit sequence may be placed repeatedly and encoded at input bit locations related to the second information block among the K input bit locations and at the rest of the input bit locations related to the first information block and first CRC among the K input bit locations.

The second bit sequence may further include a new information block. The second information block of the second bit sequence may be placed at the input bit locations related to the second information block among the K input bit locations. The new information block of the second bit sequence may be placed and encoded at the rest of the input bit locations related to the first information block and first CRC among the K input bit locations.

The second bit sequence may further include the second CRC.

The second bit sequence may further include a fourth CRC for the second information sub-block.

The method may further include: receiving second HARQ ACK/NACK information for the second bit sequence; when the second HARQ ACK/NACK information includes information about failure in transmission of the first information sub-block and information about success in transmission of the second information sub-block, generating a fourth CRC for a part of the first information sub-block; encoding a third bit sequence including the first information sub-block, the third CRC, and the fourth CRC based on the polar code; and transmitting a third signal based on the encoded third bit sequence.

The fourth CRC of the third bit sequence may be placed and encoded at some of the input bit locations related to the second information sub-block and second CRC among the K input bit locations.

In the present disclosure, a first device for transmitting to a second device a signal based on polar coding is provided. The first device may include: a transceiver; a memory; and at least one processor connected to the transceiver and the memory.

The memory may be configured to store instructions that, when executed by the at least one processor, cause the at least one processor to perform operations.

The operations may include: encoding a first bit sequence having a length of K and including a first information block, a second information block, a first CRC for the first information block, and a second CRC for the second information block based on a polar code with a size of N; transmitting a first signal based on the encoded first bit sequence; receiving first HARQ ACK/NACK information for the first bit sequence; when the first HARQ ACK/NACK information includes information about failure in transmission of the second information block, segmenting the second information block into a first information sub-block and a second information sub-block and generating a third CRC for the first information sub-block; encoding a second bit sequence having a length of L and including the third CRC based on the polar code; and transmitting a second signal based on the encoded second bit sequence.

The first HARQ ACK/NACK information may further include information about success in transmission of the first information block.

The second bit sequence may further include the second information block.

The first bit sequence may be placed and encoded at K predetermined input bit locations among N input bits of the polar code.

The third CRC of the second bit sequence may be placed and encoded at some of the input bit locations related to the first information block and first CRC among the K input bit locations.

The second information block of the second bit sequence may be placed repeatedly and encoded at input bit locations related to the second information block among the K input bit locations and at the rest of the input bit locations related to the first information block and first CRC among the K input bit locations.

The second bit sequence may further include a new information block. The second information block of the second bit sequence may be placed at the input bit locations related to the second information block among the K input bit locations. The new information block of the second bit sequence may be placed and encoded at the rest of the input bit locations related to the first information block and first CRC among the K input bit locations.

The second bit sequence may further include the second CRC.

The second bit sequence may further include a fourth CRC for the second information sub-block.

The operations may further include: receiving second HARQ ACK/NACK information for the second bit sequence; when the second HARQ ACK/NACK information includes information about failure in transmission of the first information sub-block and information about success in transmission of the second information sub-block, generating a fourth CRC for a part of the first information sub-block; encoding a third bit sequence including the first information sub-block, the third CRC, and the fourth CRC based on the polar code; and transmitting a third signal based on the encoded third bit sequence.

The fourth CRC of the third bit sequence may be placed and encoded at some of the input bit locations related to the second information sub-block and second CRC among the K input bit locations.

An encoder may be mounted on an autonomous driving device configured to communicate with at least one of a mobile terminal, a BS, or an autonomous driving vehicle.

In the present disclosure, a method of transmitting, by an encoder, a signal based on polar coding is provided. The method may include: encoding a first bit sequence having a length of K and including a first information block, a second information block, a first cyclic redundancy check (CRC) for the first information block, and a second CRC for the second information block based on polar coding with a size of N; transmitting to a decoder a first signal based on the encoded first bit sequence; receiving from the decoder HARQ ACK/NACK information for first information block and HARQ ACK/NACK information for the second information block; when the HARQ ACK/NACK information for the first information block indicates success in transmission of the first information block and the HARQ ACK/NACK information for the second information block indicates failure in transmission of the second information block, segmenting the second information block into a first information sub-block and a second information sub-block and generating a third CRC for the first information sub-block; encoding a second bit sequence having a length of L and including the second information block and the third CRC based on the polar coding; and transmitting to the decoder a second signal based on the encoded second bit sequence; and receiving from the decoder HARQ ACK/NACK information for first information sub-block and HARQ ACK/NACK information for second information sub-block. The first bit sequence may be placed and encoded at the locations of K predetermined bit locations among N input bits of a polar code.

The third CRC of the second bit sequence may be placed and encoded at some of the bit locations related to the first information block and first CRC among the K bit locations. The second information block of the second bit sequence may be placed repeatedly and encoded at the rest of the bit locations related to the first information block and first CRC among the K bit locations. A new information block may be placed and encoded at the rest of the bit locations related to the first information block and first CRC among the K bit locations. The second bit sequence may further include the second CRC. Alternatively, the second bit sequence may further include a fourth CRC for the second information sub-block.

The method may further include: when the HARQ ACK/NACK information for the first information sub-block indicates failure in transmission of the first information sub-block and the HARQ ACK/NACK for the second information sub-block indicates success in transmission of the second information sub-block, generating a fourth CRC for a part of the first information sub-block; encoding a third bit sequence including the first information sub-block, the third CRC, and the fourth CRC based on the polar coding; and transmitting to the decoder, a third signal based on the encoded third bit sequence.

The third CRC of the third bit sequence may be placed and encoded at some of the bit locations related to the second information sub-block and second CRC among the K bits.

In the present disclosure, a method of transmitting, by an encoder, a signal based on polar coding is provided. The method may include: transmitting to a decoder a first frame including a plurality of information blocks and first CRCs for the plurality of information blocks; receiving from the decoder information about one or more unsuccessfully decoded information blocks among the plurality of information blocks included in the first frame; and transmitting a second frame generated based on the first frame and the information about the one or more unsuccessfully decoded information blocks. The second frame may include output bits of a systematic polar code.

The information about the one or more unsuccessfully decoded information blocks among the plurality of information blocks may be included in a HARQ ACK/NACK message. Since the second frame contains the information about the unsuccessfully decoded information blocks only, the transmission efficiency may be improved.

The number of information blocks may be 2. That is, only the unsuccessfully decoded information block among the plurality of information blocks may be transmitted during retransmission. The unsuccessfully decoded information block may be segmented into two information sub-blocks, and a second CRC for one of the two information sub-blocks may be included in the second frame. Thus, if a decoding failure occurs even in the retransmission, an unsuccessfully decoded information sub-block among the two information sub-blocks may be clearly notified. The bits of a successfully decoded information sub-block may be set as frozen bits. Instead of setting the bits of the successfully decoded information sub-block as the frozen bits, some of the bits of the successfully decoded information sub-block may be set to the second CRC or the bits of the unsuccessfully decoded information sub-block. Instead of setting the bits of the successfully decoded information sub-block as the frozen bits, some of the bits of the successfully decoded information sub-block may be set to new data. Further, the bits of the successfully decoded information sub-block may not be transmitted.

When the retransmission is performed again due to the decoding failure during the retransmission, the unsuccessfully decoded information sub-block may be segmented into two second information sub-blocks, and a third CRC for one of the two second information sub-blocks may be included in a third frame. Thus, the accurate location of the unsuccessfully decoded information block may be provided depending on the number of times of retransmission. The above-described method may be referred to as a binary search method.

The first and second frames may be generated based on non-systematic polar coding.

The second frame may be configured when the bits of one or more successfully decoded information blocks among the plurality of information blocks included in the first frame are set as frozen bits.

The second frame may be configured when a first portion of the bits of one or more successfully decoded information blocks among the plurality of information blocks included in the first frame is set to the second CRC for an information sub-block, which is obtained by segmenting an unsuccessfully decoded information block among the plurality of information blocks included in the first frame.

The second frame may be configured when a second portion of the bits of one or more successfully decoded information blocks among the plurality of information blocks included in the first frame is set to bits of an unsuccessfully decoded information block among e plurality of information blocks included in the first frame.

In the present disclosure, a method of transmitting, by an encoder, a signal based on polar coding in a wireless communication system is provided. The method may include: generating a first output bit sequence from a first input bit sequence including a first information block, a second information block, a first CRC for the first information block, and a second CRC for the second information block, based on the polar coding; transmitting to a decoder a first signal based on the first output bit sequence; receiving from the decoder HARQ ACK/NACK information for the first information block and HARQ ACK/NACK information for the second information block; when the HARQ ACK/NACK information for the first information block indicates success in transmission of the first information block and the HARQ ACK/NACK information for the second information block indicates failure in transmission of the second information block, segmenting the second information block into a first information sub-block and a second information sub-block and generating a third CRC for the first information sub-block; generating a second output bit sequence from a second input bit sequence including the second information block, the second CRC, and the third CRC, based on the polar coding; transmitting to the decoder a second signal based on the second output bit sequence; and receiving from the decoder HARQ ACK/NACK information for the first information sub-block and HARQ ACK/NACK information for the second information sub-block.

The third CRC may be placed at a location in the second input bit sequence, which corresponds to those of the first information block and first CRC in the first input bit sequence.

The second information block may be further placed at the location in the second input bit sequence, which corresponds to those of the first information block and first CRC in the first input bit sequence, such that the second information block overlaps with the third CRC.

The method may further include: when the HARQ ACK/NACK information for the first information sub-block indicates failure in transmission of the first information sub-block and the HARQ ACK/NACK information for the second information sub-block indicates success in transmission of the second information sub-block, generating a fourth CRC for a part of the first information sub-block; generating a third output bit sequence from a third input bit sequence including the first information sub-block, the third CRC, and the fourth CRC, based on the polar coding; and transmitting to the decoder a third signal based on the third output bit sequence.

The fourth CRC may be placed at a location in the third input bit sequence, which corresponds to those of the second information block and second CRC in the second input bit sequence.

The method may include: when the HARQ ACK/NACK information for the first information sub-block indicates success in the transmission of the first information sub-block and the HARQ ACK/NACK information for the second information sub-block indicates failure in the transmission of the second information sub-block, generating a fifth CRC for the second information sub-block and a sixth CRC for a part of the second information sub-block; generating a fourth output bit sequence from a fourth input bit sequence including the second information sub-block, the fifth CRC, and the sixth CRC, based on the polar coding; and transmitting to the decoder a fourth signal based on the fourth output bit sequence.

The fifth CRC may be placed at a location in the fourth input bit sequence, which corresponds to that of the second CRC in the second input bit sequence. The sixth CRC may be placed at a location in the fourth input bit sequence, which corresponds to those of the first information sub-block and first CRC in the second input bit sequence.

A new information block may be placed at a location in the second input bit sequence, which corresponds to those of the first information block and first CRC in the first input bit sequence.

In the present disclosure, a method of receiving, by a decoder, a signal based on polar coding in a wireless communication system is provided. The method may include: receiving a first signal from an encoder; generating a first bit sequence based on the first signal; generating a first decoded bit sequence including a first information block, a second information block, a first CRC for the first information block, and a second CRC for the second information block from the first bit sequence based on the polar decoding; transmitting, to the encoder, HARQ ACK/NACK information for the first information block indicating success in transmission of the first information block and HARQ ACK/NACK information for the second information block indicating failure in transmission of the second information block, based on the first information block, second information block, first CRC, and second CRC; receiving a second signal; generating a second bit sequence based on the second signal; generating a second decoded bit sequence including the second information block, which consists of first and second information sub-blocks, the second CRC, and a third CRC for the first information sub-block, from the second bit sequence based on the polar decoding; and transmitting HARQ ACK/NACK information for the first information sub-block or HARQ ACK/NACK information for the second information sub-block based on the second and third CRCs.

The third CRC may be placed at a location in the second decoded bit sequence, which corresponds to those of the first information block and first CRC in the first decoded bit sequence.

The method may further include: receiving a third signal from the encoder; generating a third bit sequence based on the third signal; generating a third decoded bit sequence including the first information sub-block, the third CRC, and a fourth CRC for a part of the first information sub-block from the third bit sequence based on the polar decoding; and transmitting HARQ ACK/NACK information for the part of the first information sub-block and HARQ ACK/NACK information for the rest of the first information sub-block based on the third and fourth CRCs.

The fourth CRC may be placed at a location in the third input bit sequence, which corresponds to those of the first information sub-block and second CRC in the second decoded bit sequence.

The HARQ ACK/NACK information for the first information sub-block may indicate failure in transmission of the first information sub-block, and the HARQ ACK/NACK information for the second information sub-block may indicate failure in transmission of the second information sub-block.

The embodiments of the present disclosure described hereinbelow are combinations of elements and features of the present disclosure. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions or features of any one embodiment may be included in another embodiment and may be replaced with corresponding constructions or features of another embodiment. It is obvious to those skilled in the art that claims that are not explicitly cited in each other in the appended claims may be presented in combination as an embodiment of the present disclosure or included as a new claim by a subsequent amendment after the application is filed.

It will be apparent to those skilled in the art that the present disclosure may be embodied in other specific forms without departing from the spirit of the disclosure. Accordingly, the above description should not be construed in a limiting sense in all respects and should be considered illustrative. The scope of the present disclosure should be determined by rational interpretation of the appended claims, and all changes within the scope of equivalents of the present disclosure are included in the scope of the present disclosure.

The method and device for performing channel coding based on polar codes are industrially applicable to various wireless communication systems including 3GPP LTE/LTE-A systems, 5G communication systems, etc.

What is claimed is:

1. A method of transmitting, by a first device to a second device, a signal based on polar coding, the method comprising:
    encoding a first bit sequence having a length of K and including a first information block, a second information block, a first cyclic redundancy check (CRC) for the first information block, and a second CRC for the second information block based on a polar code with a size of N;
    transmitting a first signal based on the encoded first bit sequence;
    receiving first hybrid automatic repeat request acknowledgement/negative-acknowledgement (HARQ ACK/NACK) information for the first bit sequence;
    based on that the first HARQ ACK/NACK information includes information indicating failure in transmission of the second information block, segmenting the second information block into a first information sub-block and a second information sub-block and generating a third CRC for the first information sub-block;
    encoding a second bit sequence having a length of L and including the third CRC based on the polar code; and
    transmitting a second signal based on the encoded second bit sequence.

2. The method of claim 1, wherein the first HARQ ACK/NACK information further includes information indicating success in transmission of the first information block,
    wherein the second bit sequence further includes the second information block,
    wherein the first bit sequence is placed and encoded at K predetermined input bit locations among N input bits of the polar code, and
    wherein the third CRC of the second bit sequence is placed and encoded at some of input bit locations related to the first information block and first CRC among the K input bit locations.

3. The method of claim 2, wherein the second information block of the second bit sequence is placed repeatedly and encoded at input bit locations related to the second information block among the K input bit locations and at a rest of the input bit locations related to the first information block and first CRC among the K input bit locations.

4. The method of claim 2, wherein the second bit sequence further includes a new information block,
    wherein the second information block of the second bit sequence is placed at input bit locations related to the second information block among the K input bit locations, and
    wherein the new information block of the second bit sequence is placed and encoded at a rest of the input bit locations related to the first information block and first CRC among the K input bit locations.

5. The method of claim 2, wherein the second bit sequence further includes the second CRC.

6. The method of claim 2, wherein the second bit sequence further includes a fourth CRC for the second information sub-block.

7. The method of claim 5, further comprising:
    receiving second HARQ ACK/NACK information for the second bit sequence;
    based on that the second HARQ ACK/NACK information includes information indicating failure in transmission of the first information sub-block and information indicating success in transmission of the second information sub-block, generating a fourth CRC for a part of the first information sub-block;
    encoding a third bit sequence including the first information sub-block, the third CRC, and the fourth CRC based on the polar code; and
    transmitting a third signal based on the encoded third bit sequence,
    wherein the fourth CRC of the third bit sequence is placed and encoded at some of input bit locations related to the second information sub-block and second CRC among the K input bit locations.

8. A first device configured to transmit, to a second device, a signal based on polar coding, the first device comprising:
    a transceiver;
    a memory; and
    at least one processor connected to the transceiver and the memory,
    wherein the memory is configured to store instructions that, when executed by the at least one processor, cause the at least one processor to perform operations comprising:
    encoding a first bit sequence having a length of K and including a first information block, a second information block, a first cyclic redundancy check (CRC) for the first information block, and a second CRC for the second information block based on a polar code with a size of N;
    transmitting a first signal based on the encoded first bit sequence;
    receiving first hybrid automatic repeat request acknowledgement/negative-acknowledgement (HARQ ACK/NACK) information for the first bit sequence;
    based on that the first HARQ ACK/NACK information includes information indicating failure in transmission of the second information block, segmenting the second information block into a first information sub-block and a second information sub-block and generating a third CRC for the first information sub-block;
    encoding a second bit sequence having a length of L and including the third CRC based on the polar code; and
    transmitting a second signal based on the encoded second bit sequence.

9. The first device of claim 8, wherein the first HARQ ACK/NACK information further includes information indicating success in transmission of the first information block, wherein the second bit sequence further includes the second information block, wherein the first bit sequence is placed and encoded at K predetermined input bit locations among N input bits of the polar code, and wherein the third CRC of the second bit sequence is placed and encoded at some of input bit locations related to the first information block and first CRC among the K input bit locations.

10. The first device of claim 9, wherein the second information block of the second bit sequence is placed repeatedly and encoded at input bit locations related to the second information block among the K input bit locations and at a rest of the input bit locations related to the first information block and first CRC among the K input bit locations.

11. The first device of claim 9, wherein the second bit sequence further includes a new information block, wherein the second information block of the second bit sequence is placed at input bit locations related to the second information block among the K input bit locations, and wherein the new information block of the second bit sequence is placed and encoded at a rest of the input bit locations related to the first information block and first CRC among the K input bit locations.

12. The first device of claim 9, wherein the second bit sequence further includes the second CRC.

13. The first device of claim 9, wherein the second bit sequence further includes a fourth CRC for the second information sub-block.

14. The first device of claim 12, wherein the operations further comprise:

receiving second HARQ ACK/NACK information for the second bit sequence;

based on that the second HARQ ACK/NACK information includes information indicating failure in transmission of the first information sub-block and information indicating success in transmission of the second information sub-block, generating a fourth CRC for a part of the first information sub-block;

encoding a third bit sequence including the first information sub-block, the third CRC, and the fourth CRC based on the polar code; and transmitting a third signal based on the encoded third bit sequence, wherein the fourth CRC of the third bit sequence is placed and encoded at some of input bit locations related to the second information sub-block and second CRC among the K input bit locations.

15. The first device of claim 8, wherein an encoder is mounted on an autonomous driving device configured to communicate with at least one of a mobile terminal, a base station, or an autonomous driving vehicle.

* * * * *